(12) United States Patent
Kato et al.

(10) Patent No.: US 7,864,293 B2
(45) Date of Patent: Jan. 4, 2011

(54) EXPOSURE APPARATUS, EXPOSURE METHOD, AND PRODUCING METHOD OF MICRODEVICE

(75) Inventors: Masaki Kato, Yokohama (JP); Kenji Shimizu, Kawasaki (JP); Manabu Toguchi, Yokohama (JP); Tomoyuki Watanabe, Tokyo (JP)

(73) Assignee: Nikon Corporation, Tokyo (JP)

( * ) Notice: Subject to any disclaimer, the term of this patent is extended or adjusted under 35 U.S.C. 154(b) by 142 days.

(21) Appl. No.: 11/661,297

(22) PCT Filed: Jan. 24, 2006

(86) PCT No.: PCT/JP2006/301001

§ 371 (c)(1),
(2), (4) Date: Apr. 23, 2007

(87) PCT Pub. No.: WO2006/080285

PCT Pub. Date: Aug. 3, 2006

(65) Prior Publication Data

US 2007/0296936 A1    Dec. 27, 2007

(30) Foreign Application Priority Data

Jan. 25, 2005 (JP) ............................. 2005-016843
Feb. 18, 2005 (JP) ............................. 2005-043103
Aug. 17, 2005 (JP) ............................. 2005-236940

(51) Int. Cl.
*G03B 27/42* (2006.01)

(52) U.S. Cl. ...................................................... 355/53

(58) Field of Classification Search .................. 355/53, 355/67, 72, 75, 55
See application file for complete search history.

(56) References Cited

U.S. PATENT DOCUMENTS

| 5,528,118 | A | 6/1996 | Lee |
| 5,602,620 | A | 2/1997 | Miyazaki et al. |
| 5,617,211 | A | 4/1997 | Nara et al. |
| 5,729,331 | A | 3/1998 | Tanaka et al. |
| 6,188,195 | B1 | 2/2001 | Lee |
| 6,969,966 | B2 | 11/2005 | Ebihara et al. |
| 2004/0227107 | A1* | 11/2004 | Cox et al. ............... 250/548 |

FOREIGN PATENT DOCUMENTS

JP          A 7-57986          3/1995

(Continued)

OTHER PUBLICATIONS

Sep. 26, 2008 First Office Action Notification issued in corresponding Chinese Application No. 200680011033 (with translation).

(Continued)

*Primary Examiner*—Peter B Kim
(74) *Attorney, Agent, or Firm*—Oliff & Berridge, PLC

(57) ABSTRACT

An exposure apparatus for exposure-transferring an image of a pattern projected through an optical system having a plurality of optical units L1 to L13 onto an object P, comprises a correcting device which corrects a position of at least one of a plurality of images to be projected onto the object P by the plurality of optical units L1 to L13 so that displacements of the optical units L1 to L13 are compensated.

50 Claims, 38 Drawing Sheets

FOREIGN PATENT DOCUMENTS

| | | |
|---|---|---|
| JP | A 7-283115 | 10/1995 |
| JP | A 8-55782 | 2/1996 |
| JP | A 8-166475 | 6/1996 |
| JP | A 8-330224 | 12/1996 |
| JP | A 2002-329651 | 11/2002 |
| JP | A 2004-172471 | 6/2004 |
| JP | A 2004-177468 | 6/2004 |
| JP | A 2004-221253 | 8/2004 |
| JP | A 2004-302043 | 10/2004 |
| JP | A 2005-11990 | 1/2005 |
| JP | 2006100568 A * | 4/2006 |

OTHER PUBLICATIONS

Mar. 6, 2009 Second Office Action Notification issued in corresponding Chinese Application No. 2006800011033 (with translation).

May 2, 2006 Written Opinion issued in corresponding International Application No. PCT/JP2006/301001 (with translation).

* cited by examiner

FIG.10
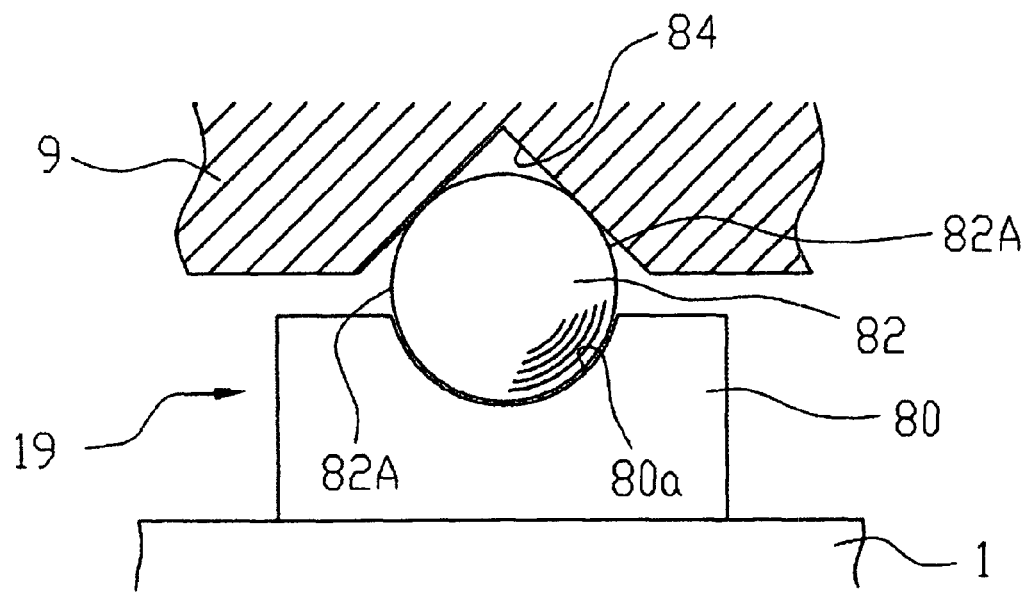
FIG.11
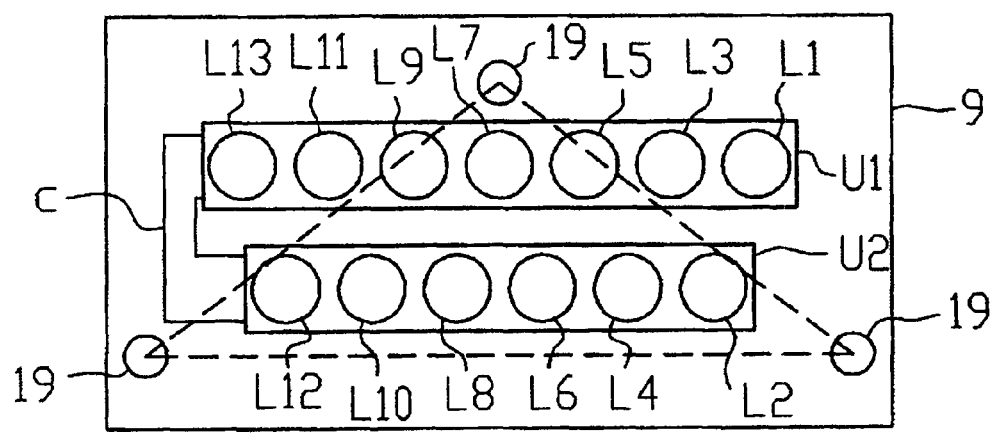
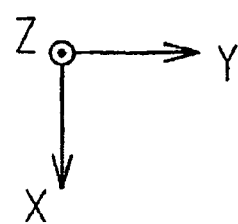

FIG.16
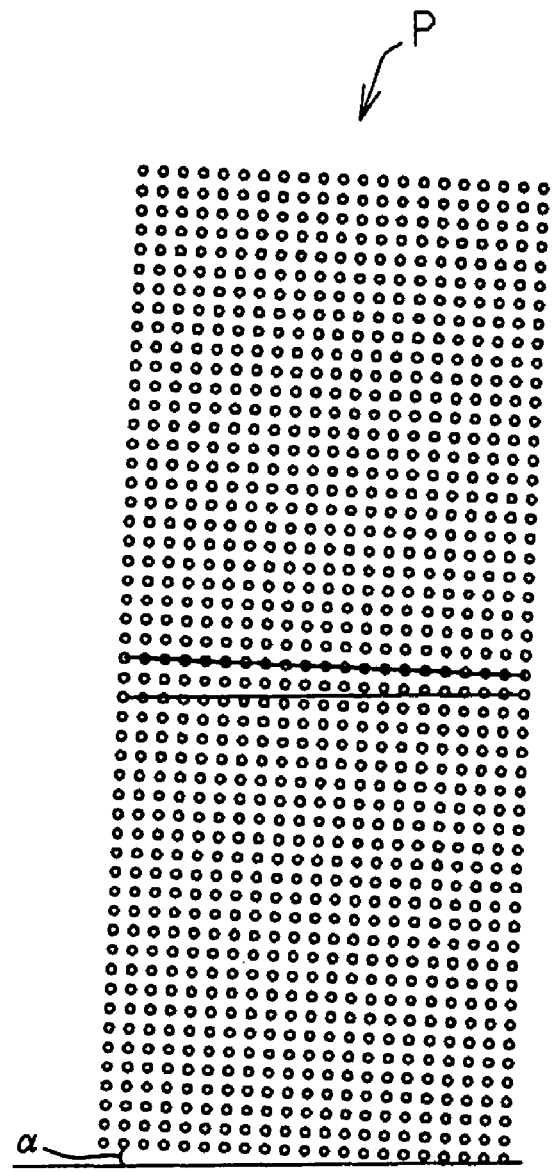
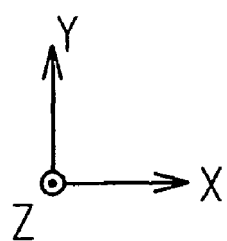

FIG.17
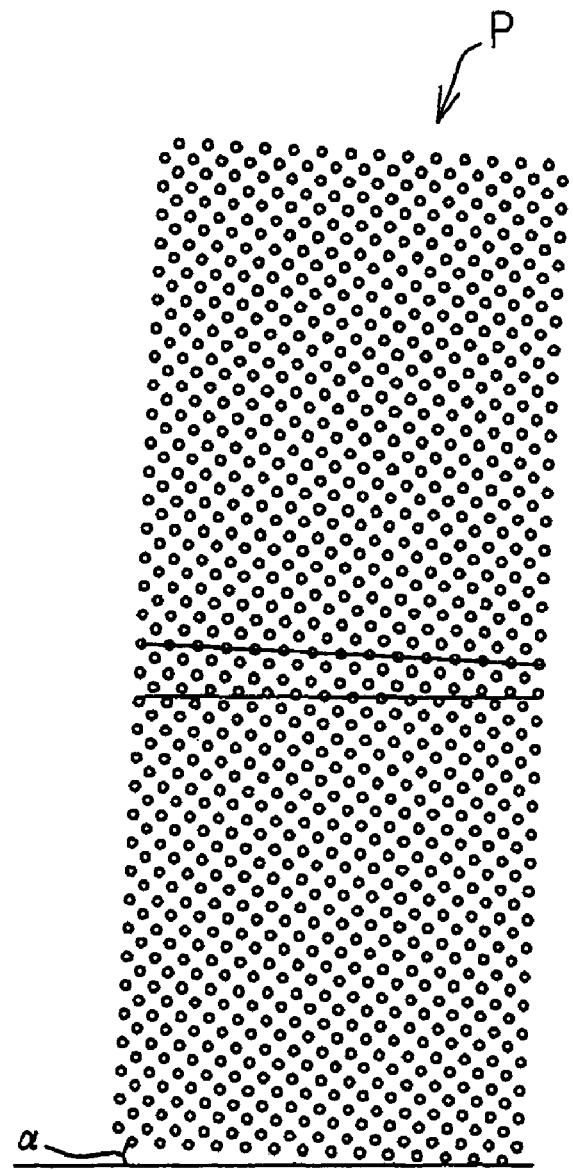
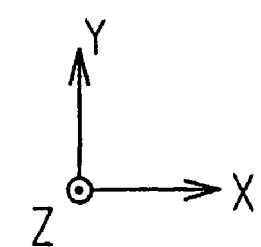

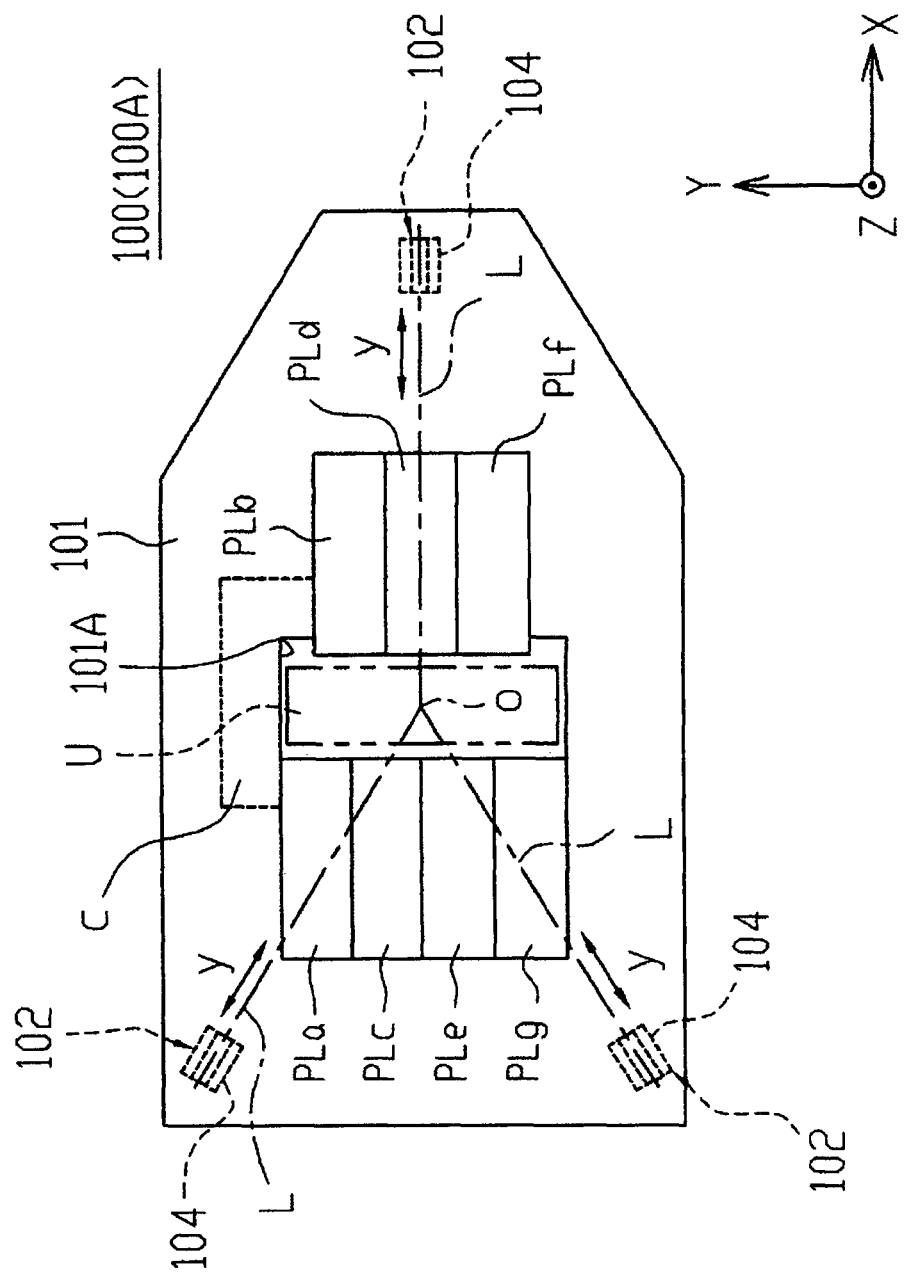

EXPOSURE APPARATUS, EXPOSURE METHOD, AND PRODUCING METHOD OF MICRODEVICE

TECHNICAL FIELD

The present invention relates to an exposure apparatus in which an image of a pattern is projected by a projection optical system onto an object such as a photosensitive substrate and the image is exposure-transferred on the object. The invention also relates to an exposure method and a producing method of a microdevice using the exposure apparatus.

BACKGROUND ART

A flat-panel display element such as a liquid crystal display device is produced by a so-called photolithography technique in which a pattern formed on a mask is transferred onto a photosensitive substrate. An exposure apparatus used in the photolithography step includes a mask stage for supporting a mask, and a substrate stage for supporting a substrate. The exposure apparatus transfers the pattern of the mask onto the substrate through a projection optical system while sequentially moving the mask stage and the substrate stage. When the liquid crystal display device of the display elements is to be produced, a large glass substrate (plate) is used as the substrate. It is desired to increase a display region size. To respond to the desire, a so-called multi-lens scanning type exposure apparatus is mainly used. The multi-lens scanning type exposure apparatus is a scanning type exposure apparatus which continuously transfers patterns of a mask while scanning the mask stage and the substrate stage in synchronization with each other, and which has a plurality of projection optical units arranged as a projection optical system (see Japanese Patent Application Publication Laid-open No. H7-57986 for example).

The plurality of projection optical units are disposed on both sides in a scanning direction with an autofocus detection system interposed therebetween. A projection optical unit disposed forward in the scanning direction and a projection optical unit disposed rearward in the scanning direction are supported by a column (body of the exposure apparatus) through different support bodies. However, the column is slightly distorted and deformed in some cases when the mask stage or substrate stage is moved, and there is a problem that the optical property (imaging property) of the projection optical unit is varied and precise exposing processing can not be carried out. Especially in the case of a structure in which the plurality of projection optical unit are supported using different support bodies, relative positions of the plurality of projection optical units are varied and precise exposing processing can not be carried out. As a projection optical system of a scanning type exposure apparatus for producing a liquid crystal display device, an erect and equal-magnification system is generally used. Since the mask stage and substrate stage move in the same direction during the scanning and exposing operation, an unbalanced load with respect to the column becomes great and the above problem appears seriously. With the upsizing requirement of a substrate, the entire apparatus (entire column) is also increased in size, a sufficient rigidity of the column can not be secured, and the above problem appears more seriously. Hence, there is proposed an exposure apparatus in which a projection optical unit disposed forward in the scanning direction and a projection optical unit disposed rearward in the scanning direction are supported by a column through one surface plate (support body) (see Japanese Patent Application Publication Laid-open No. 2004-177468 for example)

In the exposure apparatus disclosed in Japanese Patent Application Publication Laid-open No. H2004-177468, a projection optical unit disposed forward in the scanning direction and a projection optical unit disposed rearward in the scanning direction are placed on a surface plate, and the surface plate is supported by a column through a spherical member possessed by a support section. The surface plate is provided with an opening for forming a projected image on a substrate, a torsional component is generated in the surface plate due to a friction force applied to the spherical member possessed by the support section and a weight of the projection optical unit itself, and there is a possibility that a deviation in a projection position (a deviation in the scanning direction, a deviation in a direction intersecting with the scanning direction, and a deviation in a rotation direction around an optical axial direction of the projection optical system) is generated between the projection optical unit disposed forward in the scanning direction and the projection optical unit disposed rearward in the scanning direction.

With the upsizing of the liquid crystal display element, the plate is also increased in size and at present, a plate (glass substrate) of one meter square is used, and a mask is also increased in size. If a pattern rule of a device desired for the exposure apparatus is constant, the same flatness as that of a small mask is required for a large mask. Hence, to suppress a warp or curl of the large mask to the same level as those of the small mask, it is necessary that the thickness of the large mask is made largely thicker than that of the small mask. Generally, a mask used for producing a TFT (Thin Film Transistor) type liquid crystal display (panel) is an expensive quartz glass, and if the size there of is increased, the producing costs are also increased. Further, costs for maintaining the flatness of the mask and costs caused by increase in inspection time of the mask pattern are also increased.

Hence, there is proposed a maskless exposure apparatus which exposes a pattern and transfers the same onto a substrate using a DMD (Digital Micro-mirror Device or Deformable Micro-mirror Device) or the like instead of a mask. In the maskless exposure apparatus, a surface plate on which a projection optical unit disposed forward in the scanning direction and a projection optical unit disposed rearward in the scanning direction are placed is supported by a column as in the conventional projection exposure apparatus using a mask, the maskless exposure apparatus has the same problem as that of the projection exposure apparatus which uses a mask.

DISCLOSURE OF THE INVENTION

It is an object of the present invention to provide an exposure apparatus capable of correcting a displacement (deviation in a projection position) of optical performance generated between a plurality of optical units, and to provide an exposure method and a producing method of a microdevice using the exposure apparatus.

According to a first aspect of the present invention, there is provided an exposure apparatus for exposure-transferring an image of a pattern projected through an optical system having a plurality of optical units onto an object, comprising a correcting device which corrects a position of at least one of a plurality of images projected onto the object by the plurality of optical units so that displacement of the optical units are compensated.

A second aspect of the invention provides an exposure method for exposure-transferring an image of a pattern projected through an optical system having a plurality of optical units onto an object, wherein exposure is carried out while correcting a position of at least one of a plurality of images projected onto the object by the plurality of optical units so that displacements of the optical units are compensated.

In the exposure apparatus of the first aspect and the exposure method of the second aspect of the invention, a position of at least one of the plurality of images formed by the plurality of optical units can be corrected such that the displacements of the plurality of optical units are compensated. Therefore, a positional deviation of images formed by adjacent optical units can be corrected. Thus, even when positions of images are deviated due to a deformation or the like of a member which supports the plurality of optical units, it is possible to precisely match the joints of the adjacent optical units, and a predetermined pattern can precisely be transferred onto the object.

According to a third aspect of the invention, there is provided a producing method of a microdevice comprising an exposure step for exposing and transferring the image of the pattern using the exposure apparatus of the first aspect of the invention, and a developing step for developing the pattern on the object which has been exposed and transferred in the exposure step.

According to the producing method of the microdevice of the third aspect of the invention, the exposing processing is carried out using the exposure apparatus of the first aspect of the invention. Therefore, a predetermined pattern can precisely be transferred onto the object, and it is possible to obtain a microdevice having high performance, high quality and high reliability.

The present invention can be applied to an exposure apparatus which exposure-transfers a pattern formed on a mask onto an object through an optical system having a plurality of optical units, and can also be applied to an exposure apparatus which exposure-transfers a pattern produced by a variable forming mask which produces an arbitrary pattern (e.g., non-luminous type image display element (special light modulator) including the DMD for example), onto an object through an optical system having a plurality of optical units.

BRIEF DESCRIPTION OF THE DRAWINGS

FIG. 10 is a diagram showing a structure of a support section of the first embodiment of the invention;

FIG. 11 is a top view of the exposure optical systems and a surface plate of the first embodiment of the invention;

FIG. 16 is an explanatory diagram of positions where light beams passing through openings of the point image field stop of the first embodiment of the invention reach the plate;

FIG. 17 is an explanatory diagram of the positions where light beams passing through openings of the point image field stop of the first embodiment of the invention reach the plate;

FIG. 34 is a plan view of the surface plate supporting the projection optical module of the second embodiment of the invention;

DETAILED DESCRIPTION OF THE PREFERRED EMBODIMENT

First Embodiment

Figure 1:
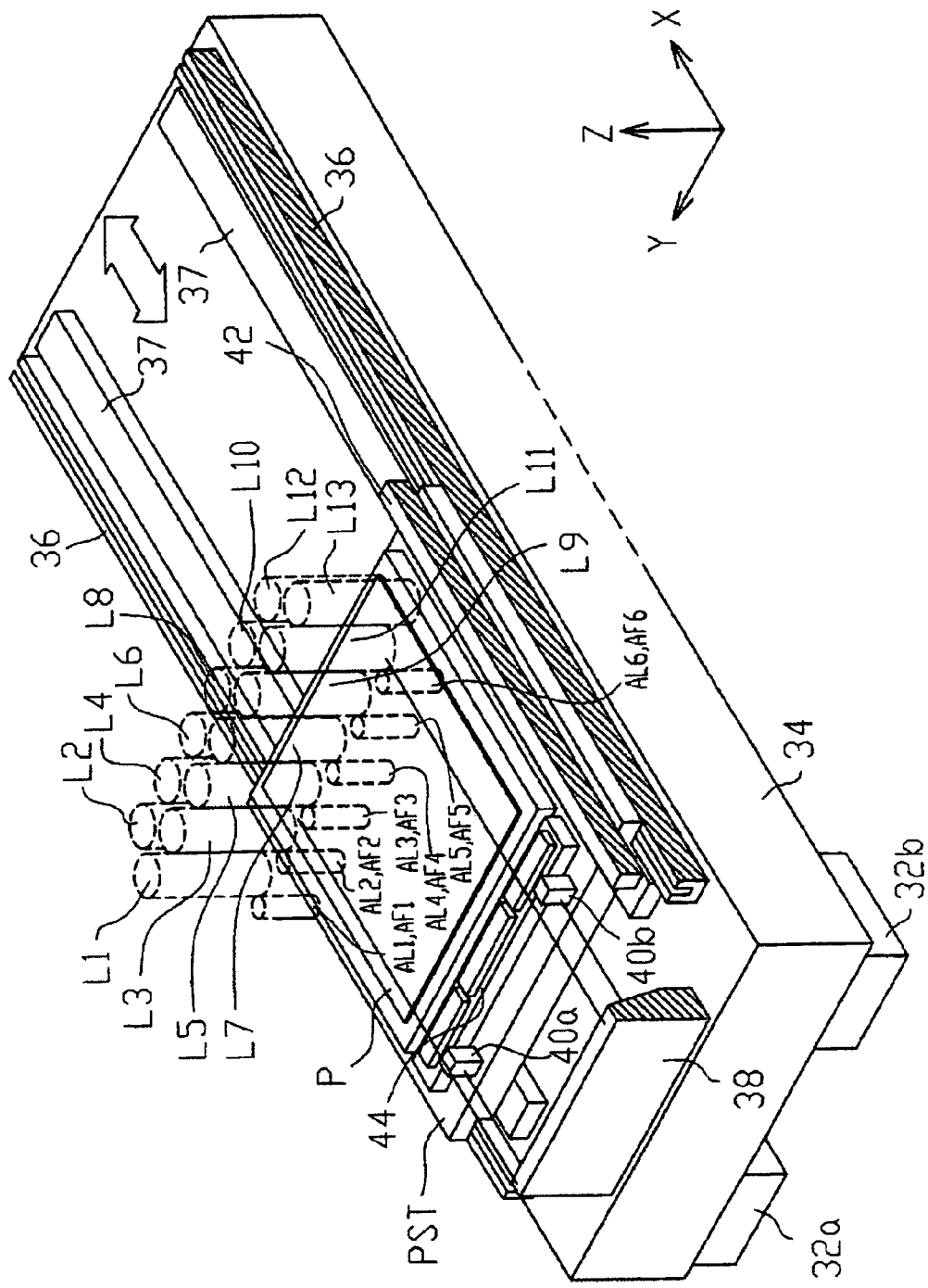
FIG. 1 is a schematic perspective view showing a structure of a scanning type exposure apparatus according to a first embodiment of the present invention.

A first embodiment of the present invention will be explained below with reference the drawings. FIG. 1 is a schematic perspective view of a structure of a scanning type exposure apparatus of the first embodiment of the invention. In this embodiment, a scanning type projection exposure apparatus employs a step-and-scanning method in which a pattern of a liquid crystal display element or the like is transferred onto a plate P while relatively moving, with respect to a plurality of exposure optical systems L1 to L13, a plate P as a photosensitive substrate on which a photosensitive material (resist) is applied.

In the following explanation, a rectangular coordinate system shown in FIG. 1 is set, and a positional relation of various members will be explained with reference to the XYZ rectangular coordinate system. In the XYZ rectangular coordinate system, the X-axis and Y-axis are in parallel to the plate P, and the Z-axis intersects with the plate P. In the XYZ coordinate system shown in the drawing, the XY plane is actually in parallel to a horizontal plane, and the Z-axis is oriented to the vertical direction. In this embodiment, a direction (scanning direction) into which the plate P is moved is the X direction.

The scanning type exposure apparatus includes a photosensitive substrate (substrate stage) PST which supports a plate P having an outer diameter of greater than 500 mm, a plurality of exposure optical systems L1 to L13 for exposing an arbitrary pattern onto the plate P, a column 1 which supports the exposure optical systems L1 to L13 through a surface plate 9 (see FIG. 8), and a control device CONT1 (see FIG. 15) for controlling action concerning the exposing processing in a centralized manner. The exposure optical systems L1 to L13 are respectively accommodated in casings and are mounted in the column 1. The exposure optical systems L1, L3, L5, L7, L9, L11 and L13 are disposed rearward in the scanning direction (in the −X direction) and arranged in the Y direction (non-scanning direction). The exposure optical systems L2, L4, L6, L8, L10 and L12 are disposed forward in the scanning direction (in the +X direction) and arranged in the Y direction.

Light beams emitted from an LD light sources (not shown) are projected onto fibers. In this embodiment, a plurality of LD light sources and fibers are provided in correspondence with the exposure optical systems L1 to L13. One LD light source and one fiber may be provided, and the fiber may includes a plurality of fiber emitting ends corresponding to the exposure optical systems L1 to L13.

Figure 2:
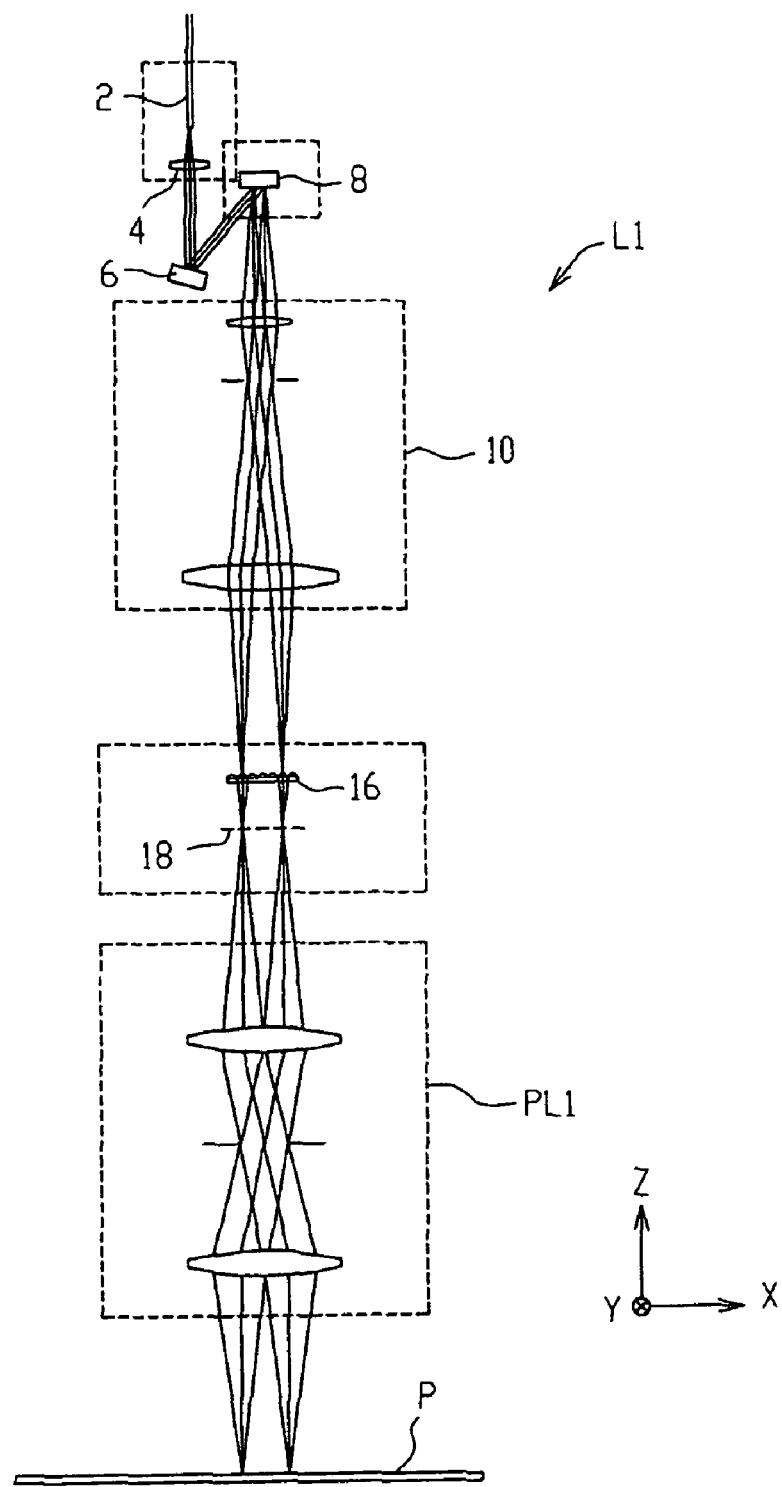
FIG. 2 is a diagram showing a structure of an exposure optical system of the first embodiment of the invention.

FIG. 2 is a schematic diagram showing a structure of the exposure optical system (first exposure unit) L1. The light beam emitted from the LD light source (not shown) and projected onto the fiber 2 is emitted from an emitting end of the fiber 2. The light beam emitted from the emitting end of the fiber 2 equally illuminates a DMD (Digital Micro-mirror Device or Deformable Micro-mirror Device) 8 constituting the exposure optical system L1 through a collimate optical system 4 and a mirror 6. The DMD 8 may be provided separately from the exposure optical system L1.

Figure 3:
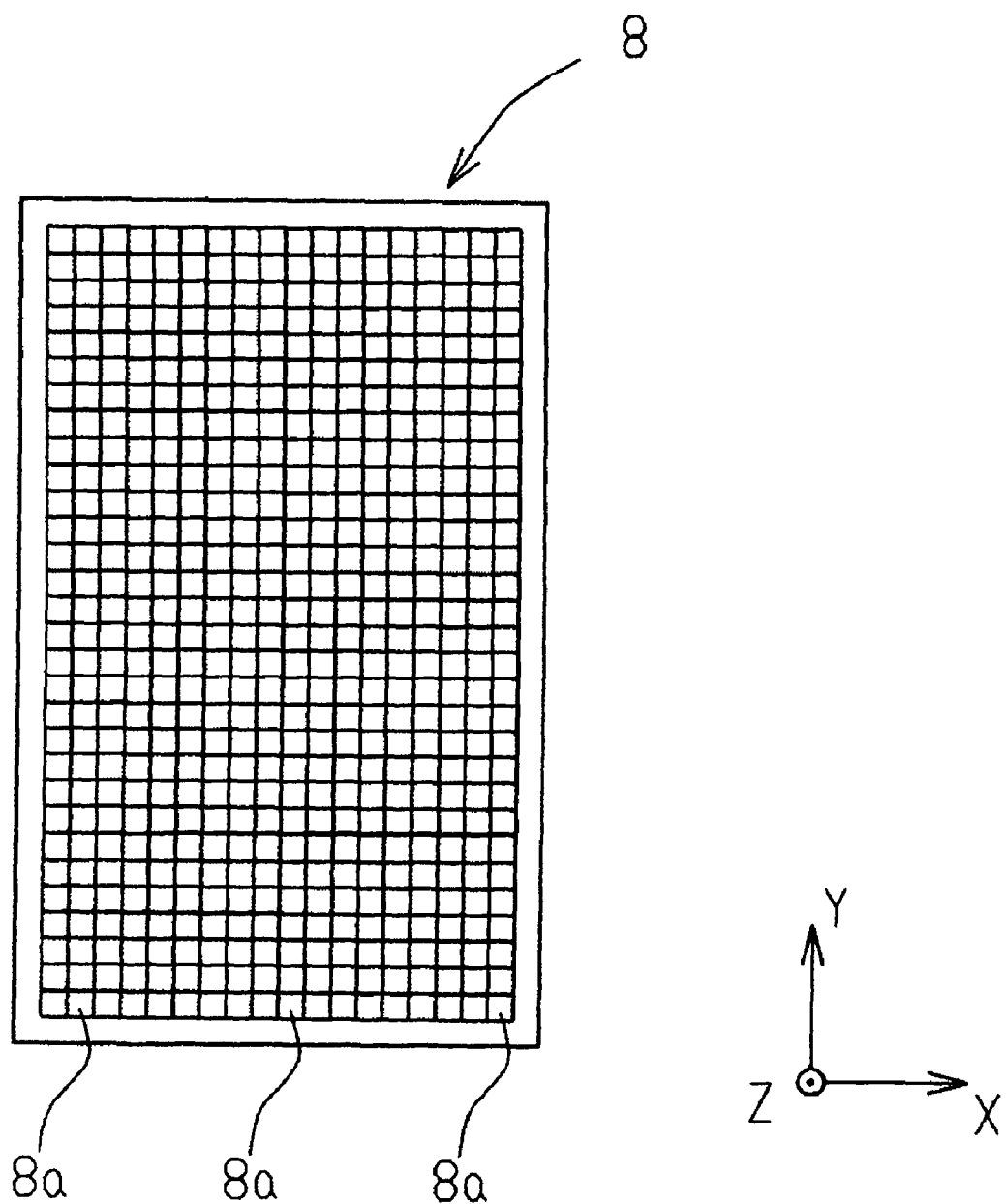
FIG. 3 is a diagram showing a structure of a DMD of the first embodiment of the invention.

FIG. 3 is a diagram showing a structure of a DMD (correcting device) 8. The DMD 8 includes a large number of micro-mirrors (reflection members) 8a as devices divided into very small regions as show in FIG. 3. Each micro-mirror 8a can independently change its angle. By changing the angle of the micro-mirror 8a, the DMD 8 functions as a variable forming mask (first variable forming mask) which modulates light beam in accordance with predetermined image data by changing the angle of the micro-mirror 8a. That is, angles of one or some of the micro-mirrors 8a are changed such that reflection light is introduced into a later-described relay optical system 10 in synchronization with the scanning operation of the plate P, and angles of other micro-mirrors 8a are changed such that the reflection light travels in a direction different from the relay optical system 10, and arbitrary patterns to be projected onto corresponding exposure regions are sequentially produced.

Figure 4:
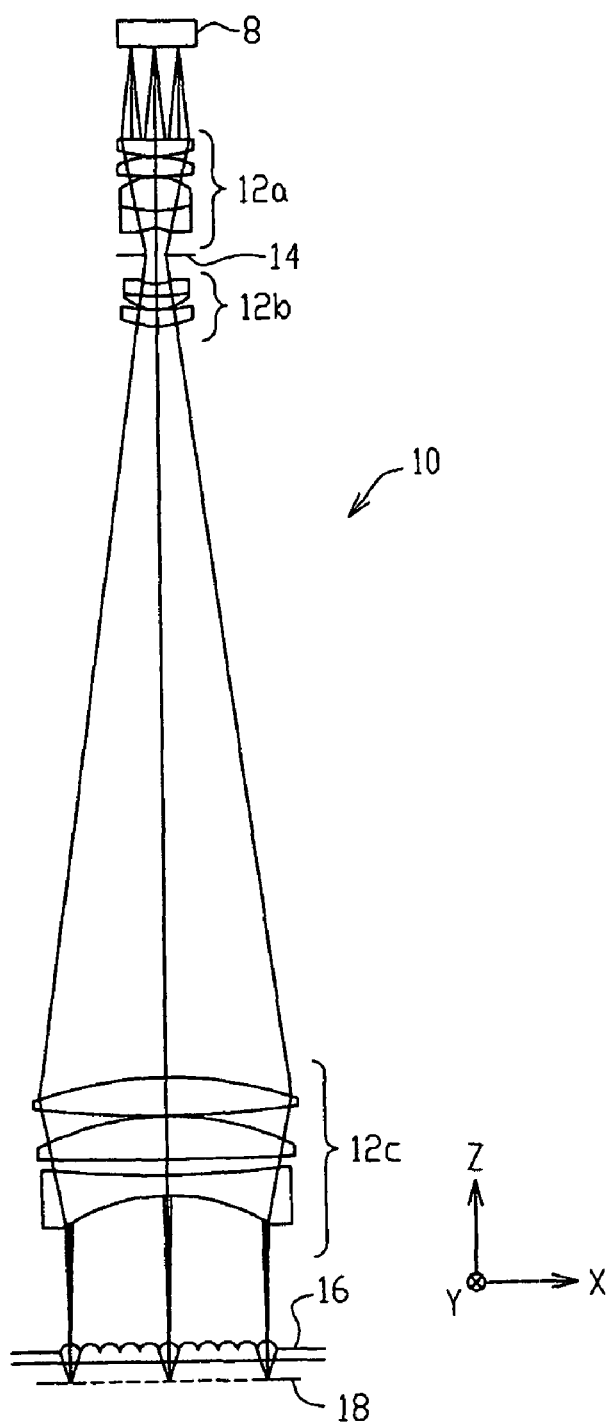
FIG. 4 is a diagram showing a structure from the DMD to a point image field stop of the first embodiment of the invention.

Light beams reflected by the DMD 8 (one or some of micro-mirrors 8a) are projected onto the relay optical system 10. FIG. 4 is a diagram showing a structure of the relay optical system 10. The relay optical system 10 includes a relay lens group 12a, an aperture 14, a relay lens group 12b and a relay lens group 12c. The light beams pass through a relay lens group 12a, an aperture 14, a relay lens group 12b and a relay lens group 12c and spread and projected onto a microlens array 16.

Figure 5:
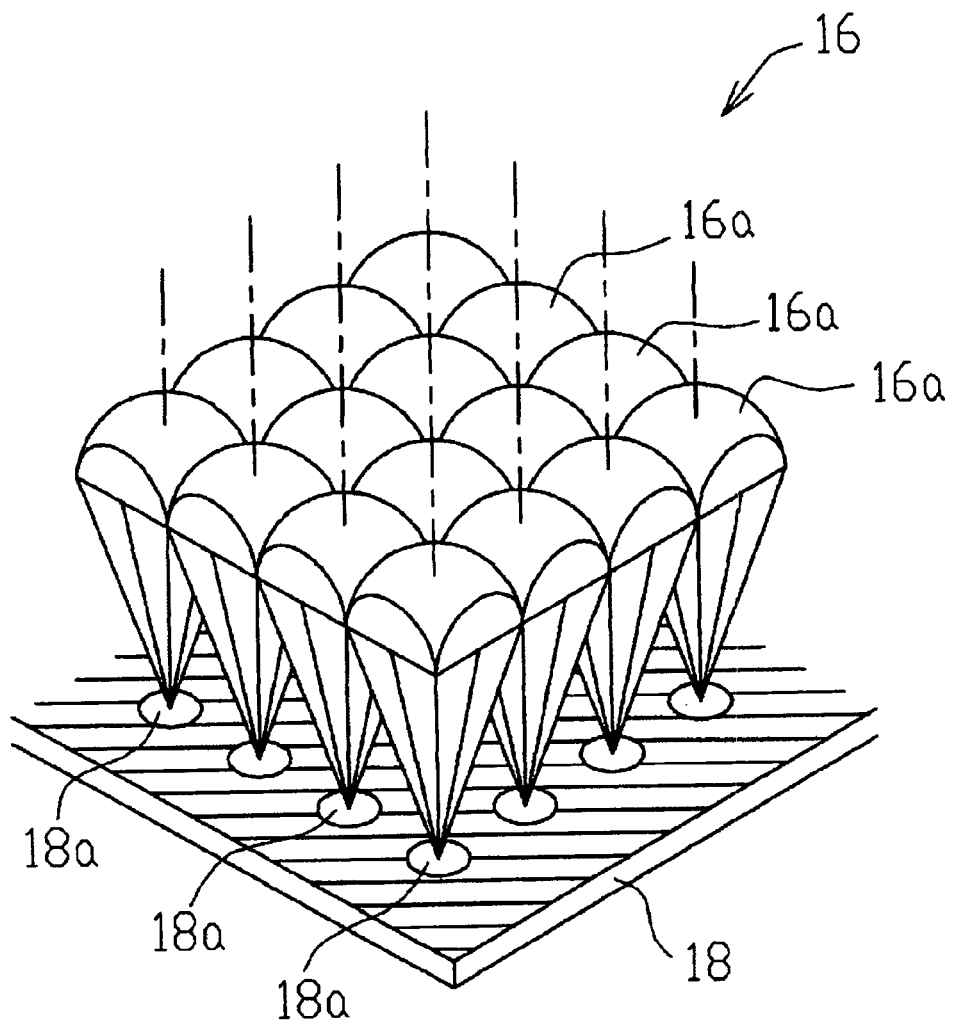
FIG. 5 is a diagram showing structures of portions of a microlens array and a point image field stop of the first embodiment of the invention.

FIG. 5 is a diagram showing a structure of a portion of the microlens array 16 and a portion of a later-described point image field stop 18. As shown in FIG. 5, the microlens array 16 includes a large number of element lenses 16a corresponding to the micro-mirrors 8a constituting the DMD 8. The microlens array 16 is disposed at an optically conjugated position with respect to the plate P or a position near the conjugated position. The microlens array 16 can move in a direction parallel to the XY plane and in the Z direction, and can incline with respect to the XY plane.

The light beam which passed each element lens 16a of the microlens array 16 passes through the point image field stop 18. As shown in FIG. 5, the point image field stop 18 includes a large number of openings 18a provided in correspondence with the element lenses 16a constituting the microlens array 16. If light beams pass through the openings 18a of the point image field stop 18, an adverse influence on exposure caused by ghost generated in the exposure optical system L1 and image flow generated at the time of ON/OFF operation of the DMD 8 can be prevented. The point image field stop 18 can change sizes of the large number of openings 18a. By changing the sizes of the openings 18a, resolution of the exposure optical system L1 can be adjusted.

The point image field stop 18 may includes a large number of light transmission sections provided in corresponding to the element lenses 16a of the microlens array 16 instead of the large number of openings 18a. Each of other exposure optical systems (second to thirteenth exposure units) L2 to L13 also includes the DMD (variable forming mask), the relay optical system, the microlens array and the point image field stop. The DMD, the relay optical system, the microlens array and the point image field stop have the same structures as those of the DMD 8, the relay optical system 10, the microlens array 16 and the point image field stop 18.

Figure 6:
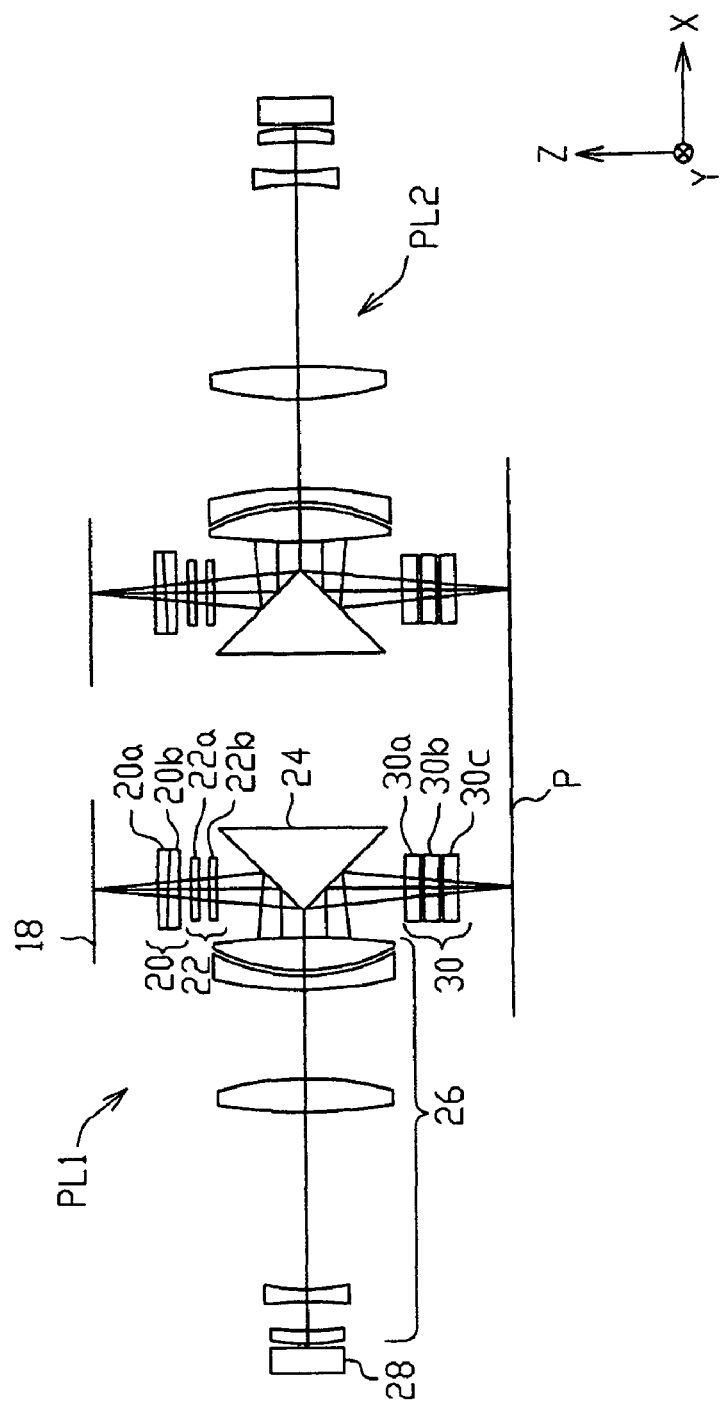
FIG. 6 is a diagram showing a structure of a projection optical module of the first embodiment of the invention.

As shown in FIG. 2, light beams which passed through the openings 18a of the point image field stop 18 are projected onto a projection optical module PL1. FIG. 6 is a diagram showing a structure of the projection optical module PL1 constituting the exposure optical system L1 and a projection optical module PL2 constituting the exposure optical system L2. As shown in FIG. 6, the light beam projected onto the projection optical module PL1 is projected onto a focus adjusting mechanism (correcting optical system) 20 constituting the projection optical module PL1. The focus adjusting mechanism 20 includes a first optical member 20a and a second optical member 20b. The first optical member 20a and the second optical member 20b are wedge-like glass plates through which light beams can pass. The first optical member 20a and the second optical member 20b constitute a pair of wedge type optical members. The first optical member 20a and the second optical member 20b can relatively move with respect to each other. If the first optical member 20a is slid in the X direction with respect to the second optical member 20b, an image plane position of the projection optical module PL1 moves in the Z direction.

The light beam which passed through the focus adjusting mechanism 20 is projected onto a shift adjusting mechanism (correcting optical system) 22. The shift adjusting mechanism 22 includes a parallel flat glass plate 22a which can rotate around the Y-axis, and a parallel flat glass plate 22b which can rotate around the X-axis. If the parallel flat glass plate 22a rotates around the Y-axis, an image of the pattern on the plate P is shifted in the X-axis direction. If the parallel flat glass plate 22b rotates around the X-axis, the image of the pattern on the plate P is shifted in the Y-axis direction.

The light beam which passed through the shift adjusting mechanism 22 is projected onto a right-angle prism (correcting optical system) 24 as a rotation adjusting mechanism. The right-angle prism 24 can rotate around the Z-axis. If the right-angle prism 24 rotates around the Z-axis, the image of the pattern on the plate P rotates around the Z-axis. A light beam reflected by the right-angle prism 24 is reflected by a mirror 28. The light beam reflected by the mirror 28 is again projected onto a magnification adjusting mechanism (correcting optical system) 30 through the lens group 26 and the right-angle prism 24.

The magnification adjusting mechanism 30 includes three lenses 30a, 30b and 30c. The three lenses 30a to 30c comprise a concave lens 30a, a convex lens 30b and a concave lens 30c. The magnification of a pattern image formed on the plate P can be adjusted by moving the convex lens 30b in the Z direction. The light beam which passed through the magnification adjusting mechanism 30 forms a predetermined pattern image in a predetermined exposure region on a plate (large rectangular substrate) P for a flat-panel display such as a liquid crystal display element having one side of an outer diameter greater than 500 mm, i.e., one side or a diagonal line of greater than 500 mm. Projection optical modules (projection optical modules PL2 to PL13, hereinafter) constituting the other exposure optical systems L2 to L13 have the same structures as that of the projection optical module PL1.

Figure 7:
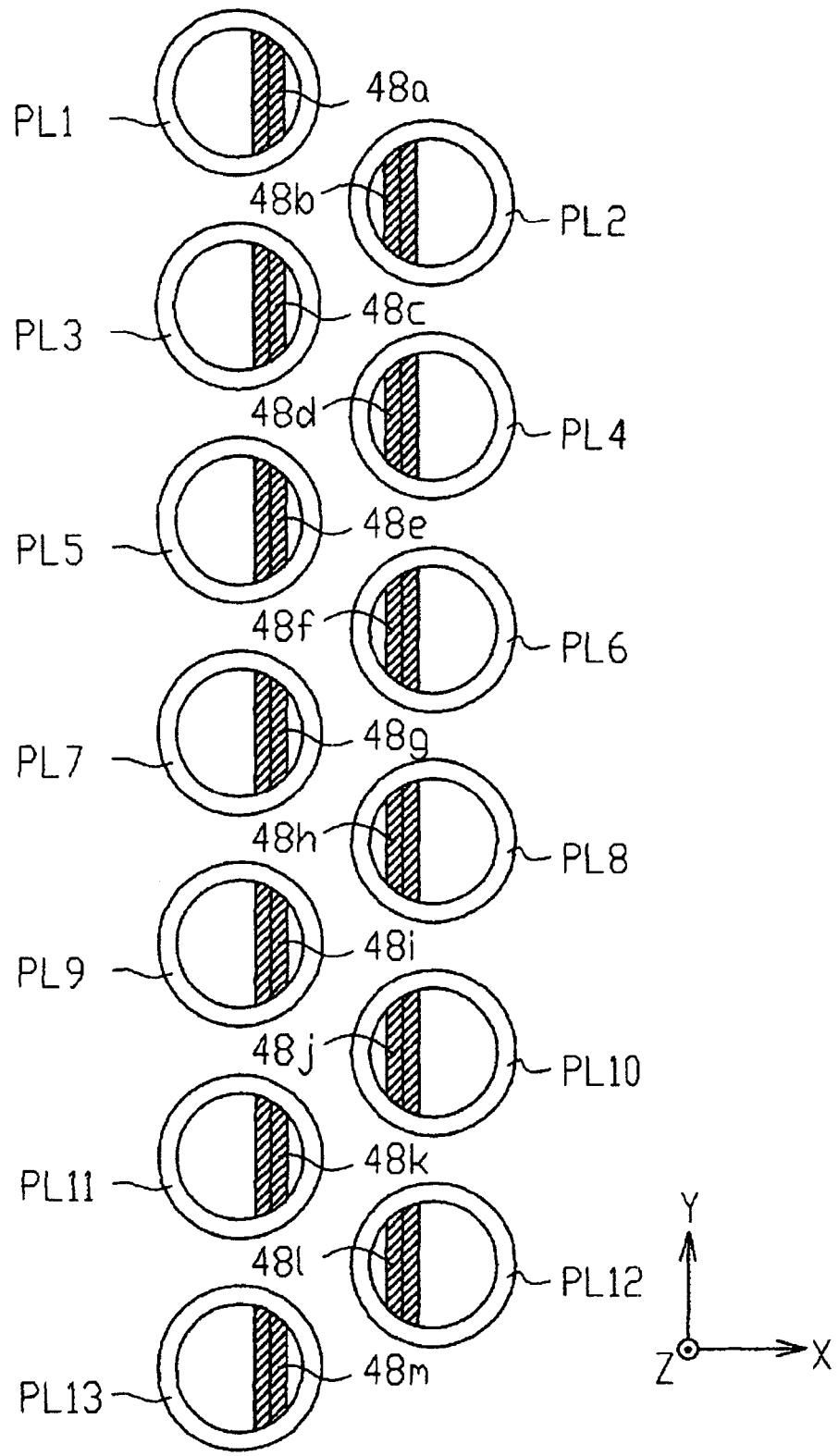
FIG. 7 is a plan view showing projection regions of the projection optical modules on a plate of the first embodiment of the invention.

FIG. 7 is a plan view showing projection regions (corresponding to the exposure regions) 48a to 48m by the projection optical modules PL1 to PL13 on the plate P. Each of the projection regions 48a to 48m has a predetermined shape (hexagon, rhombus, parallelogram or arc) corresponding to a field of view region of each of the projection optical modules PL1 to PL13. In this embodiment, the shape of the projection region is a trapezoid. The projection regions 48a, 48c, 48e, 48g, 48i, 48k and 48m and the projection regions 48b, 48d, 48f, 48h, 48j, 48l are separated from each other in the X direction by a predetermined distance. The projection regions 48a to 48m are arranged in parallel such that ends (boundaries) of the adjacent projection regions of the projection regions 48a to 48m are superposed on one another in the Y direction. That is, images formed adjacent on the plate P by the exposure optical systems L1, L3, L5, L7, L9, L11 and L13 are partially superposed on one another.

As shown in FIG. 1, the plate stage PST on which the plate P is placed is provided on a base 34. The base 34 is supported by vibration isolation stages 32a and 32b and vibration isolation stages 32c and 32d (see FIGS. 8 and 9). Usually, three (four, in this embodiment) vibration isolation stages 32a to 32d are disposed so that vibration from outside is not transferred to the exposure apparatus. The plate stage PST can move in the scanning direction (X direction) by a linear motor 36. The plate stage PST has a so-called air stage structure which floats with respect to a guide 37 by air gap. The plate stage PST has a finely moving stage (not shown) which can finely move in the non-scanning direction (Y direction).

Figure 8:
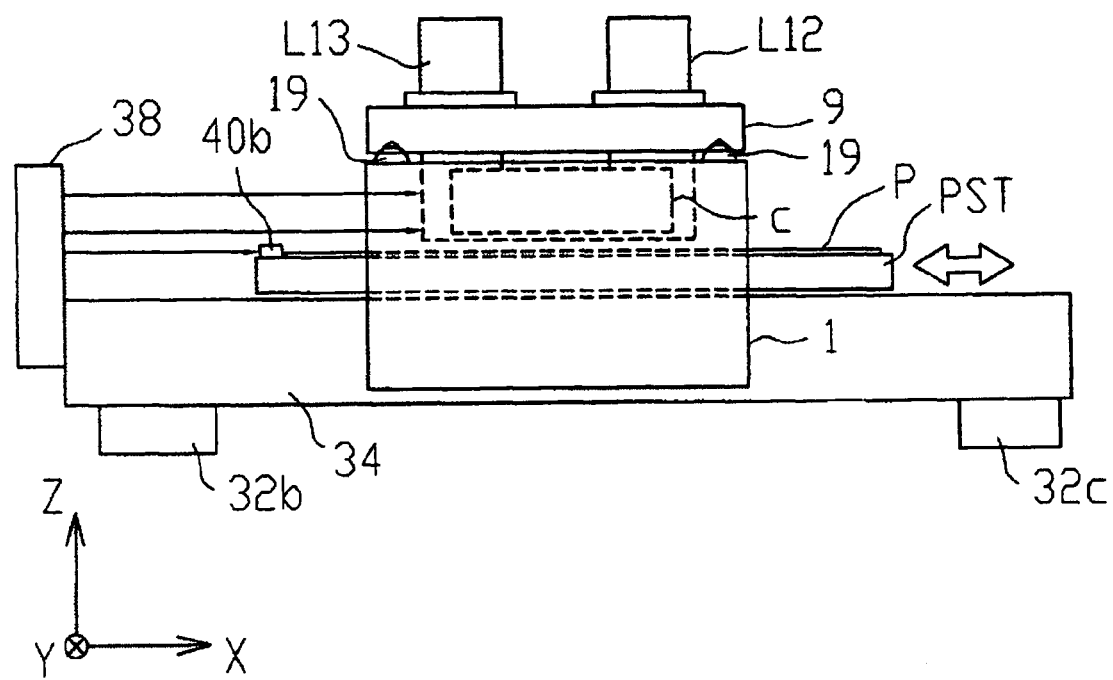
FIG. 8 is a schematic diagram showing a structure of a scanning type exposure apparatus of the first embodiment of the invention.
Figure 9:
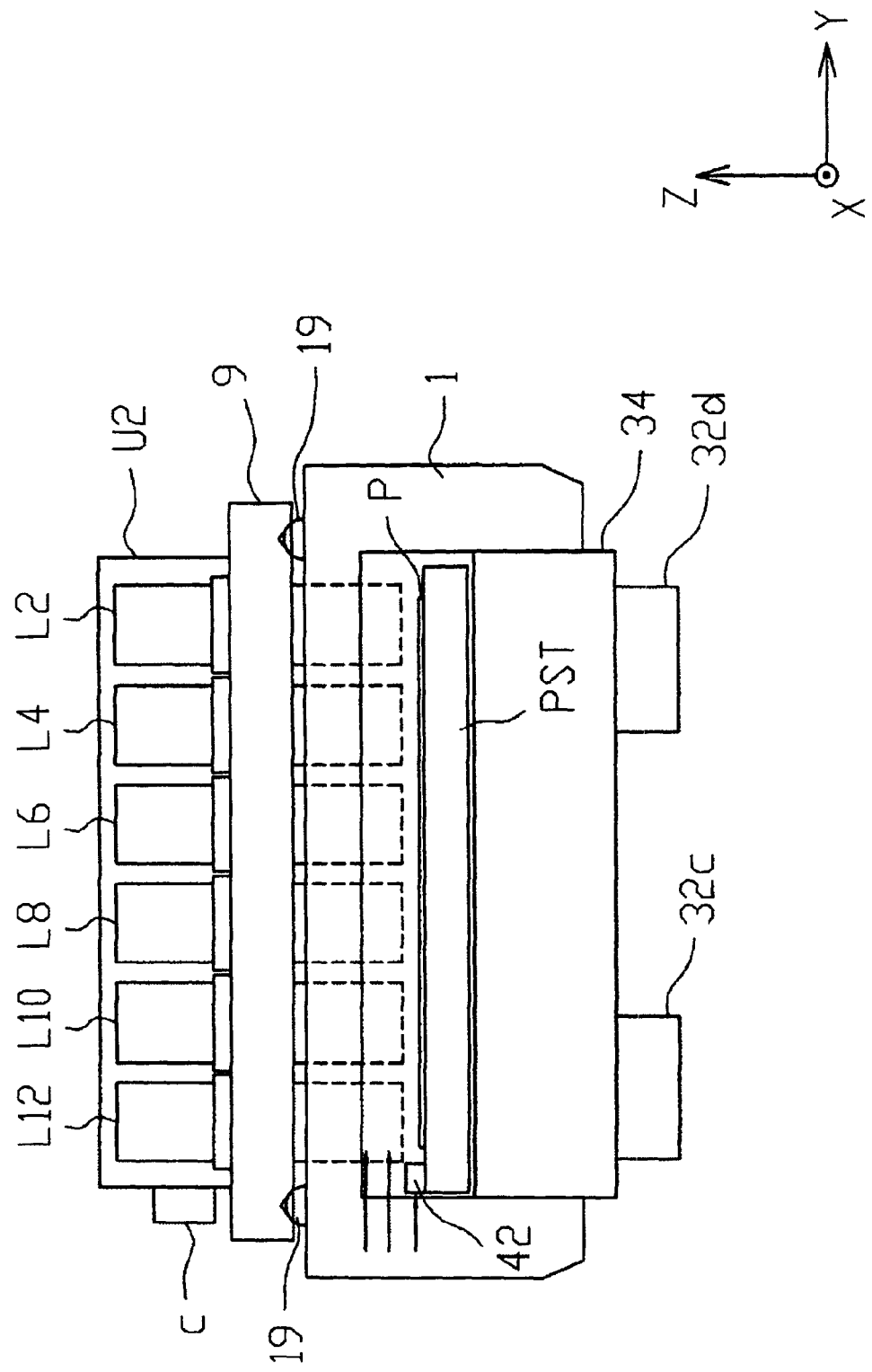
FIG. 9 is a schematic diagram showing a structure of a scanning type exposure apparatus of the first embodiment of the invention.

The column 1 is provided with a laser interferometry which will be described in detail later. Reference mirrors (not shown) are provided at predetermined positions of the casings which accommodate the exposure optical systems L1, L3, L5, L7, L9, L11 and L13. The plate stage PST is provided with X moving mirrors 40a and 40b and a Y moving mirror 42. FIGS. 8 and 9 are schematic diagram showing a structure of the scanning type exposure apparatus of the embodiment. As shown in FIGS. 8 and 9, the surface plate 9 which supports the exposure optical systems L1, L3, L5, L7, L9, L11 and L13 is kinematically supported on the column 1 through support sections 19. The support sections 19 are provided at three predetermined positions (see FIG. 10) of the surface plate 9. The column 1 may be disposed on the same installation surface (floor, base plate or the like) as that of the vibration isolation stages 32a to 32d which support the base 34. The column 1 has a body structure which suppresses the transfer of vibration to the exposure optical systems L1, L3, L5, L7, L9, L11 and L13 through the column 1 (and surface plate 9). For example, it is preferable that the column 1 is provided on the base 34, or the column 1 is provided on an installation surface through a vibration isolation stage that is different from the vibration isolation stages 32a to 32d.

As shown in FIG. 1, of the plurality of exposure optical systems L1, L3, L5, L7, L9, L11 and L13, the exposure optical systems L1, L3, L5, L7, L9, L11 and L13 are arranged in the Y direction (direction intersecting with the scanning direction), and are disposed rearward in the X direction (scanning direction) (first exposure unit group, hereinafter). The first exposure unit group is accommodated in a casing U1 (see FIG. 11). The exposure optical systems L2, L4, L6, L8, L10 and L12 are arranged in the Y direction and are disposed forward in the X direction (second exposure unit group, hereinafter). The second exposure unit group is accommodated in a casing U2 (see FIG. 11). The first exposure unit group and the second exposure unit group are disposed such as to be opposed to each other in the X direction. The exposure optical systems L1, L3, L5, L7, L9, L11 and L13 constituting the first exposure unit group and the exposure optical systems L2, L4, L6, L8, L10 and L12 constituting the second exposure unit group are disposed in a staggered form. That is, the adjacent exposure optical systems L1 to L13 which are disposed in the in a staggered form (e.g., exposure optical systems L1 and L2, L3 and L4 and the like) are displaced by a predetermined distance in the Y direction. With this design, the projection regions 48a to 48m of the exposure optical systems L1 to L13 (projection optical modules PL1 to PL13) are disposed on the plate P in a telescopic manner (see FIG. 7).

FIG. 10 is an enlarged view of the support section 19. As shown in FIG. 10, the support section 19 is provided on an upper portion of the column 1. The support section 19 includes a member 80 having a spherical concave portion 80a, and a spherical member 82 having a spherical surface 82A which comes into contact with the spherical concave portion 80a. The member 80 is fixed to the upper portion of the column 1. A V-shaped concave portion 84 in which the spherical member 82 can be disposed is formed in a lower surface of the surface plate 9. An inner surface of the V-shaped concave portion 84 of the surface plate 9 and the spherical surface 82A of the spherical member 82 are in contact with each other. The spherical member 82 is disposed in the spherical concave portion 80a of the member 80, and the spherical surface 82A of the spherical member 82 can slide on an inner surface of the spherical concave portion 80a. The surface plate 9 is disposed on the spherical member 82 through the V-shaped concave portion 84, and an inner surface of the V-shaped concave portion 84 and the spherical surface 82A of the m82 ca slide on each other. Since these surfaces can slide on each other, if the column 1 is slightly deformed for example, these surfaces slide on each other, and an influence of the deformation of the column 1 on the surface plate 9 is restrained.

Figure 12:
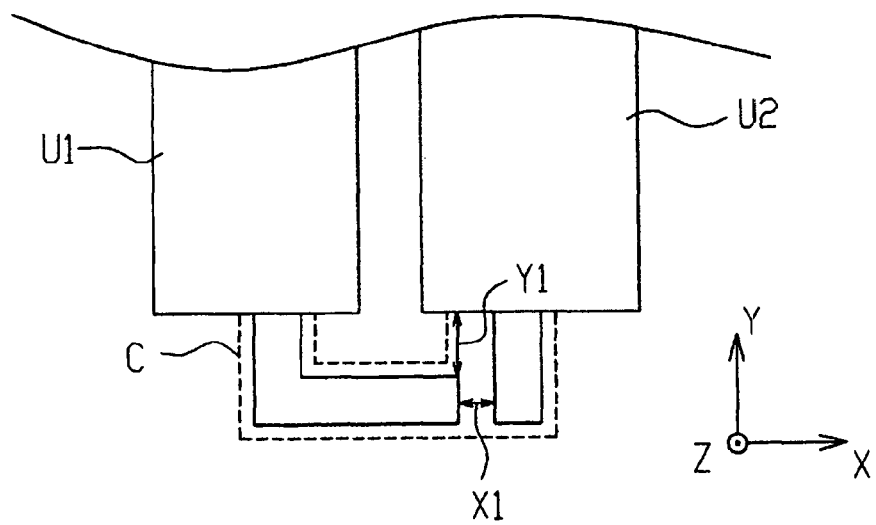
FIG. 12 is a top view showing a structure of a sensor of the first embodiment of the invention.
Figure 13:
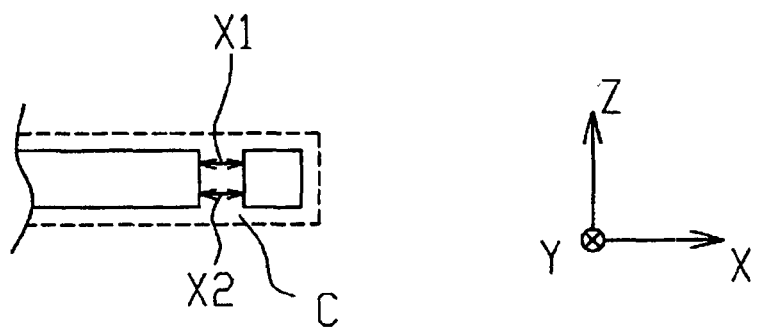
FIG. 13 is a front view showing a structure of a sensor of the first embodiment of the invention.

FIG. 11 is a top view of the surface plate 9 and the exposure optical systems L1 to L13 accommodated in the casings U1 and U2. As shown in FIG. 11, the support sections 19 are provided at three predetermined locations in a plane direction (XY direction) of the surface plate 9. As shown with broken line in FIG. 11, the support sections 19 are disposed such that a center of a triangle formed by connecting the three support sections 19 and a center of the surface plate 9 substantially match with each other. Therefore, even if the column 1 is deformed, the center does not largely move. A so-called kinematic support structure is formed by the support sections 19. With this, even if the column 1 is deformed, the casings U1 and U2 accommodating the exposure optical systems L1 to L13 and the surface plate 9 do not largely move, and change in relative positions of the plurality of exposure optical systems L1 to L13 can be suppressed to a small level As shown in FIGS. 8 and 9 (not shown in FIG. 1), the scanning type exposure apparatus is provided with a sensor (measuring device) C for measuring a relative positional relation between the first exposure unit group and the second exposure unit group on the side of the exposure optical systems L12 and L13 (−Y direction) and on the side surfaces of the casings U1 and U2. The sensor C measures a displacement amount of the relative position between the first exposure unit group and the second exposure unit group, which can not suppressed by the support section 19, which constitutes the kinematic support structure. That is, a relative translation amount (relative deviation amount in the X direction) between the first exposure unit group and the second exposure unit group, and an attitude difference (relative deviation amount in the Y direction) are measured. A capacitance sensor, a displacement sensor, an interferometer or the like is used as the sensor C. As shown in FIG. 12, the sensor C measures a relative first distance X1 between the first exposure unit group and the second exposure unit group in the X direction (scanning direction). As shown in FIG. 13, a relative second distance X2 between the first exposure unit group and the second exposure unit group in the X direction is measured. The distances X1 and X2 measured by the sensor C are output to the control device CONT1.

Figure 14:
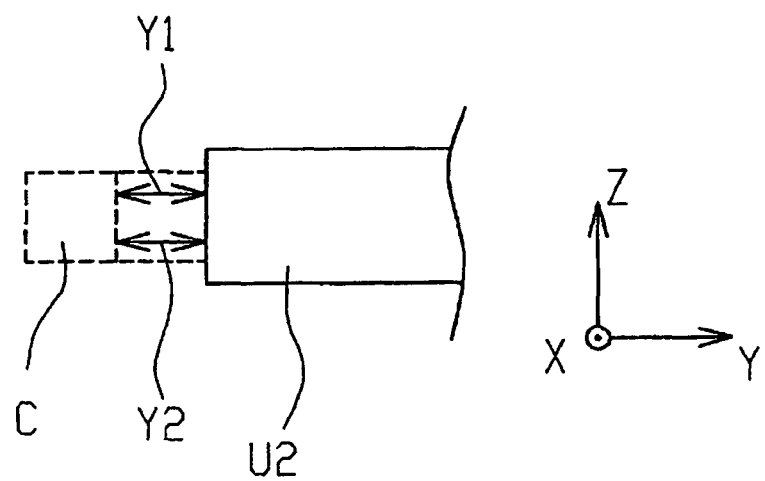
FIG. 14 is a side view showing a structure of a sensor of the first embodiment of the invention.

As shown in FIGS. 12 and 14, the sensor C measures a relative first distance Y1 between the first exposure unit group and the second exposure unit group in the Y direction (direction intersecting with the scanning direction). As shown in FIG. 14, a relative second distance Y2 between the first exposure unit group and the second exposure unit group in the Y direction is measured. The distances Y1 and Y2 measured by the sensor C are output to the control device CONT1.

As shown in FIG. 1, the scanning type exposure apparatus includes a laser interferometry system for measuring a position of the plate stage PST. The plate stage PST is provided at its −X side end edge with X moving mirrors 40a and 40b extending in the Y-axis direction. The plate stage PST is also provided at its −Y side end edge with a Y moving mirror 42 extending in the X-axis direction. An X laser interferometry 38 is provided on the base 34 at a location opposed to the X moving mirrors 40a and 40b.

An X reference mirror (not shown) and a Y reference mirror (not shown) are mounted on each of the casings of the exposure optical systems L1 to L13. The X laser interferometry 38 irradiates the X moving mirrors 40a and 40b with length measuring beam, and irradiate the corresponding X reference mirrors with reference beam. Light reflected by the X moving mirrors 40a and 40b and the X reference mirror based on the emitted length measuring beam and reference beam is received by a photoreceiver. The X laser interferometry 38 detects the interference light, and a detection result is output to the control device CONT1. Based on the detection result of the X laser interferometry 38, the control device CONT1 measures a displacement amount of the optical path of the length measuring beam based on an optical path of the reference beam as a reference, and measures positions (coordinate) of the X moving mirrors 40a and 40b based on the X reference mirror as a reference. The control device CONT1 obtains the position of the plate stage PST in the X-axis direction based on the measurement result.

The Y laser interferometry irradiates the Y moving mirror 42 with length measuring beam, and irradiates the Y reference mirror with reference beam. Light reflected from the Y moving mirror 42 and the Y reference mirror based on the emitted length measuring beam and reference beam is received by a photoreceiver of the Y laser interferometry. The Y laser interferometry detects the interference light, and outputs a detection result to the control device CONT1. The control device CONT1 measures a displacement amount of an optical path of the length measuring beam based on an optical path of the reference beam as a reference, and measures a position (coordinate) of the Y moving mirror 42 based on the Y reference mirror as a reference. The control device CONT1 obtains a position of the plate stage PST in the Y-axis direction based on the measurement result.

The control device CONT1 controls the attitude of the plate stage PST based on the measurement result of the attitude of the surface plate 9, and adjusts the relative position between the plate stage PST (plate P) and the exposure optical systems L1 to L13 supported by the surface plate 9.

As shown in FIG. 1, the scanning type exposure apparatus includes a plurality of alignment systems AL1 to AL6 for detecting alignment marks provided on the plate P rearward of the scanning direction (−X direction) of the exposure optical systems L1 to L13. The scanning type exposure apparatus also includes autofocus systems AF1 to AF6 for detecting a position of the plate P in the Z direction. The plate stage PST is provided at its end in the −X direction with a reference member 44 having a plurality of measuring marks (AIS marks, hereinafter) arranged in the Y direction. A space image measuring sensor (AIS) (not shown) is provided below the reference member 44, and the space image measuring sensor is embedded in the plate stage PST.

The space image measuring sensor is used for obtaining a relation between positions of the DMDs and positions to which transfer pattern images formed by the DMDs are projected onto the plate P. That is, the plate stage PST is moved so that the reference mark formed by the DMD and the AIS mark match with each other, the reference mark image and the AIS mark are detected by the space image measuring sensor, and the relation between the position of the DMD and the position to which the transfer pattern image formed by the DMD is projected onto the plate P is obtained. The reference mark formed by the DMD in this case is stored in a later-described pattern storing section 74 (see FIG. 15), and the position of the plate stage PST is detected by the X laser interferometry 38 and the Y laser interferometry.

The space image measuring sensor is used for obtaining the relation between the positions of the alignment systems AL1 to AL6 and the position of the plate stage PST (position on the XY coordinate system of the center of measurement of each alignment system). That is, the plate stage PST is moved, the AIS mark is brought into alignment with the center of the measuring region of the alignment systems AL1 to AL6 (index mark provided on each alignment system), and the position of the plate stage PST at that time is detected by the X laser interferometry 38 and the Y laser interferometry. Based on the detection result, the relation between the positions of the alignment systems AL1 to AL6 and the position of the plate stage PST is obtained.

At least one intensity sensor (beam intensity measuring system, not shown) is provided near the plate stage PST. The intensity sensor measures the intensity of light beams through the exposure optical systems L1 to L13, especially the intensity of light beam in a region where the overlap exposure is carried out by the first exposure unit group and the second exposure unit group. The intensity sensor can move on the XY plane, and moves to a position where the light beam emitted from the exposure optical systems L1 to L13 can be measured, and the intensity sensor measures the intensity of light beam emitted from the exposure optical systems L1 to L13. The measurement result by the intensity sensor is output to the control device CONT1. The intensity sensor may be provided on the plate stage PST or can move independently from the plate stage PST.

Figure 15:
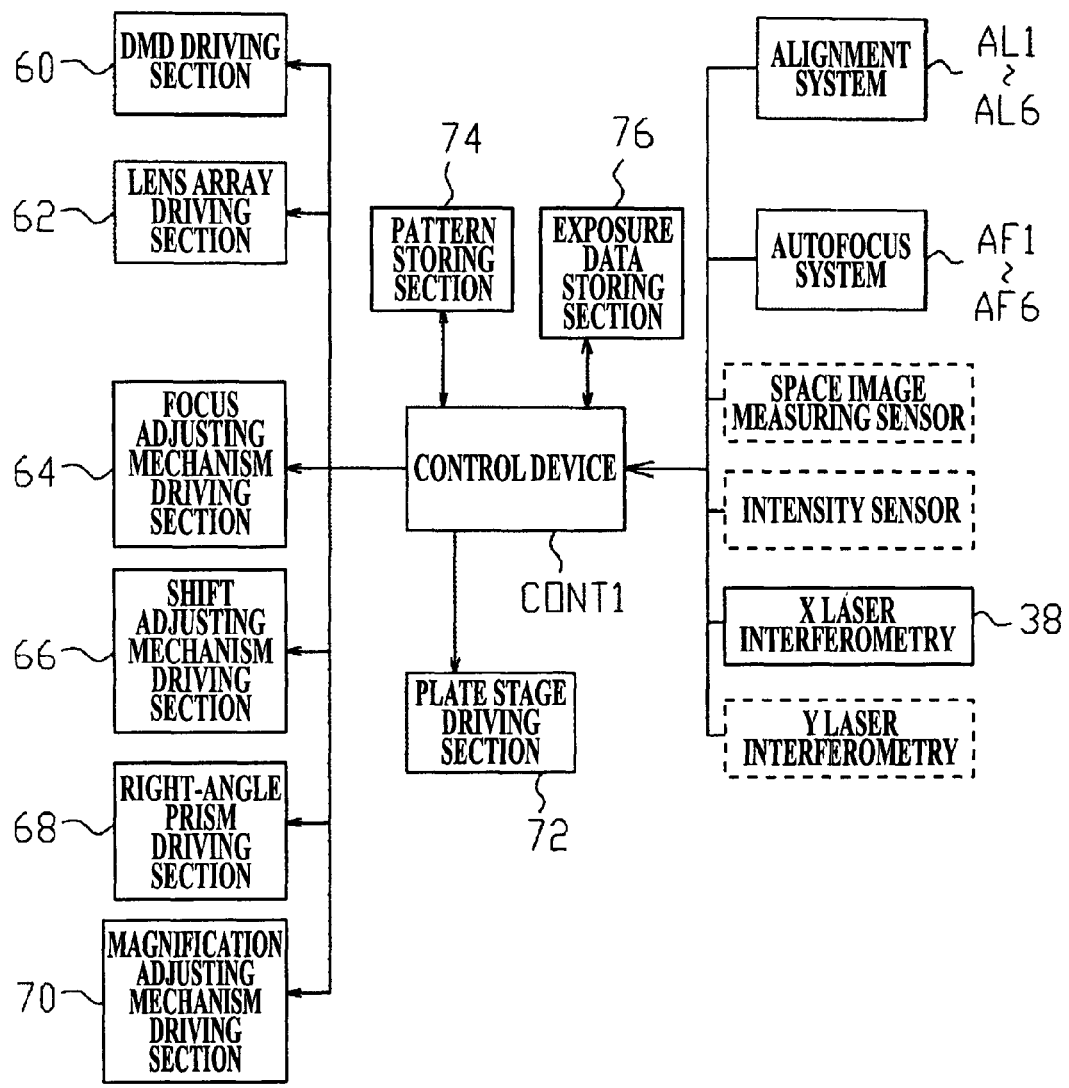
FIG. 15 is a block diagram showing a system structure of the scanning type exposure apparatus of the first embodiment of the invention.

FIG. 15 is a block diagram showing a system structure of the scanning type exposure apparatus of the embodiment. As shown in FIG. 15, the scanning type exposure apparatus includes the control device CONT1 which controls the action concerning the exposing processing in a centralized manner. A DMD driving section 60 for separately driving the micro-mirrors 8a of the DMD 8 of the exposure optical system L1 is connected to the control device CONT1. The DMD driving section 60 changes an angle of each micro-mirror 8a of the DMD 8 based on a control signal from the control device CONT1. Similarly, a DMD driving section (not shown) for separately driving the micro-mirrors of the DMD constituting the exposure optical systems L2 to L13 is connected to the control device CONT1. The DMD driving section changes an angle of each micro-mirror of the DMD based on a control signal from the control device CONT1.

A lens array driving section 62 for driving the microlens array 16 of the exposure optical system L1 is connected to the control device CONT1. The lens array driving section 62 moves the microlens array 16 in the XY plane or in the Z direction, and inclines the microlens array 16 with respect to the XY plane based on a control signal from the control device CONT1. Similarly, a lens array driving section for driving a microlens array constituting the exposure optical systems L2 to L13 is connected to the control device CONT1. The lens array driving section moves the microlens array on the XY plane or in the Z direction, and inclines the microlens array with respect to the XY plane based on a control signal from the control device CONT1.

A focus adjusting mechanism driving section 64 for driving the focus adjusting mechanism 20 of the projection optical module PL1, a shift adjusting mechanism driving section 66 for driving the shift adjusting mechanism 22, a right-angle prism driving section 68 for driving the right-angle prism 24, and a magnification adjusting mechanism driving section 70 for driving the magnification adjusting mechanism 30 are connected to the control device CONT1. The focus adjusting mechanism driving section 64, the shift adjusting mechanism driving section 66, the right-angle prism driving section 68 and the magnification adjusting mechanism driving section 70 drive the focus adjusting mechanism 20, the shift adjusting mechanism 22, the right-angle prism 24 and the magnification adjusting mechanism 30 based on control signals from the control device CONT1. Similarly, a focus adjusting mechanism driving section (not shown) for driving the focus adjusting mechanism constituting the projection optical modules PL2 to PL13, a shift adjusting mechanism driving section (not shown) for driving the shift adjusting mechanism, a right-angle prism driving section (not shown) for driving the right-angle prism, and a magnification adjusting mechanism driving section (not shown) for driving the magnification adjusting mechanism are connected to the control device CONT1. The focus adjusting mechanism driving section, the shift adjusting mechanism driving section, the right-angle prism driving section and the magnification adjusting mechanism driving section drive the focus adjusting mechanism, the shift adjusting mechanism, the right-angle prism and the magnification adjusting mechanism based on control signals from the control device CONT1.

A plate stage driving section 72 is connected to the control device CONT1. The plate stage driving section 72 moves the plate stage PST along the X direction which is the scanning direction, and finely moves the same in the Y direction. Further, the alignment systems AL1 to AL6, the autofocus systems AF1 to AF6, the space image measuring sensor, the intensity sensor, the X laser interferometry 38 and the Y laser interferometry are also connected to the control device CONT1. Further, the pattern storing section 74 is connected to the control device CONT1. The pattern storing section 74 stores a transfer pattern formed in the DMD 8, and a reference mark used for alignment and the space image measurement. The exposure data storing section 76 in which exposure data is stored is also connected to the control device CONT1.

In scanning type exposure apparatus of the embodiment, the micro-mirrors 8a of the DMD 8, the element lenses 16a of the microlens array 16, and the openings 18a of the point image field stop 18 are arranged two dimensionally within the XY plane in directions parallel to the X direction and Y direction. When scanning and exposing operations are carried out in a state where light beams which passed the openings 18a of the point image field stop 18 reach positions parallel to the X direction and Y direction, a line pattern which is parallel to the X direction can be formed but a line pattern which is parallel to the Y direction can not be formed. Therefore, to form a line pattern in parallel to the Y direction, the point image field stop 18 is rotated through a predetermined angle α around the Z-axis so that light beam which passed through the openings 18a of the rotated point image field stop 18 reach the plate P as shown in FIG. 16. As the point image field stop 18 rotates, the microlens array 16 is also rotated around the Z-axis through the predetermined angle α.

The control device CONT1 outputs a control signal to the lens array driving section 62, and rotates and drives the microlens array 16 through the lens array driving section 62 around the Z-axis. The control device CONT1 rotates and drives the point image field stop 18 around the Z-axis through a driving section (not shown) like the microlens array 16. The control device CONT1 outputs a control signal to the DMD driving section 60 and adjusts angles of the micro-mirrors 8a of the DMD 8 through the DMD driving section 60 such that the element lenses 16 of the microlens array 16 and the micro-mirrors 8a correspond to the openings 18a of the point image field stop 18. By rotating the microlens array 16 and the point image field stop 18, light beams which passed through the openings 18a of the point image field stop 18 are rotated through the predetermined angle α and reach the plate P. When the scanning and exposure operations are carried out in this state, line patterns which are in parallel to the X direction and Y direction can be formed.

The light beams which passed through the openings 18a of the point image field stop 18 may be rotated around the Z-axis through the predetermined angle and may reach the plate P by rotating the right-angle prism 24 around the Z-axis through the right-angle prism driving section 68. The embodiment has the openings 18a of the point image field stop 18 arranged two dimensionally in the directions which are in parallel to the X direction and Y direction in the XY plane, but the embodiment may includes opening of the point image field stop arranged two dimensionally in directions inclined with respect to the X direction and Y direction at an angle of 45°. In this case also, the light beams which passed through the openings of the point image field stop are rotated through the predetermined angle α around the Z-axis and reach the plate P as shown in FIG. 17.

The control device CONT1 rotates and drives a microlens array and a point image field stop of each of the exposure optical systems L2 to L13 around the Z-axis, and adjusts the angle of each micro-mirror of the DMD, or rotates and drives the right-angle prism around the Z-axis. With this, light beams which passed through the openings of the point image field stop are rotated around the Z-axis through the angle α and reach the plate P like the light beams which passed through the openings 18a of the point image field stop 18.

The shape of the projection region 48a formed by the exposure optical system L1 may be deformed instead of rotating the light beams which passed through the openings 18a of the point image field stop 18 around the Z-axis through the predetermined angle α. That is, only a line pattern which is in parallel to the X direction can be formed before deforming the projection region 48a. With this, even when a line pattern which is in parallel to the Y direction can not be formed, a line pattern which is in parallel to the X direction and Y direction can be formed after the projection region 48a is deformed. Next, the deforming method of the projection region 48a will be explained. Although the shape of the projection region 48a formed by the exposure optical system L1 is the trapezoid in the embodiment, the deforming method will be explained on the assumption that the projection region 48a is rectangular in shape to make the explanation easy.

Figure 18:
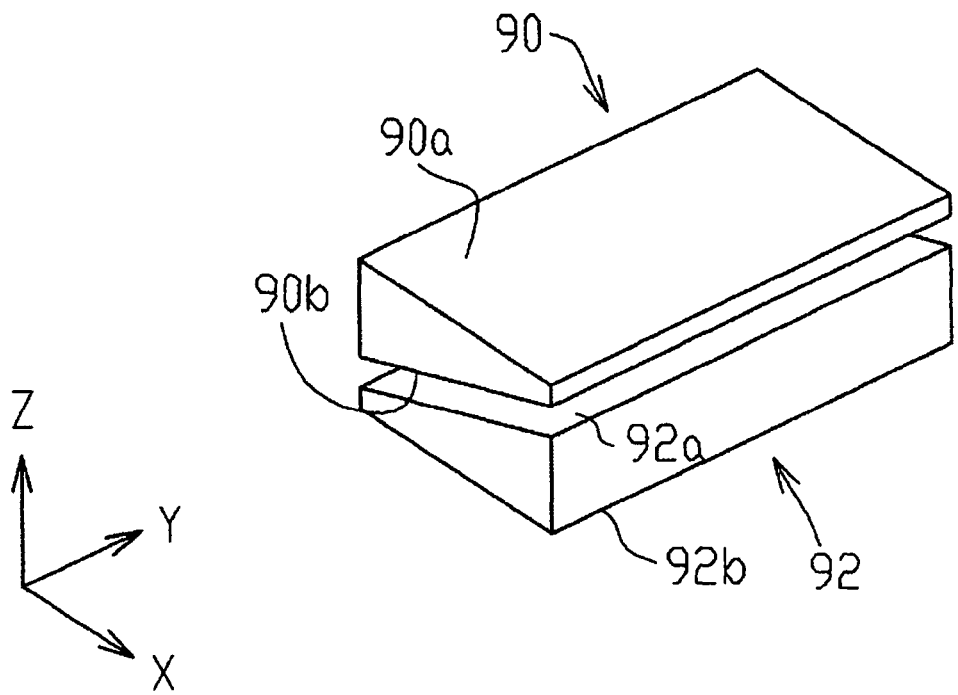
FIG. 18 is a diagram showing a structure of a wedge prism of the first embodiment of the invention.

FIG. 18 is a diagram showing structures of wedge prisms (correcting optical systems) 90 and 92 which deform the projection region 48a. The wedge prisms 90 and 92 are disposed in an optical path between the point image field stop 18 and the projection optical module PL1, or in an optical path between the projection optical module PL1 and the plate P. As shown in FIG. 18, the incident plane 90a and the emitting plane 90b of the wedge prism 90 have planes, and the incident plane 90a and the emitting plane 90b have predetermined wedge angles (first wedge angles, hereinafter). The wedge prism 90 is disposed such that a direction of a nodal line of the plane of the incident plane 90a and the plane of the emitting plane 90b is the Y direction. The wedge prism 90 can rotate around the X-axis and Y-axis.

The incident plane 92a of the emitting plane 92b of the wedge prism 92 have planes, and the incident plane 92a and the emitting plane 92b have the same wedge angle as the first wedge angle (second wedge angle, hereinafter). The wedge prism 92 is disposed such that a direction of a nodal line of the plane of the incident plane 92a and a plane of the emitting plane 92b is the Y direction, and the first wedge angle and the second wedge angle are oriented to substantially the opposite direction. The wedge prism 92 can rotate around the X-axis and Y-axis.

Figure 19:
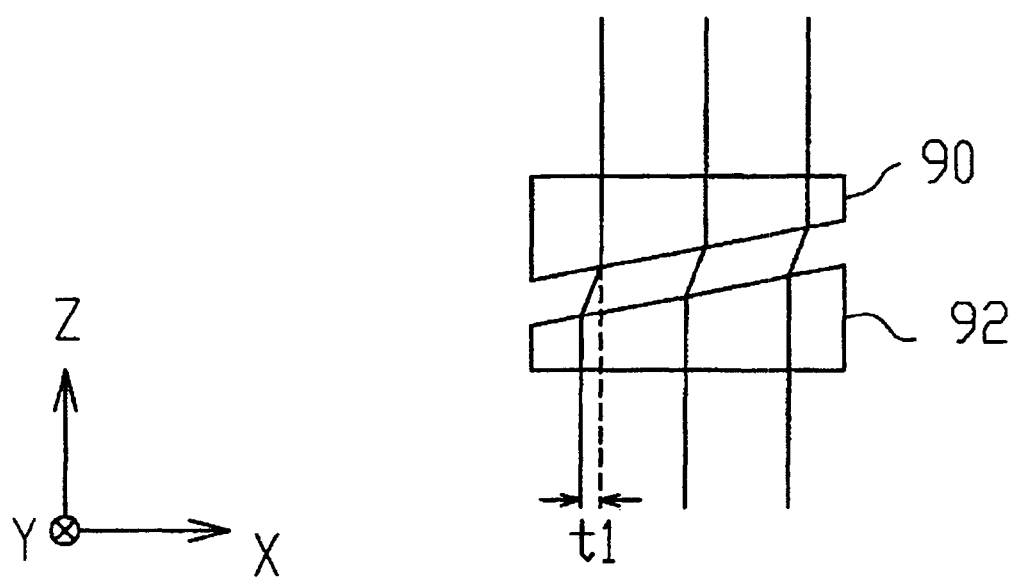
FIG. 19 is an explanatory diagram of a state when a wedge prism of the first embodiment of the invention rotates around the X-axis direction.
Figure 20:
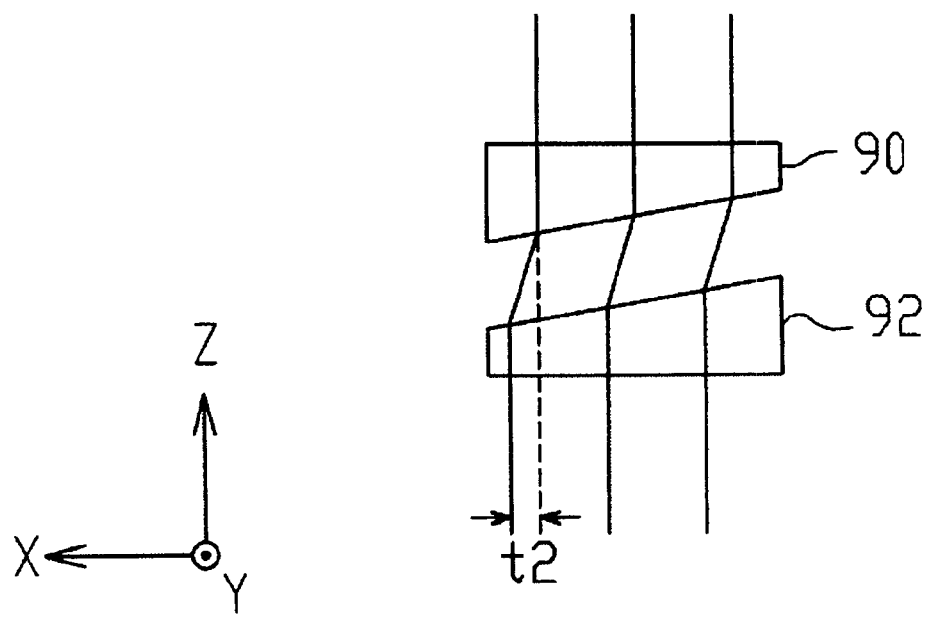
FIG. 20 is an explanatory diagram of the state when the wedge prism of the first embodiment of the invention rotates around the X-axis direction.

The projection magnification in the X direction can be adjusted by rotating at least one of the wedge prisms 90 and 92 around the Y-axis. The projection position in the X direction and Y direction of the projection optical module PL1 can be shifted by rotating at least one of the wedge prisms 90 and 92 around the X-axis. FIG. 19 shows positions of the wedge prisms 90 and 92 as viewed from −Y direction when the wedge prism 90 is finely rotated in the counterclockwise direction around the X-axis direction. FIG. 20 shows positions of the wedge prisms 90 and 92 as viewed from +Y direction. As shown in FIG. 19, the light beam passing closest to the −Y direction is t1 shifted in the X direction, and the light beam passing closest to the +Y direction is t2 shifted in the X direction.

Figure 21:
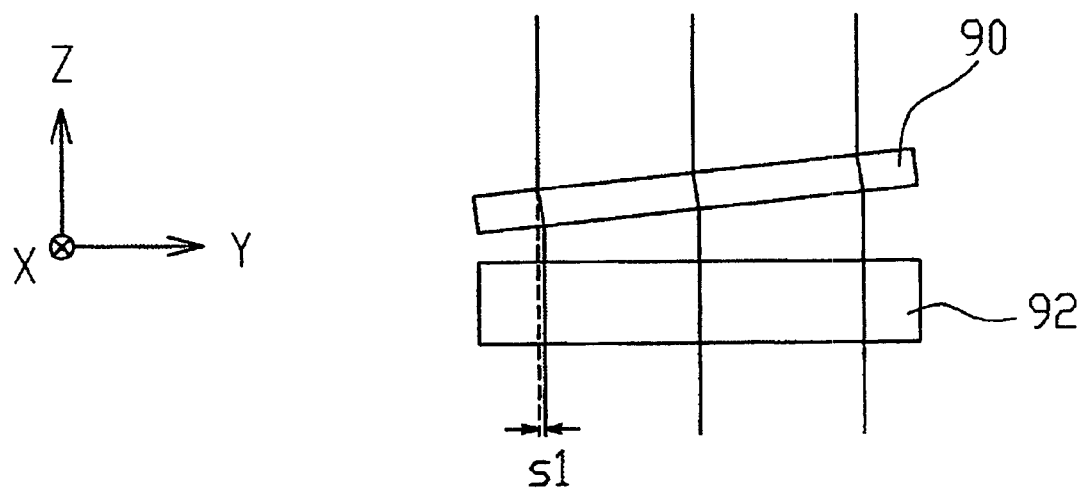
FIG. 21 is an explanatory diagram of the state when the wedge prism of the first embodiment of the invention rotates around the X-axis direction.
Figure 22:
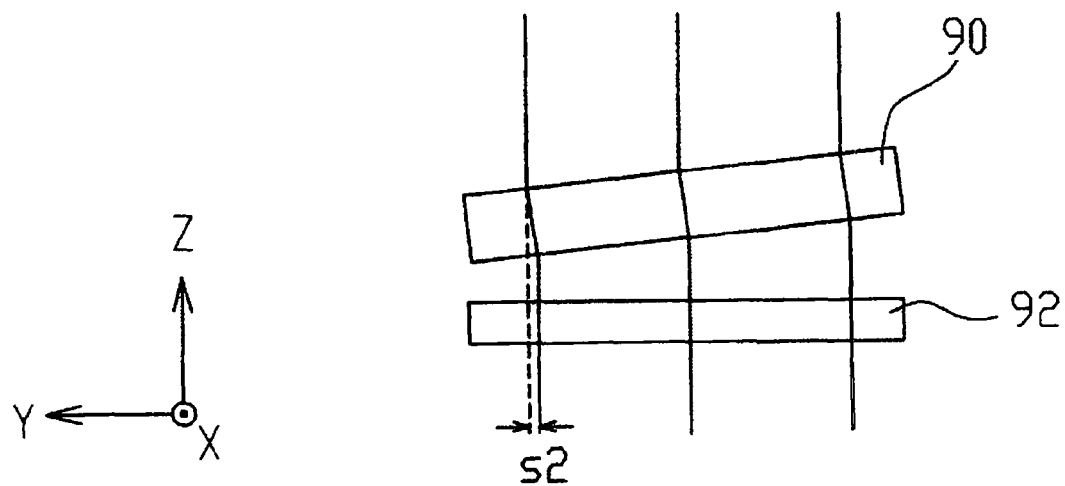
FIG. 22 is an explanatory diagram of the state when the wedge prism of the first embodiment of the invention rotates around the X-axis direction.

The projection position of the exposure optical system L1 in the X direction is also shifted by rotating the wedge prism 90 around the X-axis direction. FIG. 21 is a diagram showing positions of the wedge prisms 90 and 92 as viewed from the −X direction when the wedge prism 90 is finely rotated in the counterclockwise direction around the X-axis direction. FIG. 22 is a diagram showing positions of the wedge prisms 90 and 92 as viewed from the +X direction. As shown in FIG. 21, exposure light passing closest to the −X direction is s1 shifted in the Y direction, and as shown in FIG. 22, exposure light passing closest to the +X direction is S2 shifted in the Y direction.

Figure 23:
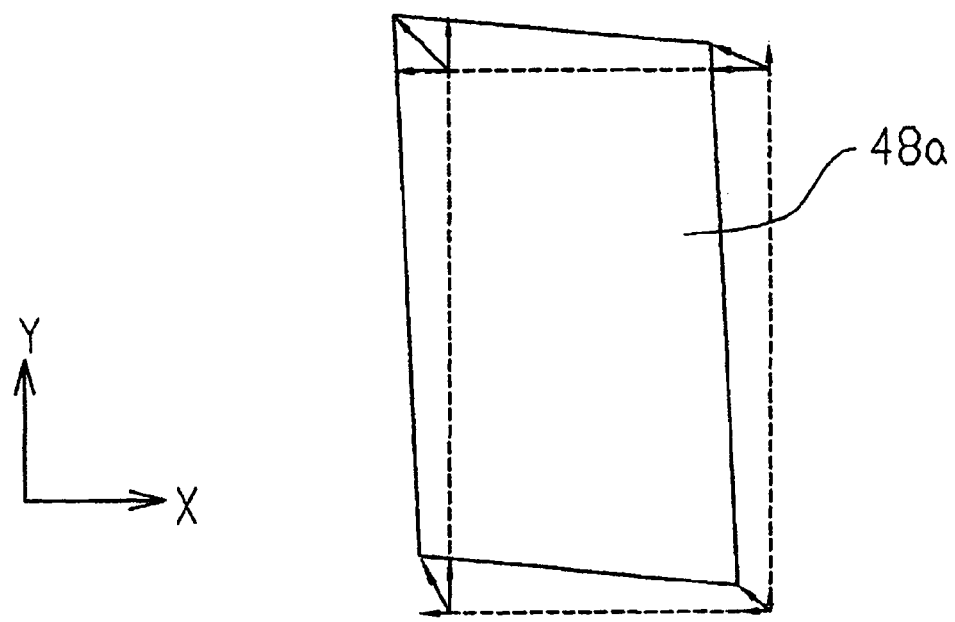
FIG. 23 is an explanatory diagram of the state when the wedge prism of the first embodiment of the invention rotates around the X-axis direction.

That is, when the shape of the projection region 48a formed on the plate P by the exposure optical system L1 when the wedge prism 90 is not rotated is the rectangular shape as shown with a broken line in FIG. 23, the projection region 48a formed on the plate P by the exposure optical system L1 when the projection region 48a is finely rotated in the counterclockwise direction around the X-axis direction becomes parallelogram in shape as shown with a solid line in FIG. 23. With this, the shape of the projection region 48a can be deformed, only a line pattern which is in parallel to the X direction can be formed before the projection region 48a is deformed, and also when a line pattern which is in parallel to the Y direction can not be formed, a line pattern which is parallel to the X direction and Y direction can be formed after the projection region 48a is deformed. Other projection regions 48b to 48m can be deformed by providing the exposure optical systems L2 to L13 with wedge prisms having the same structures as those of the wedge prisms 90 and 92.

Three wedge prisms may be provided. If the three wedge prisms are rotated and driven around the X-axis direction or Y-axis direction, a focus position of an image, rotation and magnification can be adjusted.

By rotating and driving the wedge prisms 90 and 92 around the X-axis direction or Y-axis direction, the position of a light beam reaching the opening 18a of the point image field stop 18 can finely be adjusted. At that time, the wedge prisms 90 and 92 are disposed on an optical path between the DMD 8 and the relay lens group 12a or in an optical path between the relay lens group 12c and the microlens array 16.

In this case, a position of a light beam reaching the point image field stop 18 can be adjusted in an analog fashion as compared with a case in which a position of a light beam reaching the point image field stop 18 is digitally adjusted by adjusting the exposure data of the DMD 8, and this is effective when a more fine pattern is to be formed.

Figure 24:
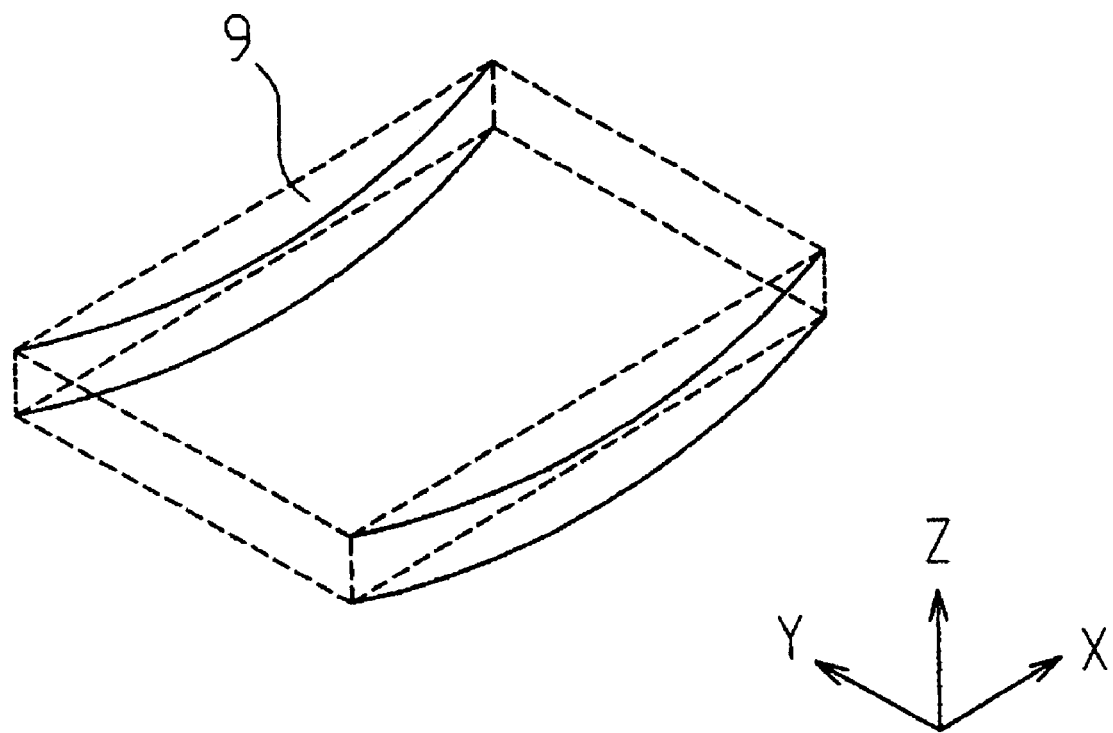
FIG. 24 is a diagram showing a modification of the surface plate of the first embodiment of the invention.
Figure 25:
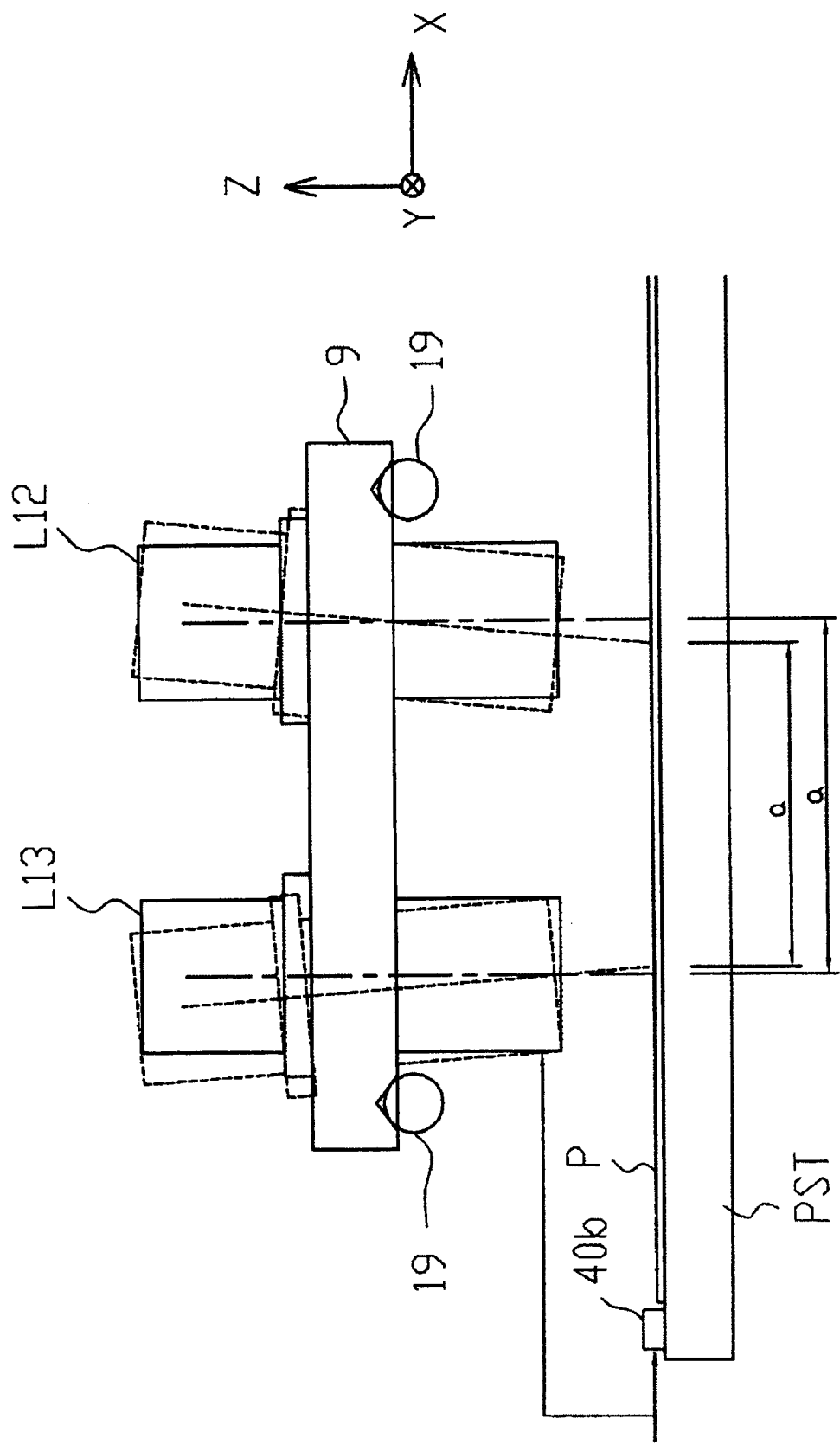
FIG. 25 is a diagram showing a state of the exposure optical systems when the surface plate of the first embodiment of the invention is deformed.

Next, a method for correcting a relative positional deviation between the first exposure unit group and the second exposure unit group will be explained. As shown in FIG. 24 for example, when the surface plate 9 is deformed from the shape shown with the broken lines in to the shape shown with the solid lines, the first exposure unit group and the second exposure unit group assume are shifted to positions shown with the broken lines from the positions shown with the solid lines in FIG. 25. That is, a relative positional deviation in the X direction between the first exposure unit group and the second exposure unit group is generated, and a deviation is generated in the X direction between an image projected onto the plate P by the first exposure unit group and an image projected onto the plate P by the second exposure unit group. The control device CONT1 detects a relative displacement amount in the X direction between the first exposure unit group and the second exposure unit group based on the distances X1 and X2 measured by the sensor C. That is, the control device CONT1 detects a translation amount (relative deviation amount in the X direction) between the first exposure unit group and the second exposure unit group.

Figure 26:
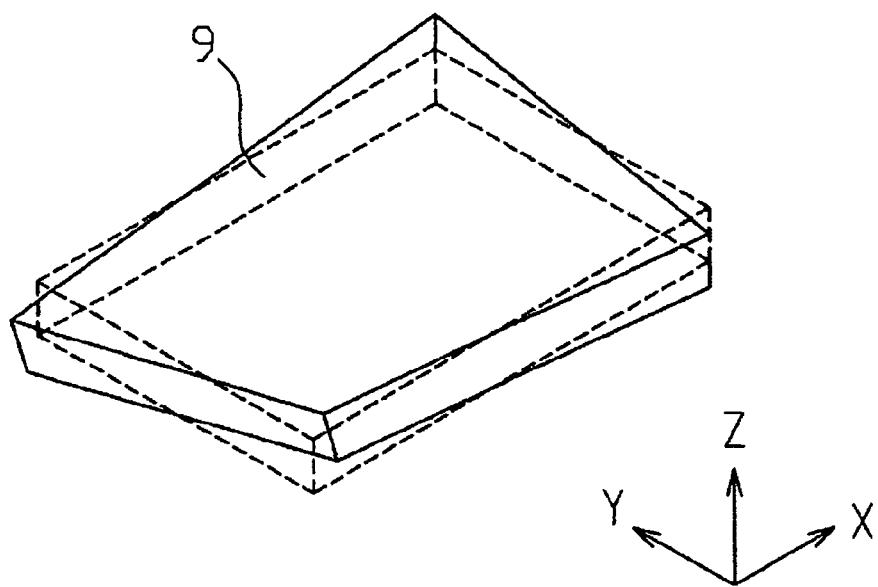
FIG. 26 is a diagram showing a modification of the surface plate of the first embodiment of the invention.

As shown in FIG. 26 for example, when the surface plate 9 is deformed from the shape shown with broken lines to a shape shown with solid lines, a relative deviation in the Y direction between the first exposure unit group and the second exposure unit group is generated. That is, a deviation in the Y direction between an image projected on the plate P by the first exposure unit group and an image projected on the plate P by the second exposure unit group is generated. The control device CONT1 detects a relative displacement amount between the first exposure unit group and the second exposure unit group based on the distances Y1 and Y2 measured by the sensor C. That is, a relative attitude difference (relative deviation amount in the Y direction) between the first exposure unit group and the second exposure unit group is detected.

The right-angle prism and the magnification adjusting mechanism as the focus adjusting mechanism, the shift adjusting mechanism and the rotation adjusting mechanism constituting the projection optical modules PL1 to PL13 function as correcting devices which correct at least one of the projection position of the first exposure unit group and a projection position of the second exposure unit group. By changing the exposure data of the DMDs respectively constituting the exposure optical systems L1 to L13, it is possible to correct at least one of positions (projection positions) of images formed by the first exposure unit group and the second exposure unit group. That is, the correcting device corrects at least one of rotations, shifts, magnifications and focus positions of images formed by the exposure optical systems L1 to L13 based on control signals from the control device CONT1.

That is, the control device CONT1 calculates an adjusting amount (correcting amount) of exposure data of DMDs constituting the exposure optical systems L1 to L13, or an adjusting amount (driving amount) of the focus adjusting mechanism, the shift adjusting mechanism, the rotation adjusting mechanism, and the magnification adjusting mechanism, from a relative displacement amount between the first exposure unit group and the second exposure unit group (displacement therebetween) detected based on the four distances X1, X2, Y1 and Y2 measured by the sensor C. The control device CONT1 outputs a control signal including information of the calculated adjusting amount (correcting amount or driving amount) to a DMD driving section constituting each of the exposure optical systems L1, L3, L5, L7, L9, L11 and L13, the focus adjusting mechanism driving section constituting each of the projection optical modules PL1 to PL13, the shift adjusting mechanism driving section, the right-angle prism driving section, and the magnification adjusting mechanism driving section. The DMD driving section constituting each of the exposure optical systems L1 to L13, the focus adjusting mechanism driving section, the shift adjusting mechanism driving section, the right-angle prism driving section and the magnification adjusting mechanism driving section constituting each of the projection optical modules PL1 to PL13 drive the micro-mirror of the DMD constituting each of the exposure optical systems L1 to L13, the focus adjusting mechanism constituting each of the projection optical modules PL1 to PL13, the shift adjusting mechanism, the right-angle prism (rotation adjusting mechanism) and the magnification adjusting mechanism based on a control signal including information of the adjusting amount (correcting amount or driving amount). With this, the projection regions 48a to 48m on the plate P of a transfer pattern by the first exposure unit group and the second exposure unit group are corrected.

The control device CONT1 calculates an adjusting amount (driving amount) of at least one of the DMD constituting each of the exposure optical systems L1 to L13, the focus adjusting mechanism constituting each of the projection optical modules PL1 to PL13, the shift adjusting mechanism, the rotation adjusting mechanism and the magnification adjusting mechanism, and the control device CONT1 corrects the deviation of the projection regions 48a to 48m of the first exposure unit group or the second exposure unit group.

Here, since the four distances X1, X2, Y1 and Y2 measured by the sensor C are relative displacement amounts between the first exposure unit group and the second exposure unit group, a deviation amount of the projection position of the first exposure unit group and a deviation amount of the projection position of the second exposure unit group can not independently be detected. Therefore, the control device CONT1 may independently calculate the deviation amount of the projection position of the first exposure unit group and the deviation amount of the projection position of the second exposure unit group based on the position of the plate stage PST measured by the laser interferometry system and based on the four distances X1, X2, Y1 and Y2 measured by the sensor C. That is, the control device CONT1 detects the projection position of the second exposure unit group based on the position of the plate stage PST measured by the laser interferometry system. Next, the control device CONT1 detects the projection position of the first exposure unit group based on the detected projection position of the second exposure unit group and based on the four distances X1, X2, Y1 and Y2 measured by the sensor C.

The control device CONT1 can detect the entire displacement of the exposure optical systems L1 to L13 based on the position of the plate stage PST measured by the laser interferometry system. Further, the control device CONT1 can detect the displacements of the exposure optical systems L1 to L13 based on the four distances X1, X2, Y1 and Y2 measured by the sensor C.

The control device CONT1 calculates an adjusting amount (driving amount) of at least one of the DMD, the focus adjusting mechanism, the shift adjusting mechanism, the rotation adjusting mechanism and the magnification adjusting mechanism in at least one of the exposure optical systems L1, L3, L5, L7, L9, L11 and L13 constituting the first exposure unit group based on the detected projection position of the first exposure unit group. Further, the control device CONT1 calculates an adjusting amount (driving amount) of at least one of the DMD, the focus adjusting mechanism, the shift adjusting mechanism, the rotation adjusting mechanism and the magnification adjusting mechanism in at least one of the exposure optical systems L2, L4, L6, L8, L10 and L12 constituting the second exposure unit group based on the detected projection position of the second exposure unit group. Then, the correction is carried out by driving the focus adjusting mechanism the shift adjusting mechanism, the rotation adjusting mechanism and the magnification adjusting mechanism of the projection optical modules PL1 to PL13 based on the adjusting amount for correcting the calculated projection position of first exposure unit group and the adjusting amount for correcting the projection position of the second exposure unit group.

The control device CONT1 can also correct the projection position of the second exposure unit group (or first exposure unit group) using the projection position of the first exposure unit group (or second exposure unit group) as a reference (fixed). In this case, the deviation amount of the projection position of the first exposure unit group and the deviation amount of the projection position of the second exposure unit group are not independently calculated, but since the relative deviation amount between the projection position of the first exposure unit group and the projection position of the second exposure unit group can be corrected, joints between the projection position of the first exposure unit group and the projection position of the second exposure unit group can precisely match with each other.

The control device CONT1 may calculate an adjusting amount for correcting the projection position of the first exposure unit group and an adjusting amount for correcting the projection position of the second exposure unit group which is the same as the adjusting amount for correcting the projection position of the first exposure unit group based on the relative displacement amount between the first exposure unit group and second exposure unit group detected based on the four distances X1, X2, Y1 and Y2 measured by the sensor C. That is, one half of the adjusting amount calculated based on the relative displacement amount between the first exposure unit group and the second exposure unit group is used as the adjusting amounts of the first exposure unit group. In this case, the deviation amount of the projection position of the first exposure unit group and the deviation amount of the projection position of the second exposure unit group are not separately calculated, but since the relative deviation amount between the projection position of the first exposure unit group and the projection position of the second exposure unit group can be corrected, joints between the projection position of the first exposure unit group and the projection position of the second exposure unit group can precisely match with each other.

As explained above, the plurality of exposure optical systems L1 to L13 are supported by the one surface plate 9. With this, even if a distortion deformation is generated in the column 1, the influence of the distortion deformation of the column 1 on the exposure optical systems L1 to L13 can be suppressed to a small level. Since the plurality of exposure optical systems L1 to L13 are supported by the one surface plate 9, even if a distortion deformation is generated in the column 1, the displacement in the relative positions of the exposure optical systems L1 to L13 can be suppressed to s low level. Thus, the displacement in image forming property (optical performance) of the exposure optical systems L1 to L13 can be suppressed to a small level.

The sensor can measure the relative four distances of the first exposure unit group and the second exposure unit group, and based on the measurement result, the sensor can detect the relative displacement amount between the first exposure unit group and the second exposure unit group, i.e., the displacement amount in the relative position between the first exposure unit group and the second exposure unit group which can not be suppressed by a support section constituting the kinematic support structure. Since the projection position of the pattern generated by the variable forming mask based on the detection result on the plate P can be corrected by the correcting device, the deviation between the projection position of the first exposure unit group and the projection position of the second exposure unit group can be corrected. Therefore, even if the projection position is deviated due to deformation of the surface plate or column on which the first exposure unit group and second exposure unit group are placed, the deviation in the projection position can be corrected. Thus, joints between the projection position of the first exposure unit group and the projection position of the second exposure unit group can precisely match with each other, and the precise exposure operation can be carried out.

Although the sensor C is disposed on the side of the projection optical modules PL12 and PL13 (Y direction) in this embodiment, the sensor C may be disposed on the side of the projection optical modules PL1 and PL2 (+Y direction). Although the sensor C is disposed on a lower side of the surface plate 9 (−Z direction), it may be disposed on an upper side of the surface plate 9 (+Z direction).

Although the sensor C measures the two distances X1 and X2 in the X direction and two distances Y1 and Y2 in the Y direction in the embodiment, one or more distances in one of X direction and Y direction may be measured.

In the embodiment, the deviation between the projection position of the first exposure unit group and the projection position of the second exposure unit group is corrected by the correcting device (at least one of the DMD, the focus adjusting mechanism, the shift adjusting mechanism, the rotation adjusting mechanism and the magnification adjusting mechanism). Alternatively, the deviation between the projection position of the first exposure unit group and the projection position of the second exposure unit group may be corrected by controlling the attitude of the plate stage PST on which the plate P is placed as the correcting device. That is, it is possible to correct the deviation between the projection position of the first exposure unit group and the projection position of the second exposure unit group by adjusting the position of the plate stage PST.

The deviation between the projection position of the first exposure unit group and the projection position of the second exposure unit group is corrected based on the measurement result of the sensor C, but it is also possible to correct the deviation between the projection position of the first exposure unit group and the projection position of the second exposure unit group without providing the sensor C. For example, when it is possible to previously reproduce a deformation of the surface plate 9 based on a predetermined temperature (temperature in the exposure apparatus) or elapsed time, an adjusting amount of the deviation between the projection position of the first exposure unit group and the projection position of the second exposure unit group based on the deformation of the surface plate 9 is stored in the exposure data storing section 76. When the temperature becomes equal to the predetermined temperature or predetermined time is elapsed, the control device CONT1 adjusts the deviation between the projection position of the first exposure unit group and the projection position of the second exposure unit group based on the adjusting amount stored in the exposure data storing section 76. When the exposure apparatus shown in FIG. 1 has such a body structure that a distortion is generated in the surface plate 9 due to movement of the plate stage PST, i.e., a relative positional deviation is generated between the first exposure unit group and the second exposure unit group, information concerning a deformation (distortion) of the surface plate 9, information concerning deviation between the projection position of the first exposure unit group and the projection position of the second exposure unit group, or an adjusting amount of the positional deviation are previously obtained and they are stored in the exposure data storing section 76 in correspondence with information concerning the movement of the plate stage PST (including at least one of position and acceleration as one example) in combination of the temperature or the elapsed time or independent from the temperature or elapsed time. Then, the relative positional deviation of the projected image between the first exposure unit group and the second exposure unit group may be corrected by the correcting device based on information stored in the exposure data storing section 76 in correspondence with measurement information (or command value concerning driving of the plate stage PST) concerning movement of the plate stage PST.

The DMD as the correcting device is used as a roughly-correcting device, and the focus adjusting mechanism, the shift adjusting mechanism, the rotation adjusting mechanism and the magnification adjusting mechanism as correcting devices are used as finely-correcting devices, and the correction may be carried out while using them in association with each other. Further, the focus adjusting mechanism, the shift adjusting mechanism, the rotation adjusting mechanism and the magnification adjusting mechanism are correcting devices may be used as roughly-correcting devices, and the DMD as the correcting device may be finely-correcting device, and the correction may be carried out using them in association with each other.

A deviation between the projection position of the first exposure unit group and the projection position of the second exposure unit group is corrected always, or at the time of calibration or at the time of exposing operation of the exposure optical system by the DMD, the focus adjusting mechanism, the shift adjusting mechanism, the rotation adjusting mechanism and the magnification adjusting mechanism as the correcting devices.

In this exposure method, intensity (exposure amount) of light beams passing through the exposure optical systems L1 to L13, especially intensity of light beams reaching the joint of the adjacent exposure optical systems is measured, and based on the measurement result, intensity (exposure amount) of light beams reaching the joint can be adjusted. That is, among light beams which reach a joint between the projection region 48a formed by the exposure optical system L1 and the projection region 48b formed by the exposure optical system L2, intensity of the light beams passing through the exposure optical system L1, and intensity of the light beams passing through the exposure optical system L2 are measured by the intensity sensor. More specifically, the control device CONT1 moves the intensity sensor to a position where intensity of light beams which pass through the exposure optical system L1 and reach the joint between the projection region 48a and the projection region 48b. The intensity sensor outputs the measurement result to the control device CONT1.

The control device CONT1 moves the intensity sensor to a position where intensity of light beams which pass through the exposure optical system L2 and reach the joint between the projection region 48a and the projection region 48b. The intensity sensor outputs the measurement result to the control device CONT1. The control device CONT1 compares, with each other, intensity of light beams which passed through the exposure optical system L1 and intensity of light beams which passed the exposure optical system L2 as measured by the intensity sensor. When the difference between the intensity of light beams which passed through the exposure optical system L1 and the intensity of light beams which passed the exposure optical system L2 is great, a line width precision with respect to the exposure amount in the joint between the projection region 48a and the projection region 48b is deteriorated. Therefore, the control device CONT1 adjusts voltage of a light source (not shown) so that intensity of light beams passing through the exposure optical system L1 and intensity of light beams passing through the exposure optical system L2 become substantially equal to each other.

The control device CONT1 measures intensity of light beams reaching another joint by means of the intensity sensor, and adjust the intensity of the light beams based on the measurement result. It is preferable that the intensity (exposure amount) of the light beams is adjusted when a position of a pattern image is corrected by at least one of the plurality of exposure optical systems L1 to L13. Although the embodiment has one intensity sensor which can move within the XY plane, a plurality of intensity sensors may be provided. The intensity sensor of the embodiment measures intensity of a single beam spot of a light beam. Instead of this structure, the intensity sensor may measure intensity of light beams divided into predetermined units (e.g., intensity of light beams reaching one or more projection regions, intensity of light beams reaching regions obtained by dividing one projection region).

It is preferable that an influence of a distortion of joints between the projection regions 48a to 48m formed by the exposure optical systems L1 to L13 and an influence of a distortion of a portion which is not the joint are equal to each other. More specifically, a pattern is formed by the DMD such that a transfer pattern of a joint on the side of the first exposure unit group and a transfer pattern of a joint on the side of the second exposure unit group are not deviated and dispersed substrate equally. At that time, concerning the length of the transfer pattern in the scanning direction, the aggregated length of the joints is the same as a length of the portion which is not the joint.

When a pattern formed by the variable forming mask is formed on the plate, if the plate stage on which the plate is placed is moved, a running error of the plate sage or deformation of the column which supports the exposure optical system may be generated and as a result, a relative positional error may be generated between the first exposure unit and the seu and a positional error may be generated in the pattern on the plate in some cases. In such a case, a trial exposing operation is carried out, and an arrangement error of the pattern caused by the running error of the plate stage or the like is measured. Using this measured value, a correction table for directly correcting the position of each projected image is prepared, the correction table in each position of the plate is prepared, and correction of position of an image may be carried out sequentially. The apparatus may have a correction value of each scanning direction. In this embodiment, the exposure of the plate is completed with one scanning operation, but a step-and scanning method in which the plate stage is moved in a step manner during a plurality of scanning and exposing operations may be used. The plate stage is scanned with respect to the exposure optical system, the exposure optical system may be scanned with respect to the plate of course. At that time, it is considered that the apparatus is deformed due to movement of the exposure optical system, and a position correction value of an image of each exposure position of the plate may be set.

According to the scanning type projection exposure apparatus of the embodiment, since a transfer pattern formed by the DMD in synchronization with the scanning operation of the plate stage can be varied, a desired pattern can easily be produced. Further, it is unnecessary to prepare a mask stage which was necessary when a mask on which a transfer pattern is formed is used, and cost and size of the exposure apparatus can be reduced. According to the scanning type projection exposure apparatus, since the exposure optical system can correct a position of an image of the transfer pattern, an image of a transfer pattern formed by the DMD can precisely be projected and exposed.

According to the scanning type exposure apparatus of the embodiment, a position of at least one image of the plurality of images formed by the plurality of exposure optical systems L1 to L13 can be corrected such that displacements of the plurality of exposure optical systems L1 to L13 are compensated. Therefore, a positional deviation of an image formed by adjacent exposure optical system can be corrected. Thus, even when a positional deviation of an image is generated due to deformation of the like of a member which supports the plurality of exposure optical systems L1 to L13, joints of adjacent exposure optical systems can precisely match with each other, and a predetermined pattern formed by the DMD 8 on the plate P can precisely be exposed.

According to the scanning type exposure apparatus of the embodiment, intensity of light beams passing through the exposure optical systems L1 to L13 is measured by the intensity sensor, and intensity of a light beam passing through at least one of the exposure optical systems L1 to L13 is adjusted based on the measurement result. Therefore, it is possible to correct a difference of intensity of light beams of adjacent exposure optical systems. Thus, even when a difference is generated in intensity of light beams passing through adjacent exposure optical systems, the difference in intensity of the light beams can be corrected, a joint of adjacent exposure optical systems can excellently be exposed, and a predetermined pattern formed on the plate P by the DMD 8 can precisely be exposed.

Although a relative relation between the first exposure unit group and the second exposure unit group is changed in this embodiment, each exposure optical constituting each unit group may be provided with a sensor for detecting a position, a position and an attitude of each exposure optical system may be measured, and the correcting device may be controlled such that a position of an image is corrected in accordance with the measurement result.

Figure 27:
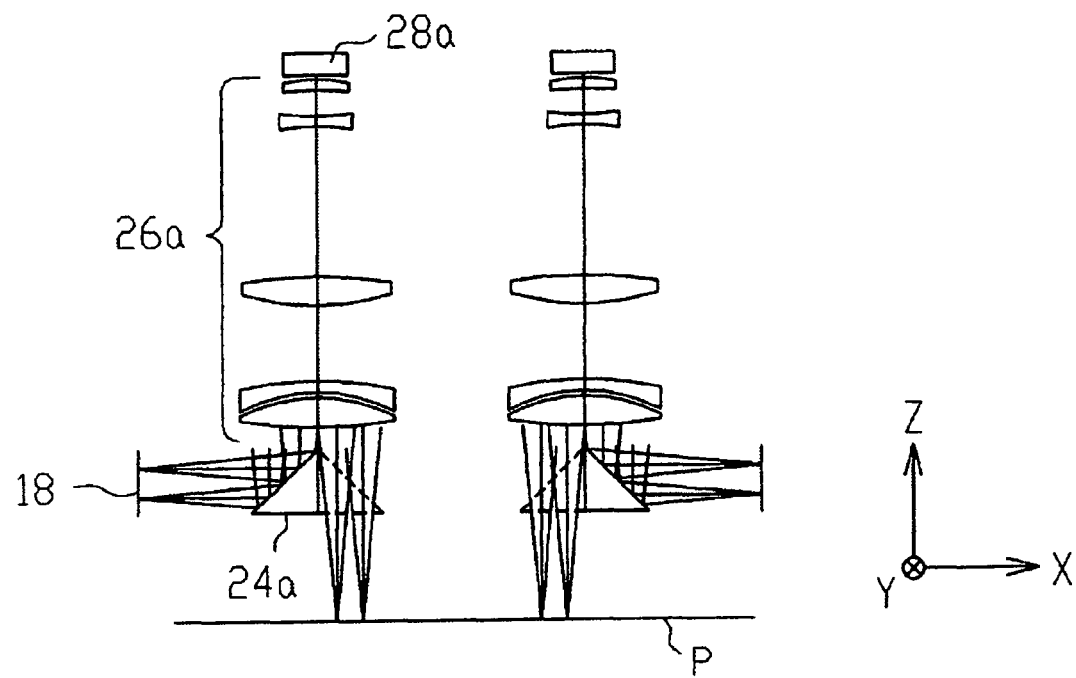
FIG. 27 is a diagram showing a structure of another projection optical module of the first embodiment of the invention.
Figure 28:
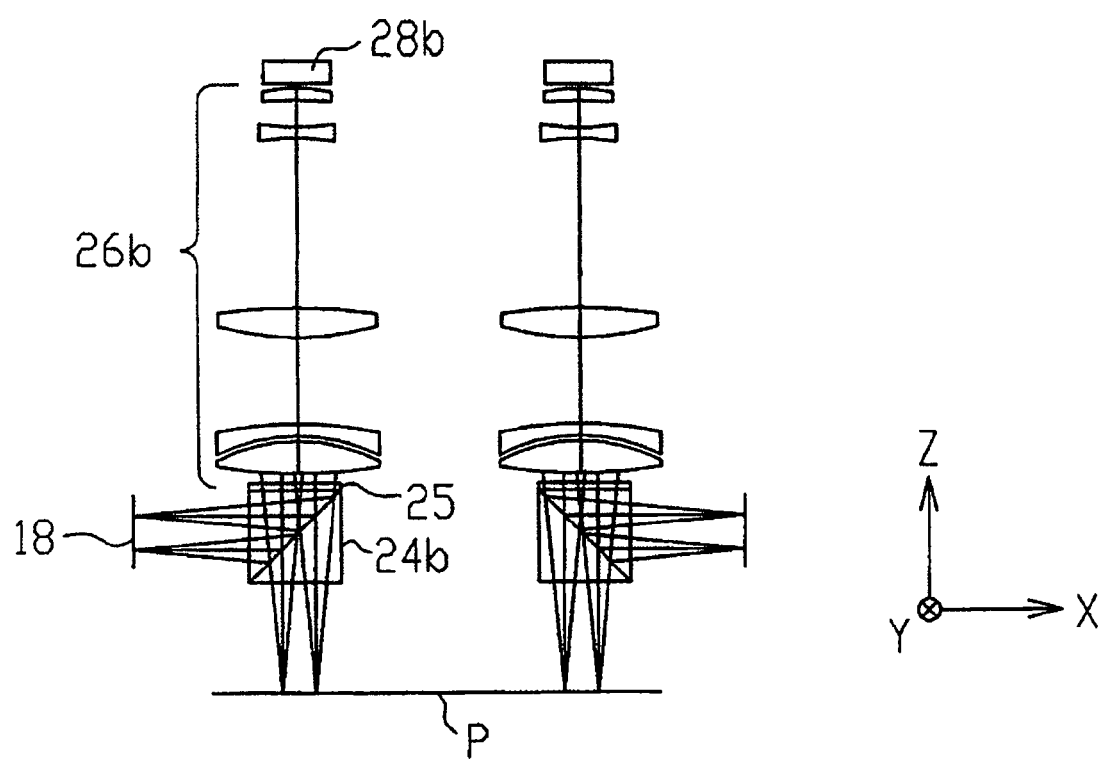
FIG. 28 is a diagram showing a structure of another projection optical module of the first embodiment of the invention.

Although the scanning type exposure apparatus of the embodiment includes the projection optical module as shown in FIG. 6, the scanning type exposure apparatus may includes a projection optical module having a structure as shown in FIG. 27 or 28. The projection optical module shown in FIG. 27 comprises a prism 24a, a lens group 26a and a mirror 28a. The projection optical module shown in FIG. 28 comprises a beam splitter 24b, a ¼ wavelength plate 25, a lens group 26b and a mirror 28b.

Figure 29:
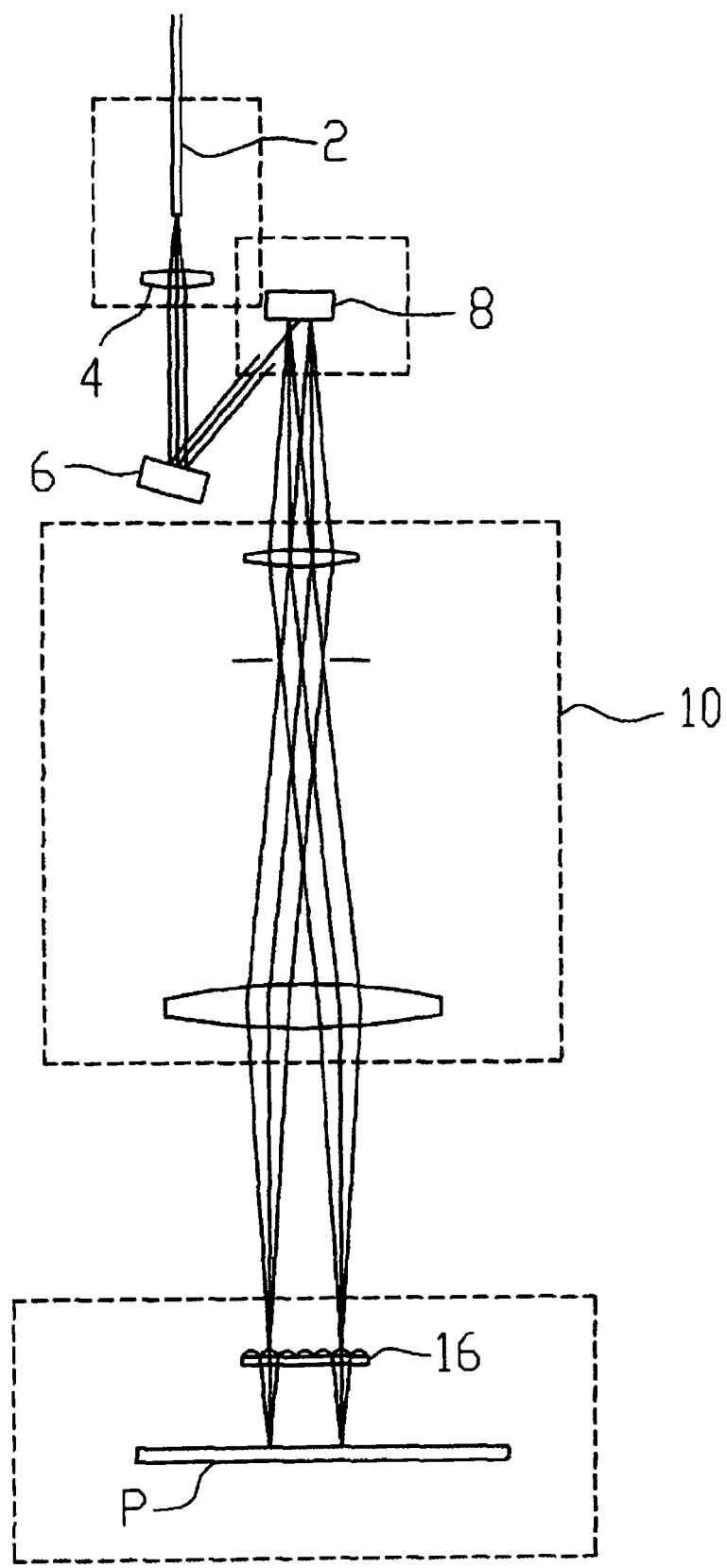
FIG. 29 is a diagram showing a structure of another exposure optical system of the first embodiment of the invention.

In the scanning type exposure apparatus of the embodiment, a pattern image is formed on the plate P by light beams passing through the point image field stop 18 and the projection optical modules PL1 to PL13. Instead of this structure, a pattern image may be formed on the plate P by a light beam passing through the microlens array 16 as shown in FIG. 29. That is, the point image field stop and projection optical module may not be provided. In this case, the apparatus body can be made compact and inexpensively.

Figure 30A:
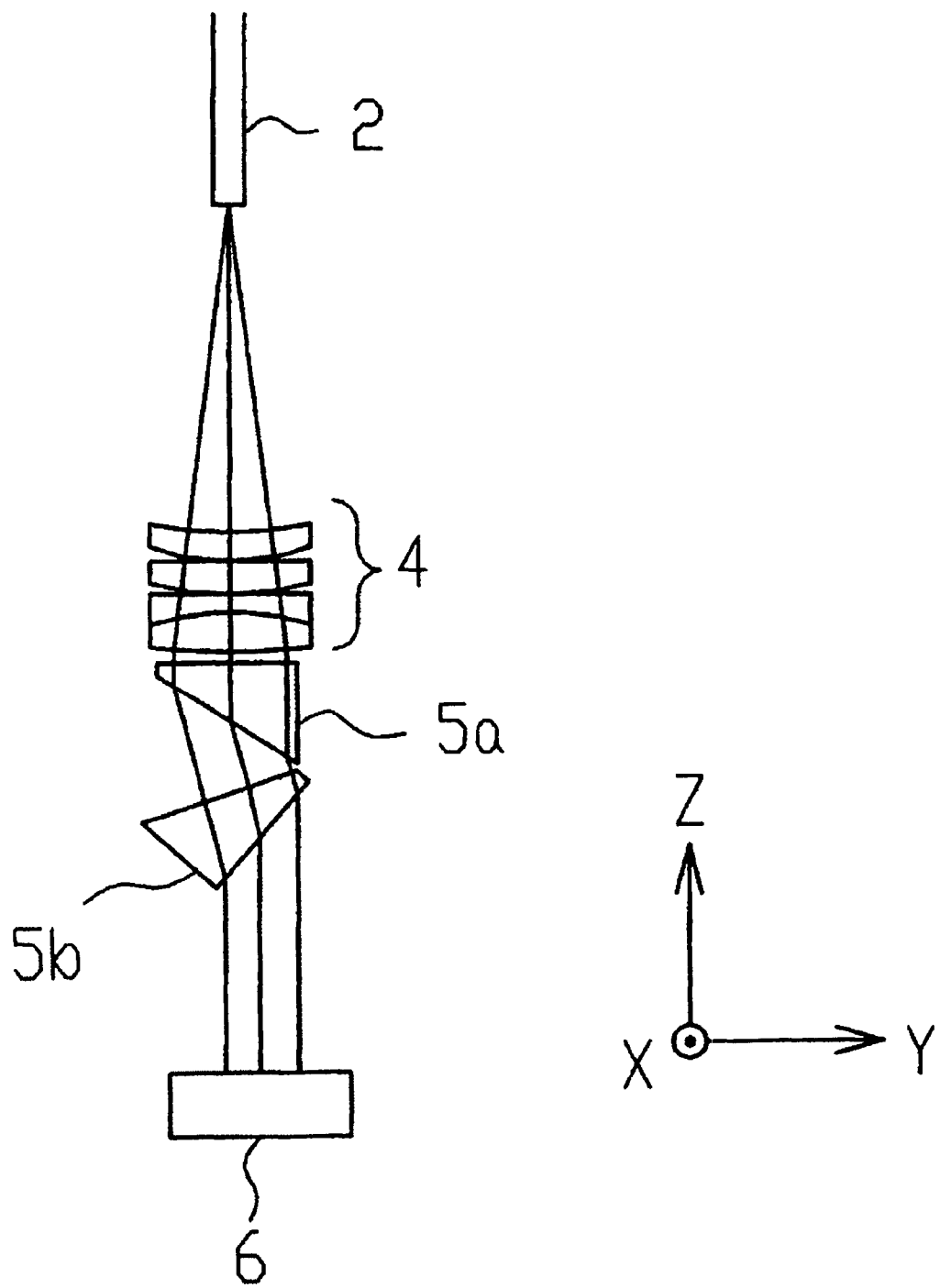
FIG. 30A is a diagram showing a structure of another exposure optical system of the first embodiment of the invention.
Figure 30B:
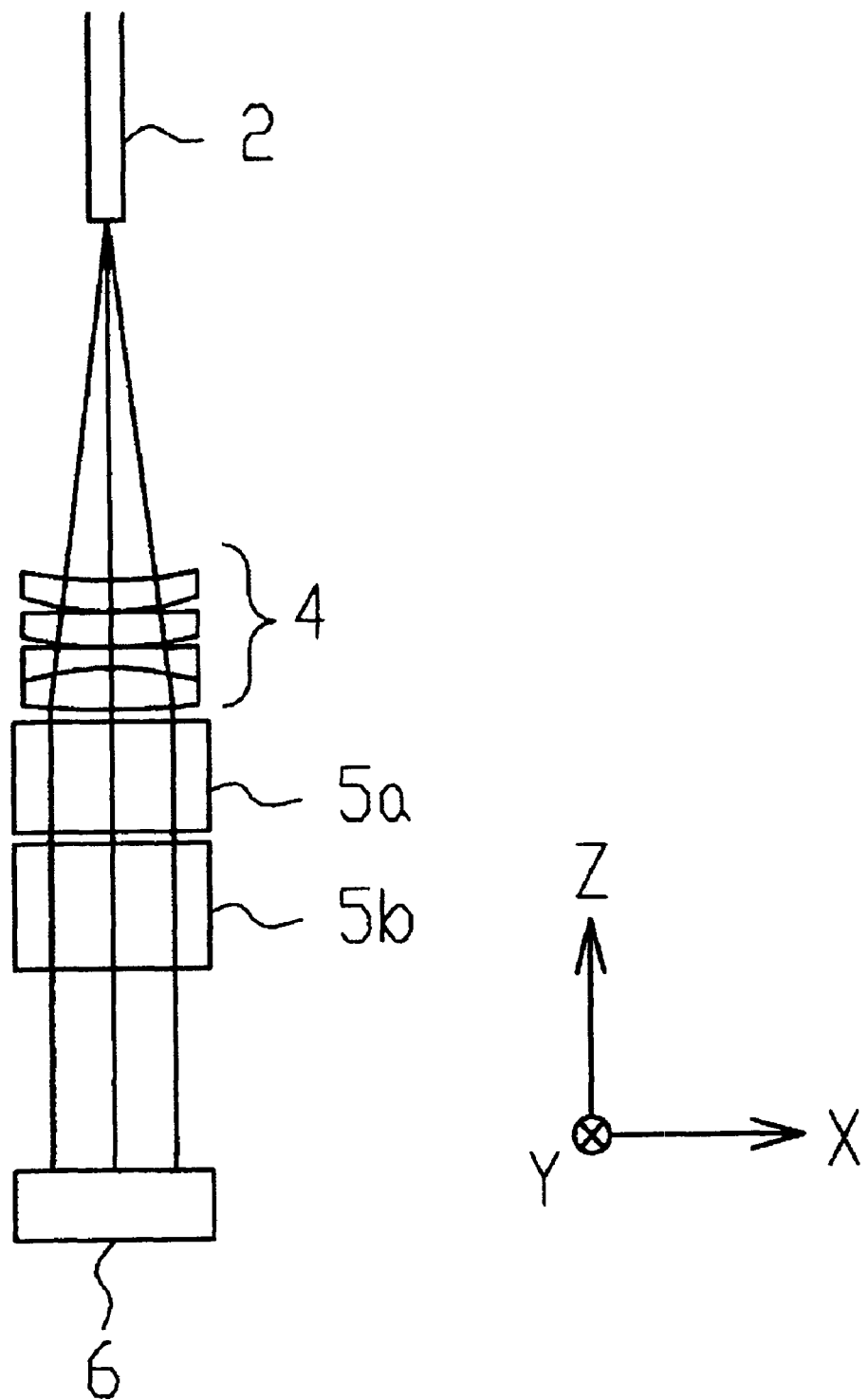
FIG. 30B is a diagram showing the structure of other exposure optical system of the first embodiment of the invention.

In this embodiment, a light beam which is emitted from the emitting end of the fiber and which has a substrate square luminous flux cross section shape is projected onto the DMD. In stead of this structure, prisms 5a and 5b as shown in FIGS. 30a and 30b may be inserted into an optical path between the collimate optical system 4 and the mirror 6 (or DMD 8) to shape the luminous flux cross section into the same rectangular shape as that of the DMD 8 (micro-mirror), and it may be projected onto the DMD 8. In this case, as compared with a case in which a square luminous flux is projected onto a rectangular DMD 8 shown in FIG. 3, light beams can be used without wasting the same.

Although the exposure optical system which holds all of the optical members (constituent elements) integrally is disposed on the surface plate 9 in this embodiment, a portion of the exposure optical system (e.g., including at least the projection optical module) may be disposed on the surface plate 9 and the remaining portion of the exposure optical system may be provided on a pedestal (column, frame or the like) that is different from the surface plate 9. An arbitrary pattern is formed on the plate P by the DMD 8 and the point image field stop 18 in this embodiment, but a pattern may be formed only by the DMD without providing the point image field stop. In this embodiment, the DMD in which an angle of the micromirror is controlled based on electronic data (exposure data) of a pattern to be formed on the substrate is used as the variable forming mask (electronic mask), but it is also possible use a non-luminous type image display element (also called spatial light modulator) other than the DMD which is an element for spatially modulating amplitude, phase or polarizing state of light. The exposure optical system of the embodiment is not limited to the structure shown in FIG. 2 and may have arbitrary structure. For example, self-luminous type image display element may be used instead of the DMD. In this case, since it is only necessary to dispose the self-luminous type image display element which is substantially conjugated with a substrate (plate) with respect to the projection optical module, the exposure optical system only has the self-luminous type image display element and the projection optical module. Examples of the self-luminous type image display element are a solid light source chip having a plurality of luminous points, a solid light source chip array having an array of a plurality of chips, a solid light source array (e.g., LED (light emitting diode) display in which a plurality of luminous points are incorporated in one substrate, an OLED (organic light emitting diode) display, an LD (laser diode) display.

According to the scanning type exposure apparatus of the first embodiment, it is possible to correct a position of at least one image of a plurality of images formed by a plurality of optical units such that displacement of a plurality of optical units arranged in parallel (all of the exposure optical systems L1 to L13 (2, 4, 6, 8, 10, 16, 18, PL1 to PL13 and the like) or some of them (e.g., projection optical modules PL1 to PL13) is compensated. Therefore, a positional deviation of an image formed by adjacent optical units can be corrected. Thus, even when a positional deviation is generated in an image due to deformation of a member which supports a plurality of optical units, joints of adjacent optical units can precisely match with each other, and a predetermined pattern formed by a variable forming mask can precisely be exposed and transferred onto an object such as a photosensitive substrate (e.g., glass object, wafer) and the like.

According to the scanning type exposure apparatus of the first exposure method, intensity of beams of the first exposure unit and the second exposure unit is measured by the beam intensity measuring system, and the beam intensity of at least one of the first exposure unit and second exposure unit is adjusted based on the measurement result. Therefore, a difference between the intensity of beam of the first exposure unit and intensity of beams of the second exposure unit can be corrected. Thus, even when the intensity of beams of the first exposure unit and the intensity of beams of the second exposure unit are different from each other, since the difference in the beam intensity can be corrected, the joint between the first exposure unit and second exposure unit can excellently be exposed, and a predetermined pattern formed on the photosensitive substrate by the variable forming mask can precisely exposed and transferred.

Second Embodiment

Figure 31:
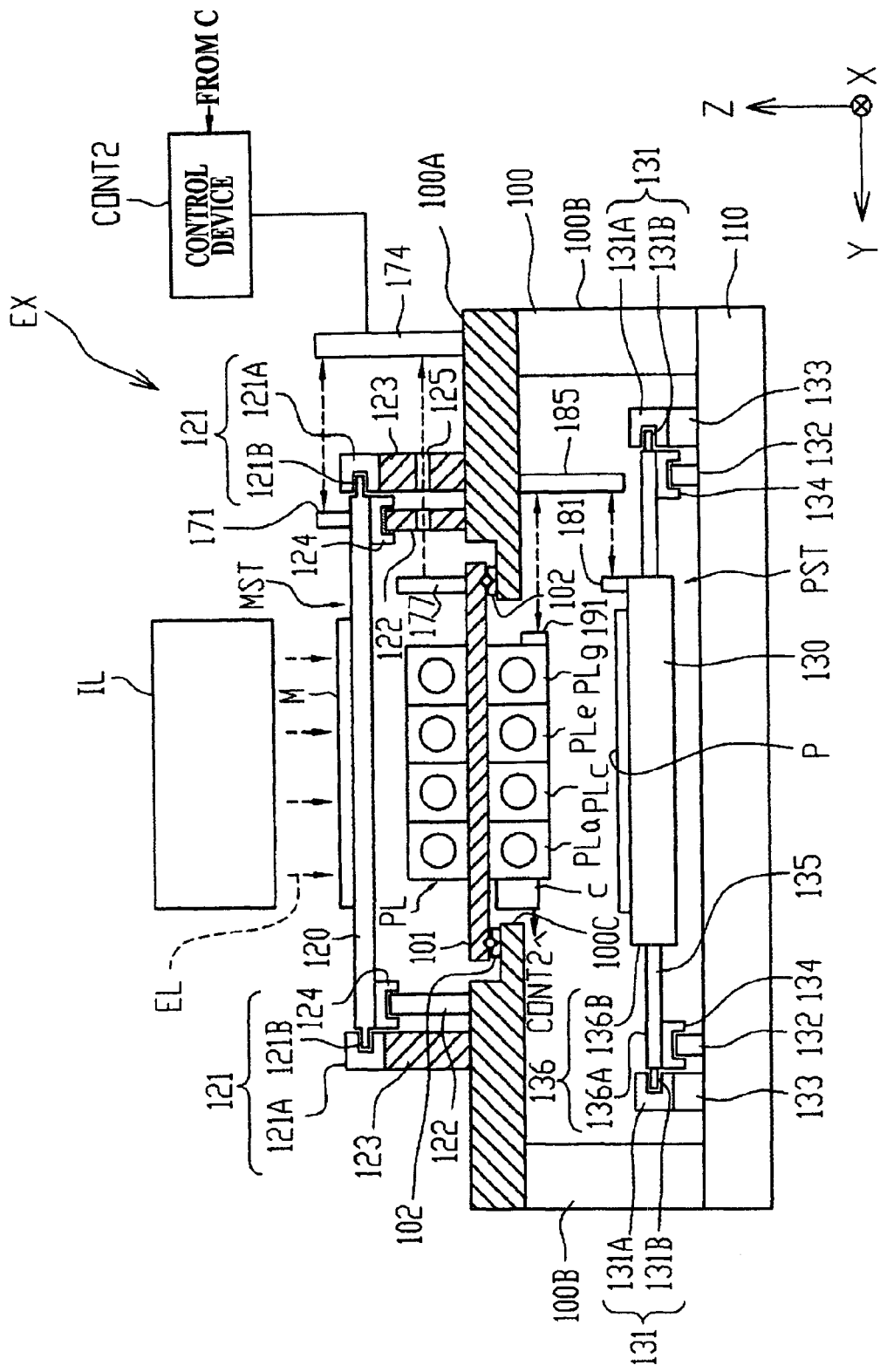
FIG. 31 is a schematic diagram showing a structure of an exposure apparatus of a second embodiment of the invention.
Figure 32:
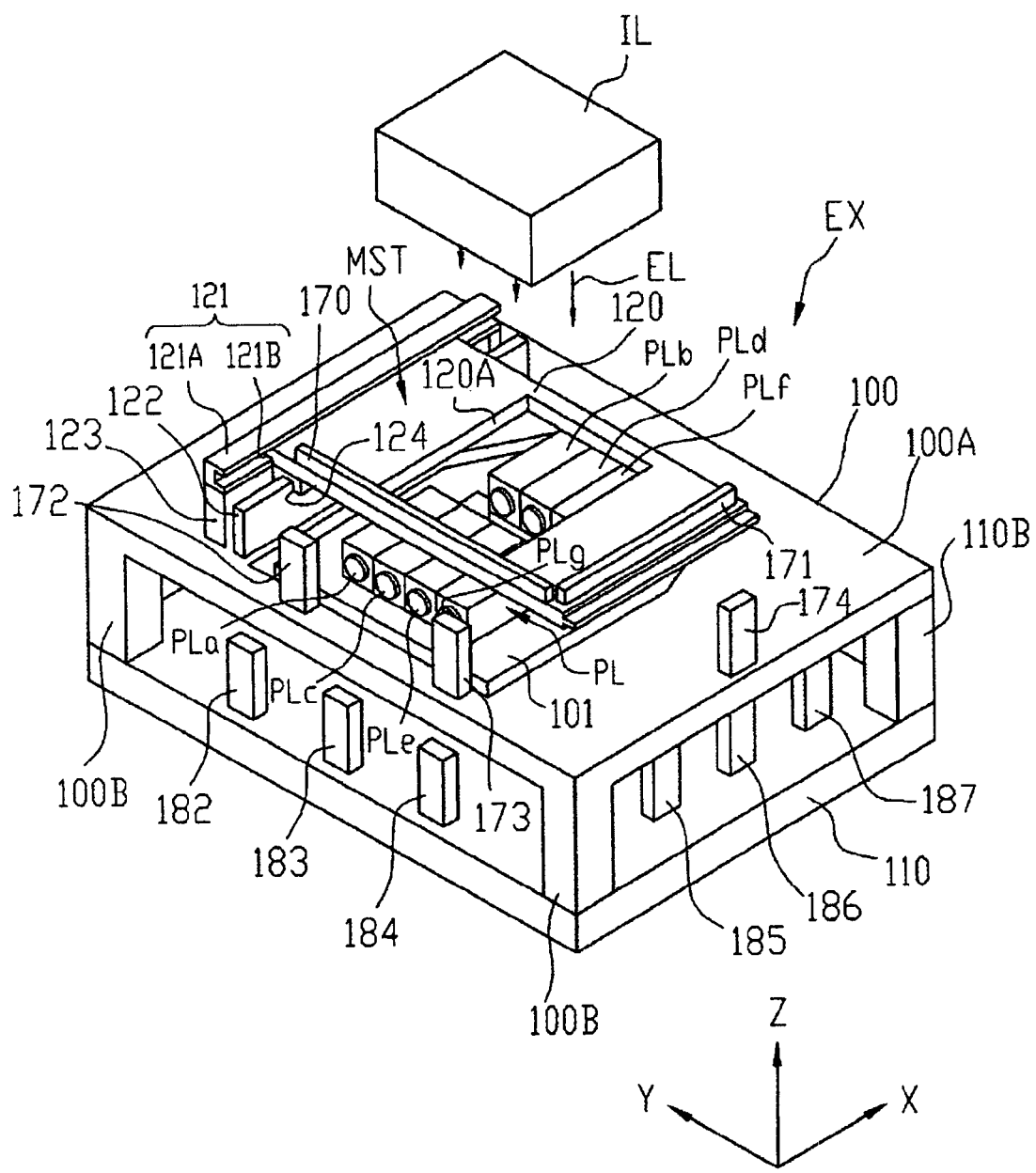
FIG. 32 is a schematic perspective view of the exposure apparatus of the second embodiment of the invention.

Next, a second embodiment of the invention will be explained with reference to the drawings. FIG. 31 is a schematic diagram showing a structure of an exposure apparatus of the second embodiment of the invention. FIG. 32 is a schematic perspective view. In FIGS. 31 and 32, an exposure apparatus EX includes a mask stage MST for supporting a mask M formed with a pattern, a substrate stage (plate stage) PST for supporting a photosensitive substrate (plate) P having an outer diameter greater than 500 mm, an illumination optical system IL for illuminating the mask M supported by the mask stage MST with the exposure light L, a projection optical system PL for projecting an image of a pattern of the mask M illuminated by the exposure light L onto the photosensitive substrate P supported by the substrate stage PST, a column 100 for supporting the projection optical system PL through a surface plate 101, and a control device CONT2 for controlling action concerning the exposing processing in a centralized manner. The column 100 includes an upper plate portion 100A, and legs 100B extending downward from four corners of the upper plate portion 100A. The column 100 is disposed on a base plate 110 placed on a floor horizontally. In this embodiment, the projection optical system PL includes a plurality of (seven in this embodiment) projection optical modules PLa to PLg which are arranged. The illumination optical system IL also includes a plurality of (seven) illumination optical module in correspondence with the number and disposition of the projection optical modules. The photosensitive substrate P is formed by applying photosensitizer (photoresist) to a substrate used for a flat-panel display such as a glass substrate.

The exposure apparatus EX of the embodiment is a scanning type exposure apparatus in which the mask M and the photosensitive substrate P moves in synchronization with the projection optical system PL to carry out the scanning and exposing operations, and the exposure apparatus EX is a so-called multi-lens scanning type exposure apparatus. In the following explanation, a in synchronization moving direction of the mask M and the photosensitive substrate P is the X-axis direction (scanning direction), a direction intersecting with the X-axis direction on a horizontal plane at right angles is the Y-axis direction (non-scanning direction), and a direction intersecting with the X-axis direction and Y-axis direction is the Z-axis direction. Further, directions around the X-axis, Y-axis and Z-axis are defined as θX direction, θY direction and θZ direction.

Although it is not illustrated in the drawings, the illumination optical system IL includes a plurality of light sources, a light guide having a plurality of emitting sections which once synthesize luminous flux emitted from the plurality of light sources and then disperse and emit the luminous flux equally, an optical integrator for converting the luminous flux from each emitting section of the light guide into luminous flux (exposure light) having uniform illumination distribution, a blind portion having an opening for shaping the exposure light from the optical integrator into a slit form, and a condenser lens for forming the exposure light passing through the blind portion on the mask M. The mask M is illuminated in the plurality of slit-shaped illumination regions by the exposure light from the condenser lens. Mercury lamps are used as the light sources in the embodiment, and g rays (426 nm), h rays (405 nm), i rays (385 nm) and the like which are wavelength required for exposure are used by a wavelength selection filter (not shown).

The mask stage MST is provided on the upper plate portion 100A of the column 100. The mask stage MST includes a mask holder 120 for holding the mask M, a pair of linear motors 121 capable of moving the mask holder 120 on the upper plate portion 100A in the X-axis direction by a predetermined stroke, and a pair of guide sections 122 which are provided on the upper plate portion 100A and which guide the mask holder 120 which moves in the X-axis direction. The linear motor 121 and the guide section 122 on the −Y side are not illustrated in FIG. 32. The mask holder 120 holds the mask M through a vacuum chuck. The mask holder 120 is formed at its central portion with an opening 120A through which exposure light from the mask M passes. Each of the pair of linear motors 121 includes a stator 121A which is supported by the support member 123 on the upper plate portion 100A and which extends in the X-axis direction, and a moving element 121B which is provided in correspondence with the stator 121A and which are fixed to both sides of the mask holder 120 in the Y-axis direction. The linear motor 121 may be a so-called moving magnet type linear motor in which the stator 121A comprises a coil unit (armature coil unit) and the moving element 121B comprises a magnet coil unit, or may be a so-called moving coil type linear motor in which the stator 121A comprises the magnet coil unit and the moving element 121B comprises the coil unit. If the moving element 121B is driven by electromagnetic interaction between the moving element 121B and the stator 121A, the mask holder 120 moves in the X-axis direction.

Each of the pair of guide sections 122 guides the mask holder 120 which moves in the X-axis direction. The guide section 122 extends in the X-axis direction and is fixed to the upper plate portion 100A of the column 100. A pair of to-be guided members 124 having concave portions which are engaged with the guide sections 122 are fixed to a lower portion of the mask holder 120. A air bearing (not shown) which is a non-contact bearing is provided between the to-be guided member 124 and the guide section 122. The mask holder 120 is supported by the guide section 122 in a non-contact manner, and the mask holder 120 moves in the X-axis direction. The mask stage MST also includes a moving mechanism (not shown) which moves the mask holder 120 holding the mask M in the Y-axis direction and θ-direction. The attitude of the mask holder 120 (mask stage MST) can be adjusted by the linear motor and the moving mechanism. In the following explanation, the linear motor and the moving mechanism which can adjust the attitude of the mask holder 120 (mask stage MST) are collectively called "mask stage driving device MSTD".

The column 100 is provided with a laser interferometry which will be described in detail later. A reference mirror is provided on the surface plate 101, and a moving mirror is provided on the mask holder 120. As shown in FIG. 31, a laser interferometry 174 irradiates a reference mirror 177 with laser beam. An optical path of this laser beam is secured as shown with a symbol 125.

The substrate stage PST is provided on the base plate 110. The substrate stage PST includes a substrate holder 130 which holds the photosensitive substrate P, a guide stage 135 which movably supports the substrate holder 130 while guiding the substrate holder 130 in the Y-axis direction, a linear motor 36 which is provided on the guide stage 135 and which moves the substrate holder 130 in the Y-axis direction, a pair of linear motors 131 which can move the substrate holder 130 in the X-axis direction together with the guide stage 135 with a predetermined stroke on the base plate 110, and a pair of guide sections 132 which are provided on the base plate 110 and which guides the guide stage 135 (and the substrate holder 130) which moves in the X-axis direction. The substrate holder 130 holds the photosensitive substrate P through a vacuum chuck. Each of the pair of linear motors 131 is supported by the support section 133 on the base plate 110, and includes a stator 131A extending in the X-axis direction, and a moving element 131B which is provided in correspondence with the stator 131A and which is fixed to both ends of the guide stage 135 in the longitudinal direction. The linear motor 131 may be a so-called moving magnet type linear motor in which the stator 131A comprises a coil unit (armature coil unit) and the moving element 131B comprises a magnet coil unit, or may be a so-called moving coil type linear motor in which the stator 131A comprises the magnet coil unit and the moving element 131B comprises the coil unit. If the moving element 121B is driven by electromagnetic interaction between the moving element 131B and the stator 131A, the mask holder 130 moves in the X-axis direction together with the guide stage 135. Each of the pair of guide sections 132 guides the guide stage 135 and the substrate holder 130 which move in the X-axis direction, the guide section 132 extends in the X-axis direction and is fixed to the base plate 110.

A to-be guided member 134 having a concave portion which is to be engaged with the guide section 132 is fixed to a lower portion of the guide stage 135. An air bearing (not shown) which is a non-contact bearing is provided between the to-be guided member 134 and the guide section 132. The guide stage 135 is supported by the guide section 132 in a non-contact manner and is moved in the X-axis direction. Similarly, a linear motor 136 also includes a stator 136A provided on the guide stage 135 and a moving element 136B provided on the substrate holder 130. The substrate holder 130 is guided by the guide stage 135 by the driving of the linear motor 136 and is moved in the Y-axis direction. The guide stage 135 can rotate also in the θZ direction by adjusting the driving of each of the pair of the linear motors 131. Therefore, the substrate holder 130 can move in the X-axis direction and θZ direction substrate integrally with the guide stage 135 by the pair of linear motors 131. Further, the substrate stage PST also includes a moving mechanism for moving the substrate holder 130 in the Z-axis direction, the θX direction and the θY direction. The attitude of the substrate holder 130 (substrate stage PST) can be adjusted by the linear motor and the moving mechanism. In the following explanation, the linear motor and the moving mechanism which can adjust the attitude of the substrate holder 130 (substrate stage PST) are collectively called "substrate stage driving device PSTD".

The column 100 is provided with a laser interferometry which will be described in detail, barrels of the projection optical modules PLa to PLg are provided at their predetermined positions with reference mirrors, and the substrate holder 130 is provided with a moving mirror. The projection optical system PL includes a plurality of (seven) arranged projection optical modules PLa to PLg. The projection optical modules PLa to PLg are supported by the one surface plate 101. As shown in FIG. 31, the surface plate 101 which supports the projection optical modules PLa to PLg is supported by the upper plate portion 100A of the column 100 through support sections 102. Here, the upper plate portion 100A is provided at its center with an opening 100C. The surface plate 101 is supported on a peripheral edge of the opening 100C of the upper plate portion 100A. Lower portions of the projection optical modules PLa to PLg are disposed in the opening 100C. In FIG. 31, a step is formed in the peripheral edge of the opening 100C and the support sections 102 are provided on the step, but the upper plate portion 100A may be a flat surface.

Figure 33:
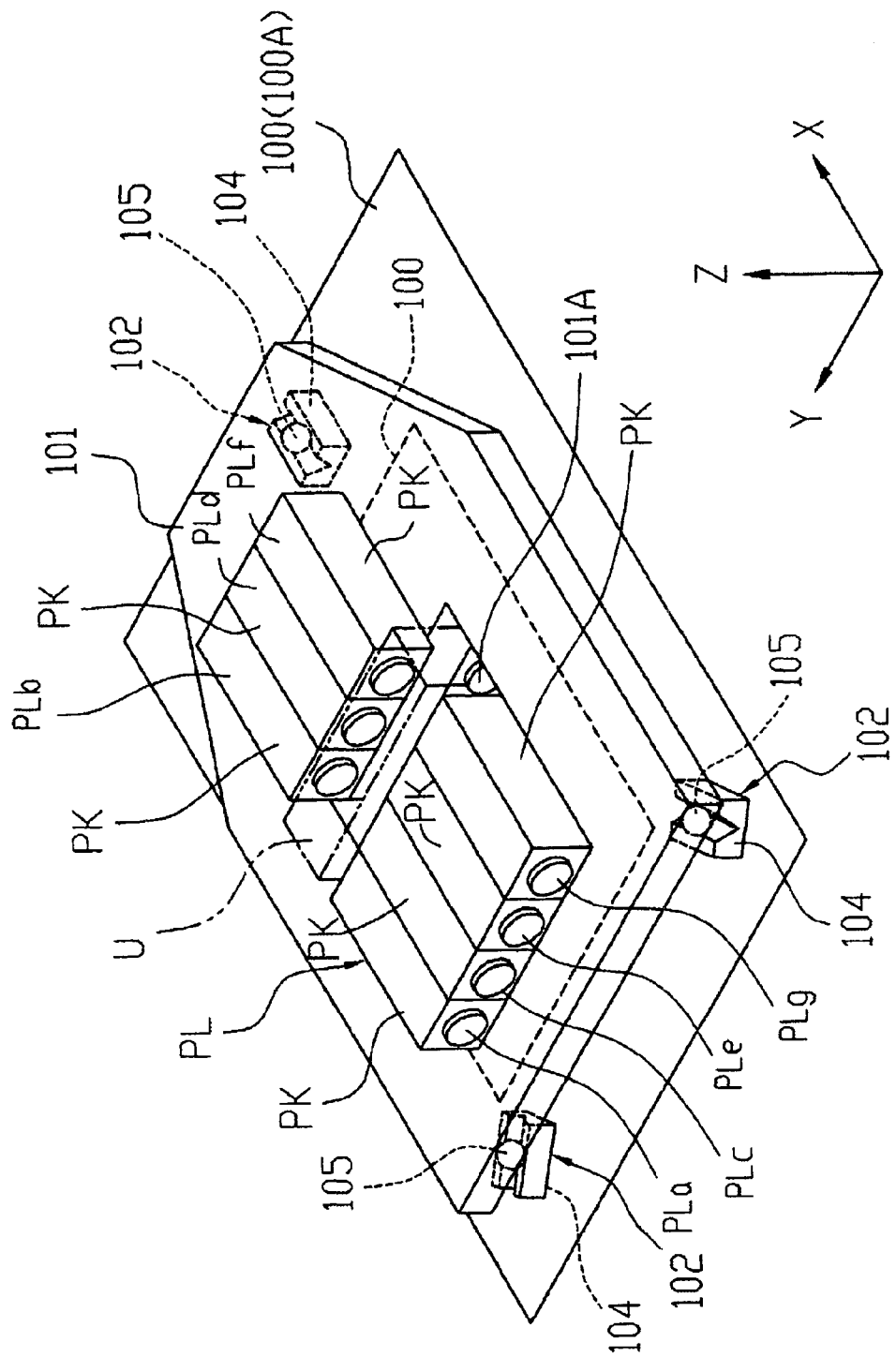
FIG. 33 is a perspective view of a surface plate supporting the projection optical module of the second embodiment of the invention.

FIG. 33 is a schematic perspective view showing the surface plate 101 which supports the projection optical modules PLa to PLg, and FIG. 34 is a plan view thereof. As shown in FIGS. 33 and 34, the projection optical system PL comprises the plurality of projection optical modules PLa to PLg, and these projection optical modules PLa to PLg are supported by the surface plate 101. The surface plate 101 is kinematically supported by the upper plate portion 100A of the column (support structure) 100 through the support sections 102. Three support sections 102 are provided at three predetermined locations of the surface plate 101. The projection optical modules PLa, PLc, PLe and PLg of the plurality of projection optical modules PLa to PLg are arranged in the Y direction (direction intersecting with the scanning direction), and are disposed forward in the X direction (scanning direction) (first projection optical unit, hereinafter). The projection optical modules PLb, PLd and PLf are arranged in the Y direction and are disposed rearward in the X direction (second projection optical unit, hereinafter). The first projection optical unit and the second projection optical unit are separated away from each other by a predetermined distance in the X direction. The projection optical modules PLa, PLc, PLe and PLg constituting the first projection optical unit and the projection optical modules PLb, PLd and PLf constituting the second projection optical unit are disposed in a staggered form. That is, the adjacent projection optical modules (e.g., the projection optical modules PLa and PLb, as well as PLb and PLc) of the projection optical modules PLa to PLg which are disposed in the staggered form are displaced in the Y direction by a predetermined distance.

The surface plate 101 is made of metal matrix composite for example. The metal matrix composite is composite in which ceramics reinforcing material is mixed in metal matrix material, and in this embodiment, aluminum is included as the metal. The surface plate 101 is formed at its central portion with an opening 101A, and optical paths of the exposure light L of the projection optical modules PLa to PLg are secured by the opening 101A. The surface plate 101 is formed into a laterally symmetric hexagonal shape (home plate-shape) as viewed from above. The first projection optical unit is supported by a wide portion of the surface plate 101, and the second projection optical unit is supported by a narrow portion of the surface plate 101. That is, the shape of the surface plate 101 is set in accordance with the number of the plurality of projection optical modules, and material to be used is suppressed to the minimum in a range where sufficient intensity for supporting the projection optical modules PLa to PLg can be obtained.

Each of the projection optical modules PLa to PLg includes a barrel PK, and a plurality of optical element (lenses) disposed in the barrel PK. The projection optical modules PLa to PLg are connected to the surface plate 101 independently from each other and they can be separated from each other. With this, the projection optical modules can be increased or reduced by the module. In this case, it is possible to easily attach or detach the projection optical module to and from the surface plate 101. Further, since the projection optical modules PLa to PLg can be connected to and separated from the surface plate 101 independently from each other, positioning of the projection optical module with respect to a predetermined reference position (e.g., center position of the opening 101A) can be carried out, and the relative positions of the projection optical modules PLa to PLg can be set freely.

Figure 35A:
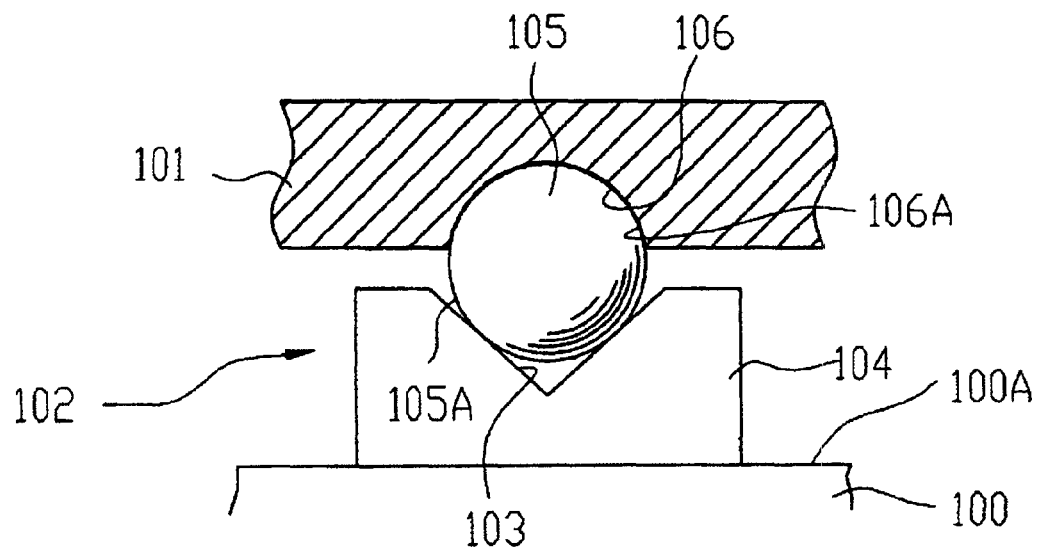
FIG. 35A is an enlarged view showing a support section of the second embodiment of the invention.

FIG. 35a is an enlarged view of the support section 102. As shown in FIG. 35a, the support section 102 includes a V-groove member 104 which is formed in the upper plate portion 100A of the column 100 and which has a V-shaped inner surface 103, and a spherical member 105 having a spherical surface 105A which is in contact with the V-shaped inner surface 103 of the V-groove member 104. The V-groove member 104 is fixed to the upper plate portion 100A of the column 100. The surface plate 101 is formed at its lower surface with a spherical concave portion 106 on which the spherical member 105 can be disposed. An inner surface 106A of the spherical concave portion 106 of the surface plate 101 and a spherical surface 105A of the spherical member 105 are in contact with each other. In a state where the spherical member 105 is placed on the V-shaped inner surface 103 of the V-groove member 104, the spherical member 105 of the spherical member 105 can slide with respect to the V-shaped inner surface 103 (see arrow y in FIG. 34). Further, in a state where the surface plate 101 is placed on the spherical member 105 through the spherical concave portion 106, the inner surface 106A of the spherical concave portion 106 and the spherical surface 105A of the spherical member 105 can slide on each other. Since these surfaces can slide on each other, when the column 100 is slightly deformed, these surfaces slide on each other, and the influence of deformation of the column 100 on the surface plate 101 is suppressed.

The V-shaped inner surface 103 of the V-groove member 104 and the spherical surface 105A of the spherical member 105 are coated with low friction material films as low friction portions. An example of the low friction material film is diamond-like carbon. With this, a friction force between the V-shaped inner surface 103 of the V-groove member 104 and the spherical member 105 of the spherical member 105 is reduced. Similarly, the inner surface 106A of the spherical concave portion 106 is also provided with a low friction material film. With this, a friction force between the inner surface 106A of the spherical concave portion 106 and the spherical surface 105A of the spherical member 105 is also reduced. Since these surfaces are subjected to the low friction processing, the static friction coefficient is suppressed, and a stress generated when the column 100 is slightly deformed and the surfaces slide on each other is suppressed, and an influence of deformation of the column 100 on the surface plate 101 can be suppressed excellently.

Figure 35B:
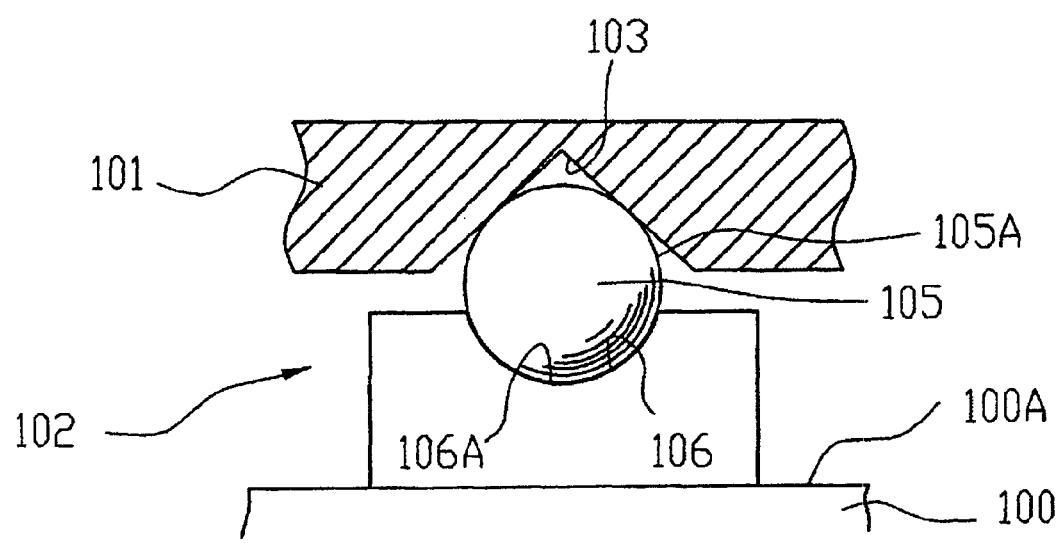
FIG. 35B is an enlarged view showing the support section of the second embodiment of the invention.

Each of the V-shaped inner surface 103 and the spherical surface 105A of the spherical member 105 is provided with the low friction material film, but one of the V-shaped inner surface 103 and the spherical surface 105A of the spherical member 105 may be provided with the low friction material film. Similarly, each of the inner surface 106A of the spherical concave portion 106 and the spherical surface 105A of the spherical member 105 is provided with the low friction material film, but one of the inner surface 106A of the spherical concave portion 106 and the spherical surface 105A of the spherical member 105 may be provided with the low friction material film. As shown in FIG. 35b, the column 100 may be provided with a member having the spherical concave portion 106, the surface plate 101 may be provided at its lower surface with the V-shaped inner surface 103, and the spherical member 105 may be disposed therebetween.

Referring back to FIG. 34, the support sections 102 are provided at three predetermined positions on the surface plate 101 in the plane direction (XY direction). The V-groove members 104 are disposed such that extensions of the V-shaped ridgelines L of the V-groove members 104 intersect with each other at a substantially central portion O in the XY direction of the plurality of projection optical modules PLa to PLg. With this, even when the column 100 is deformed, the central portion O does not largely move. These support sections 102 constitute a so-called kinematic support structure. With this, even if the column 100 is deformed, the projection optical system PL and the surface plate 101 do not largely move, and displacements of relative positions of the plurality of projection optical modules PLa to PLg can be suppressed to small values.

Figure 36:
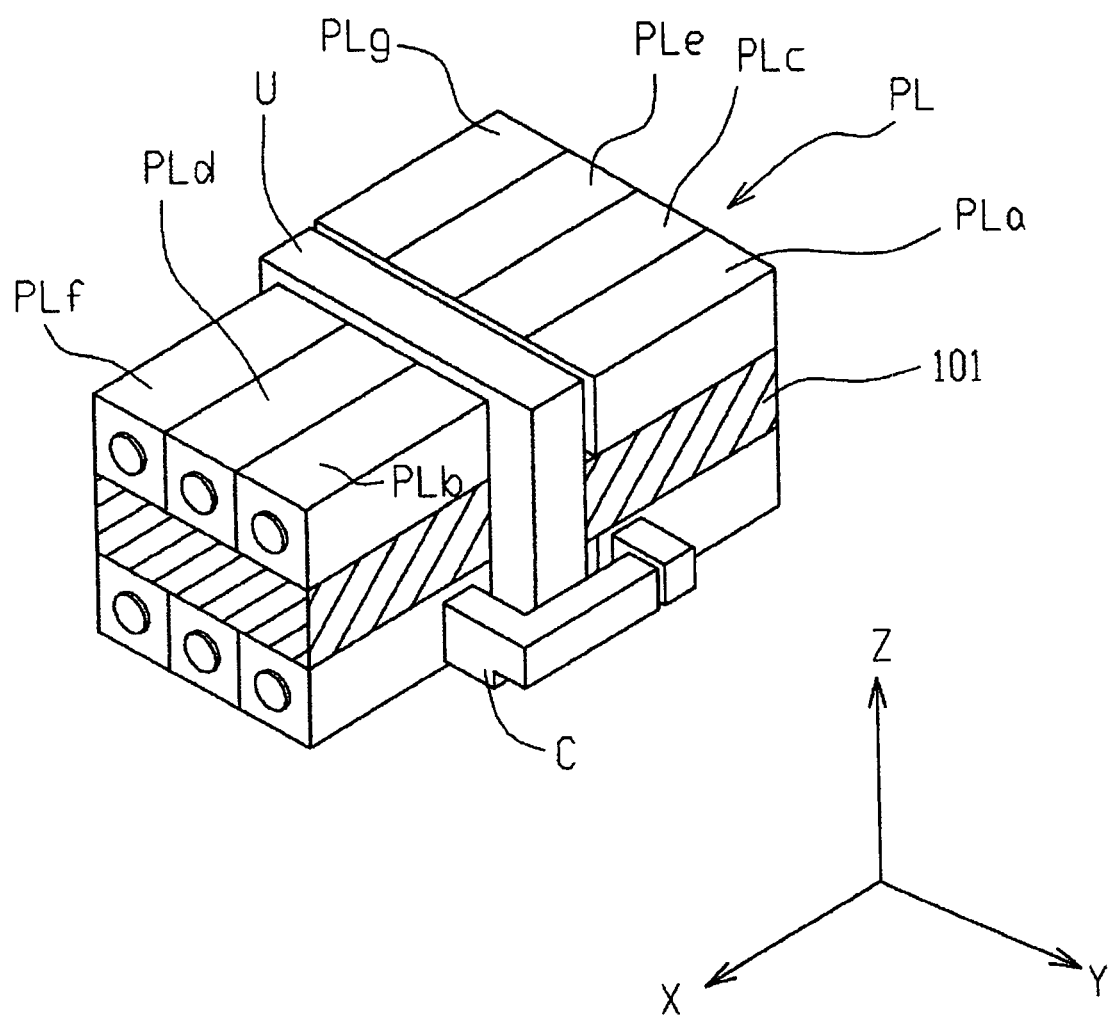
FIG. 36 is a diagram showing a disposition state of a sensor of the second embodiment of the invention.
Figure 37A:
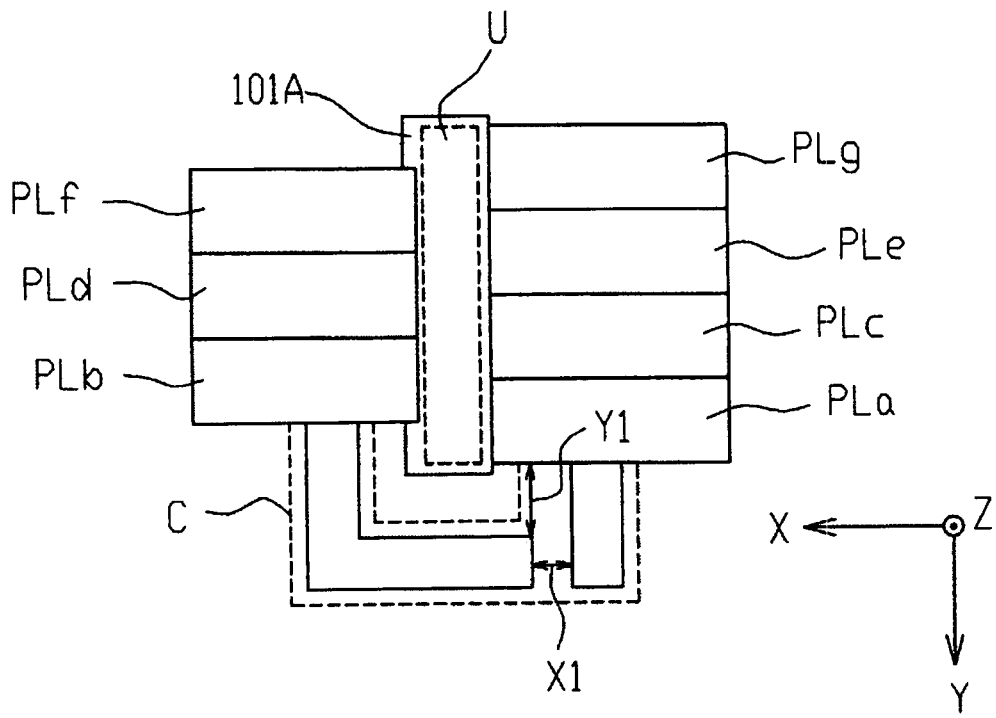
FIG. 37A is an explanatory diagram of positions of a first projection optical unit and a second projection optical unit in which the sensor of the second embodiment of the invention measures distances.
Figure 37B:
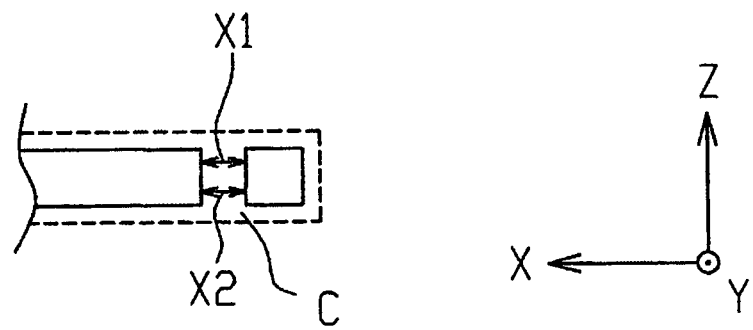
FIG. 37B is an explanatory diagram of positions of the first projection optical unit and the second projection optical unit in which the sensor of the second embodiment of the invention measures distances.

As shown in FIG. 36, the projection optical system PL is provided with the sensor (displacement amount measuring device, measuring device) C on the lower side (−Z direction) of the surface plate 101 on the side of the projection optical modules PLa and PLb (−Y direction). The sensor C measures the relative displacement amount between the first projection optical unit and the second projection optical unit. The sensor C measures a displacement amount of the relative position between the first projection optical unit and the second projection optical unit which can not be suppressed by the support section 102 which constitutes the kinematic support structure. A capacitance sensor, a displacement sensor, an interferometer or the like is used as the sensor C. As shown in FIG. 37a, the sensor C measured the relative first distance X1 in the X direction (scanning direction) between the first projection optical unit and the second projection optical unit. As shown in FIG. 37b, the sensor C measures the relative second distance X2 in the X direction between the first projection optical unit and the second projection optical unit. The distances X1 and X2 measured by the sensor C are output to the control device CONT2.

Figure 38A:
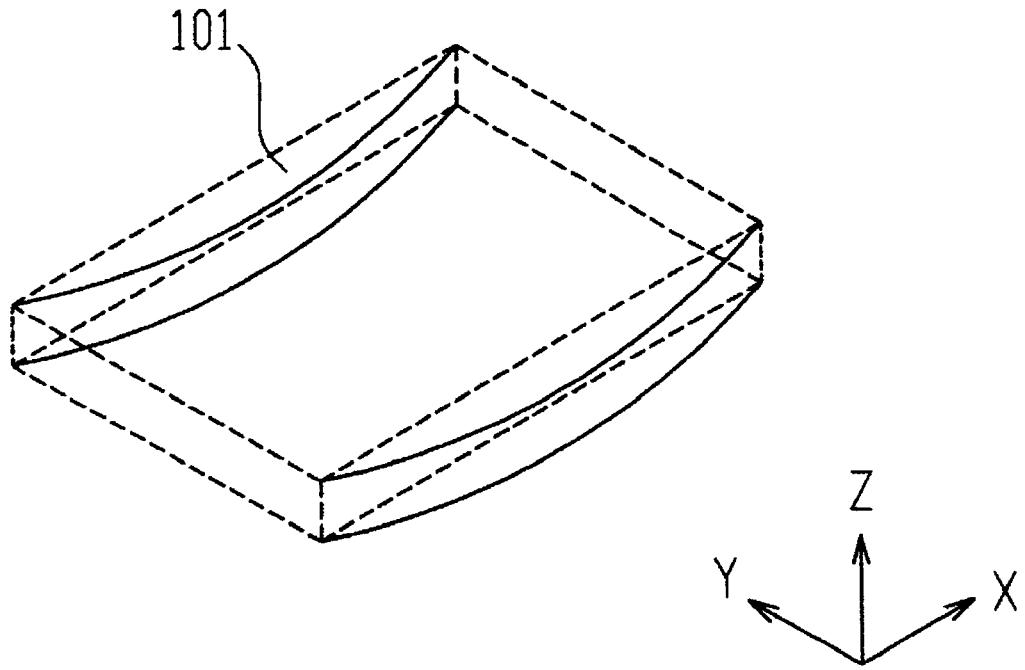
FIG. 38A is a diagram showing a modification of the surface plate of the second embodiment of the invention.

When the surface plate 101 is deformed from the shape shown with broken lines to the shape shown with solid lines as shown in FIG. 38a for example, a relative deviation is generated in the X direction between the first projection optical unit and the second projection optical unit. That is, a deviation in the X direction is generated between an image projected by the first projection optical unit on the photosensitive substrate P and an image projected by the second projection optical unit on the photosensitive substrate P. The relative displacement amount in the X direction between the first projection optical unit and the second projection optical unit is detected based on the distances X1 and X2 measured by the sensor C. That is, the relative translation amount (relative deviation amount in the X direction) between the first projection optical unit and the second projection optical unit is detected.

Figure 37C:
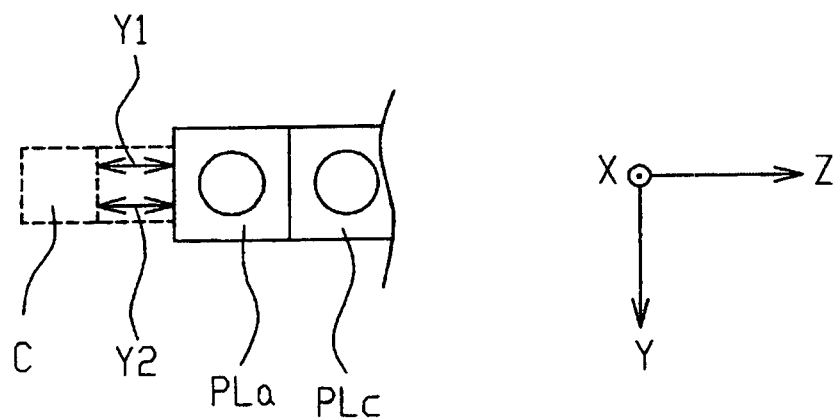
FIG. 37C is an explanatory diagram of positions of the first projection optical unit and the second projection optical unit in which the sensor of the second embodiment of the invention measures distances.

As shown in FIG. 37a, the sensor C also measures a relative first distance Y1 in the Y direction (direction intersecting with the scanning direction) between the first projection optical unit and the second projection optical unit. As shown in FIG. 37c, the sensor C also measures a relative second distance Y2 in the Y direction between the first projection optical unit and the second projection optical unit. The distances Y1 and Y2 measured by the sensor C are output to the control device CONT2.

Figure 38B:
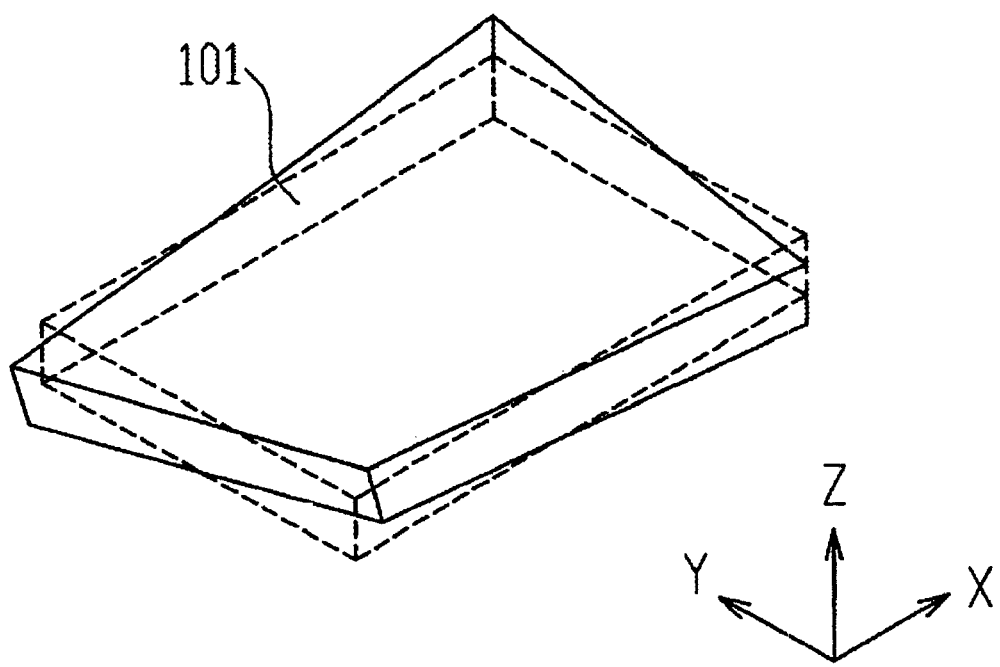
FIG. 38B is a diagram showing the modification of the surface plate of the second embodiment of the invention.

As shown in FIG. 38b for example, when the surface plate 101 is deformed from the shape shown with broken lines to the shape shown with solid lines, a relative deviation in the Y direction between the first projection optical unit and the second projection optical unit is generated. That is, a deviation in Y direction is generated between an image projected onto the photosensitive substrate P by the first projection optical unit and an image projected onto the photosensitive substrate P by the second projection optical unit. The control device CONT2 detects a relative displacement amount between the first projection optical unit and the second projection optical unit based on the distances Y1 and Y2 measured by the sensor C. That is, the control device CONT2 detects a relative attitude difference (relative deviation amount in the yd) between the first projection optical unit and the second projection optical unit.

Figure 39:
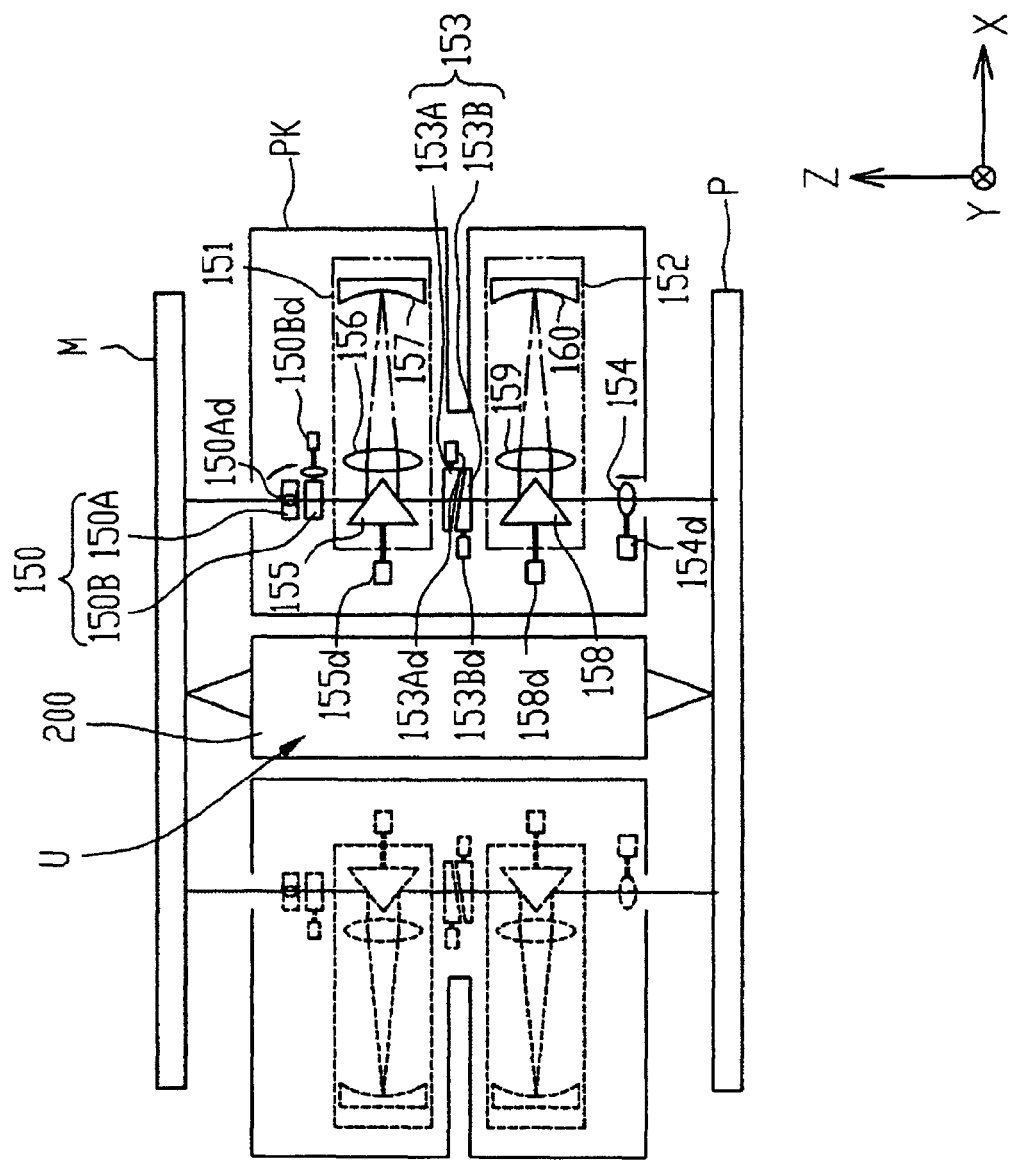
FIG. 39 is a diagram showing a structure of the projection optical module of the second embodiment of the invention.

FIG. 39 is a diagram showing a structure of the projection optical system (projection optical module). Each of the projection optical modules PLa to PLg projects, onto the photosensitive substrate P, a pattern image existing in an illumination region of the mask M illuminated by the exposure light L by the illumination optical module. Each of the projection optical modules PLa to PLg includes a shift adjusting mechanism 150, two sets of catadioptric systems 151 and 152, a field of view aperture (not shown), and a scaling adjusting mechanism 154. The projection optical module PLf will be explained below, but other projection optical modules PLa, PLb, PLc, PLd, PLe and PLg have the same structure as that of the projection optical module PLf.

A luminous flux which passed through the mask M is projected onto the shift adjusting mechanism 150. The shift adjusting mechanism 150 includes a parallel flat glass plate 150A which can rotate around the Y-axis, and a parallel flat glass plate 150B which can rotate around the X-axis. The parallel flat glass plate 150A is rotated around the Y-axis by a driving device 150Ad such as a motor, and the parallel flat glass plate 150B is rotated around the X-axis by a driving device 150Bd such as a motor. If the parallel flat glass plate 150A is rotated around the Y-axis, an image of a pattern of the mask M on the photosensitive substrate P is shifted in the X-axis direction, and if the parallel flat glass plate 150B is rotated around the X-axis, the image of the pattern of the mask M on the photosensitive substrate P is shifted in the Y-axis direction. Driving speeds and driving amounts of the driving devices 150Ad and 150Bd are independently controlled by the control device CONT2. The driving devices 150Ad and 150Bd respectively rotate the parallel flat glass plates 150A and 150B at predetermined speeds and predetermined amounts (predetermined angles) under the control of the control device CONT2. The luminous flux which passed through the shift adjusting mechanism 150 is projected onto the first set of the catadioptric system 151.

The catadioptric system 151 forms an intermediate image of a pattern of a mask M, and includes a right-angle prism (correction mechanism) 155, a lens 156 and a concave mirror 157. The right-angle prism 155 can rotate around the Z-axis, and is rotated around the Z-axis by a driving device 155d such as a motor. If the right-angle prism 155 rotates around the Z-axis, an image of a pattern of a mask M on the photosensitive substrate P is rotated around the Z-axis. That is, the right-angle prism 155 functions as a rotation adjusting mechanism. A driving speed and a driving amount of the driving device 155d are controlled by the control device CONT2. The driving device 155d rotates the right-angle prism 155 at a predetermined speed and predetermined amount (predetermined angle) under control of the control device CONT2. A field of view aperture (not shown) is disposed in an intermediate image position of the pattern formed by the catadioptric system 151. The field of view aperture sets a projection region on the photosensitive substrate P, and sets the projection region on the photosensitive substrate P to a trapezoidal shape for example. A luminous flux which passed through the field of view aperture is projected onto the second set of catadioptric system 152.

Like the catadioptric system 151, the catadioptric system 152 includes a right-angle prism (correction mechanism) 158 as a rotation adjusting mechanism, a lens 159 and a concave mirror 160. The right-angle prism 158 is also rotated around the Z-axis by driving of a driving device 158d such as a motor, and the right-angle prism 158 rotates an image of a pattern of a mask M on the photosensitive substrate P around the Z-axis. A driving speed and a driving amount of the driving device 158d are controlled by the control device CONT2. The driving device 158d rotates the right-angle prism 158 at a predetermined speed and predetermined amount (predetermined angle) under the control of the control device CONT2.

A luminous flux emitted from the catadioptric system 152 passes through a scaling adjusting mechanism (correction mechanism) 154 and forms an erect and equal-magnification image of the pattern of the mask M on the photosensitive substrate P. As shown in FIG. 39, the scaling adjusting mechanism 154 moves a lens in the Z-axis direction or comprises three lenses, e.g., a concave lens, a convex lens and a concave lens, and moves the convex lens between the concave lenses in the Z-axis direction, thereby adjusting the scaling of an image of a pattern of the mask M. In the case of FIG. 39, the convex lens is moved by a driving device 154d which is controlled by the control device CONT2. The driving device 154d moves the convex lens at a predetermined speed and by a predetermined amount under the control of the control device CONT2. The convex lens may be a double-convex lens or a single-convex lens.

An image plane adjusting mechanism 153 is provided on an optical path between the two sets of catadioptric systems 151 and 152. The image plane adjusting mechanism 153 adjusts an image-forming position of the projection optical module PLf and inclination of an image plane. The image plane adjusting mechanism 153 is provided near a position where an intermediate image is formed by the catadioptric system 151. That is, the image plane adjusting mechanism 153 is provided at a conjugated position with respect to the mask M and the photosensitive substrate P. The image plane adjusting mechanism 153 includes a first optical member 153A, a second optical member 153B an air bearing (not shown) which supports the first optical member 153A and the second optical member 153B in a non-contact manner, and driving devices 153Ad and 153Bd which move the first optical member 153A with respect to the second optical member 153B. Each of the first optical member 153A and the second optical member 153B is a wedge-like glass plate through which exposure light L can pass, and constitutes a pair of wedge type optical members. The exposure light L passes through the first optical member 153A and the second optical member 153B. A driving amount and a driving speed of each of the driving devices 153Ad and 153Bd, i.e., a relative moving amount and moving speed between the first optical member 153A and the second optical member 153B are controlled by the control device CONT2. If the first optical member 153A slides (moves) in the X-axis direction with respect to the second optical member 153B, a position of the projection optical module PLf moves in the Z-axis direction, the first optical member 153A rotates in the θZ direction with respect to the second optical member 153B, and an image plane of the projection optical module PLf is inclined.

The shift adjusting mechanism 150, the rotation adjusting mechanisms 155 and 158, the scaling adjusting mechanism 154 and the image plane adjusting mechanism 153 function as an adjusting devices which adjusts optical property (image forming property) of the projection optical module PLf. The adjusting device of the optical property may seal a space between partial optical elements (lenses) to adjust an internal pressure. The shift adjusting mechanism, the rotation adjusting mechanism, the scaling adjusting mechanism and the image plane adjusting mechanism also function as correcting devices (optical property adjusting devices) which correct a deviation between a projecting position of the first projection optical unit and a projection position of the second projection optical unit. That is, the correcting device (optical property adjusting device) corrects a projection position on the photosensitive substrate P of a pattern of a mask M by the first projection optical unit or the second projection optical unit based on a control signal from the control device CONT2.

That is, the control device CONT2 calculates adjusting amounts (driving amounts) of the shift adjusting mechanism, the rotation adjusting mechanism, the scaling adjusting mechanism and the image plane adjusting mechanism constituting the projection optical modules PLa to PLg, from a relative displacement amount between the first projection optical unit and the second projection optical unit detected based on the four distances X1, X2, Y1 and Y2 measured by the sensor C. The control device CONT2 outputs a control signal including information of the calculated adjusting amount (driving amount) to the shift adjusting mechanism, the rotation adjusting mechanism, the scaling adjusting mechanism and the image plane adjusting mechanism constituting the projection optical modules PLa to PLg. The shift adjusting mechanism, the rotation adjusting mechanism, the scaling adjusting mechanism and the image plane adjusting mechanism constituting the projection optical modules PLa to PLg correct a projection position on the photosensitive substrate P of a pattern of a mask M by the first projection optical unit or the second projection optical unit based on the control signal including the information of the adjusting amount (driving amount) from the control device CONT2. Here, the projection position indicates at least one of a position in the X direction (scanning direction), a position in the Y direction (direction intersecting with the scanning direction) and a position in a rotation direction around an optical axial direction of the projection optical system PL.

The control device CONT2 calculates an adjusting amount (driving amount) of at least one of the shift adjusting mechanism, the rotation adjusting mechanism, the scaling adjusting mechanism and the image plane adjusting mechanism constituting the projection optical modules PLa to PLg, and corrects a deviation in projection position of the first projection optical unit or the second projection optical unit.

Here, since the four distances X1, X2, Y1 and Y2 measured by the sensor C are relative displacement amounts between the first projection optical unit and the second projection optical unit, it is not possible to individually detect a deviation amount of the projection position of the first projection optical unit and a deviation amount of a projection position of the second projection optical unit. Therefore, the control device CONT2 may individually calculate the deviation amount of the projection position of the first projection optical unit and the deviation amount of the projection position of the second projection optical unit based on a position of the mask holder 120 (mask stage MST) or a position of the substrate holder 130 (substrate stage PST) measured by a later-described laser interferometry system and based on the four distances X1, X2, Y1 and Y2 measured by the sensor C.

That is, the control device CONT2 detects a projection position of the second projection optical unit based on a position of the mask holder 120 or the substrate holder 130 measured by the laser interferometry system. Next, the projection position of the first projection optical unit is detected based on the detected projection position of the second projection optical unit and the four distances X1, X2, Y1 and Y2 measured by the sensor C. Then, an adjusting amount (driving amount) of at least one of the shift adjusting mechanism, the rotation adjusting mechanism, the scaling adjusting mechanism and the image plane adjusting mechanism in at least one of the projection optical modules PLa, PLc, PLe and PLg constituting the first projection optical unit based on the detected projection position of the first projection optical unit. Further, an adjusting amount (driving amount) of at least one of the shift adjusting mechanism, the rotation adjusting mechanism, the scaling adjusting mechanism and the image plane adjusting mechanism in at least one of the projection optical modules PLb, PLd and PLf constituting the second projection optical unit based on the detected projection position of the second projection optical unit. The correction is carried out by driving the shift adjusting mechanism, the rotation adjusting mechanism, the scaling adjusting mechanism and the image plane adjusting mechanism of the projection optical modules PLa to PLg based on an adjusting amount of the calculated projection position of the first projection optical unit and an adjusting amount of the calculated projection position of the second projection optical unit.

The control device CONT2 can also correct the projection position of the second projection optical unit while using the projection position of the first projection optical unit as a reference (fixed). In this case, a deviation amount of the projection position of the first projection optical unit and a deviation amount of the projection position of the second projection optical unit are not individually calculated, but since a relative deviation amount between the projection position of the first projection optical unit and the projection position of the second projection optical unit can be corrected, it is possible to precisely match the joints between the projection position of the first projection optical unit and the projection position of the second projection optical unit. It is also possible to correct the projection position of the first projection optical unit while using the projection position of the second projection optical unit as a reference (fixed).

The control device CONT2 may calculate an adjusting amount for correcting the projection position of the first projection optical unit, and an adjusting amount for correcting the projection position of the second projection optical unit which is the same as the adjusting amount for correcting the projection position of the first projection optical unit, based on the relative displacement amount between the first projection optical unit and the second projection optical unit detected based on the four distances X1, X2, Y1 and Y2 measured by the sensor C. That is, a half of the adjusting amount calculated based on the relative displacement amount between the first projection optical unit and the second projection optical unit is defined as an adjusting amount of the first projection optical unit and the second projection optical unit. In this case, the deviation amount of the projection position of the first projection optical unit and the deviation amount of the projection position of the second projection optical unit are not individually calculated, but since it is possible to correct the relative deviation amount between the projection position of the first projection optical unit and the projection position of the second projection optical unit, it is possible to precisely match the joints of the projection position of the first projection optical unit and the projection position of the second projection optical unit.

An autofocus detection system 200 for detecting a position of a pattern forming surface of the mask M and a to-be exposed surface of the photosensitive substrate P in the Z-axis direction is provided between the −X side projection optical modules PLa, PLc, PLe and PLg and the +X side projection optical modules PLb, PLd and PLf. An optical element constituting the autofocus detection system 200 is disposed in a housing, and the optical element and the housing form an autofocus unit (AUTOFOCUS unit) U.

Figure 40:
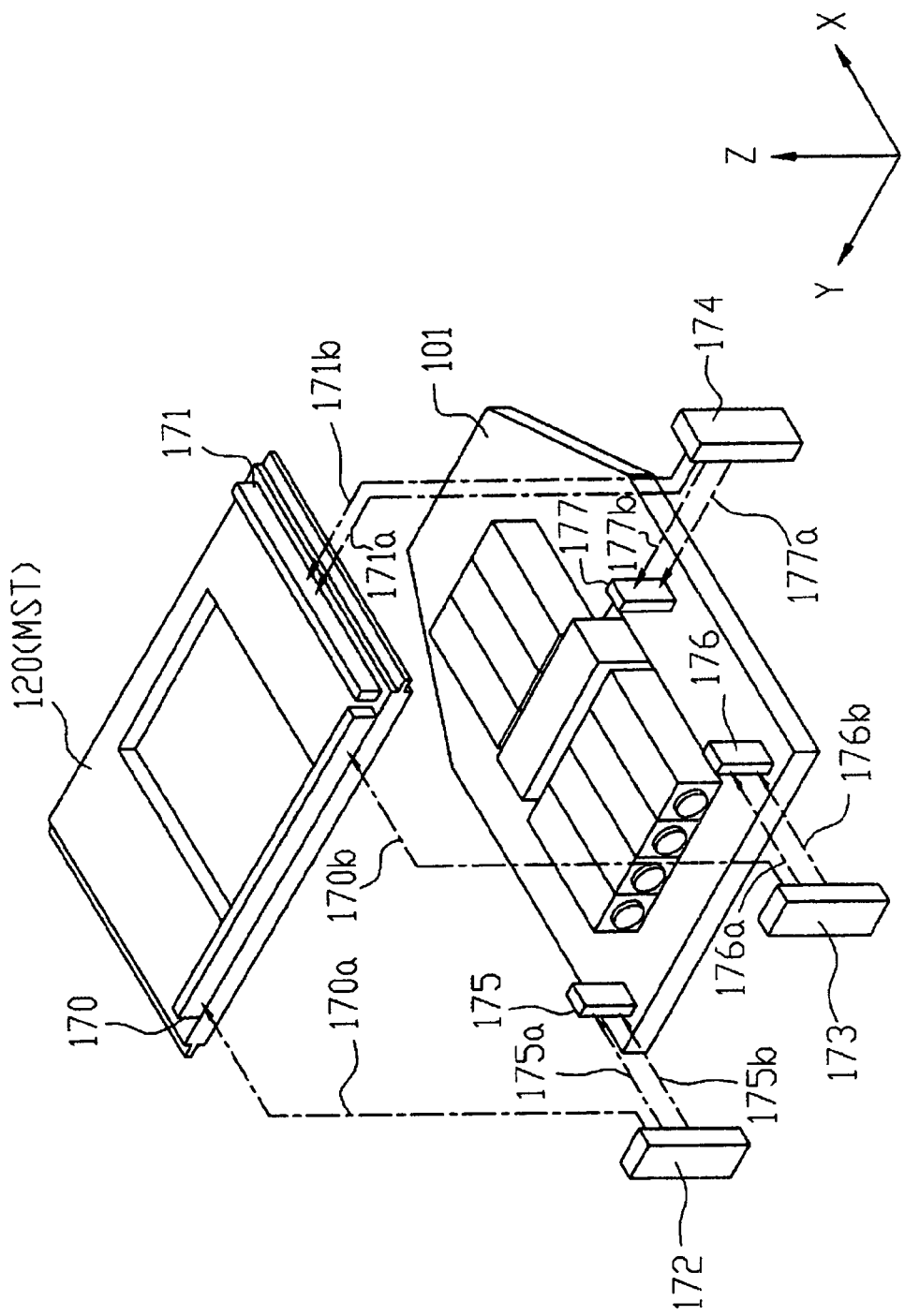
FIG. 40 is a diagram showing a structure of a laser interfering system which measures a position of a mask holder of the second embodiment of the invention.

FIG. 40 is a schematic diagram showing a structure of a laser interferometry system which measures a position of the mask holder 120 (mask stage MST). In FIG. 40, an X moving mirror 170 extending in the Y-axis direction is provided on an end of the mask holder 120 on the −X side, and a Y moving mirror 171 extending in the X-axis direction is provided on an end of the mask holder 120 on the −Y side. Two laser interferometries 172 and 173 are arranged in the Y-axis direction at locations opposed to the X moving mirror 170. A laser interferometry 174 is provided at a location opposed to the Y moving mirror 171. The laser interferometries 172, 173 and 174 are disposed on the upper plate portion 100A (see FIG. 32). Reference mirrors 175, 176 and 177 are mounted on the surface plate 101. The reference mirror 175 is provided at a location opposed to the laser interferometry 172, the reference mirror 176 is provided at a location opposed to the laser interferometry 173, and the reference mirror 177 is provided at a location opposed to the laser interferometry 174. The laser interferometry 172 provided on the +Y side of the two laser interferometries 172 and 173 irradiates the X moving mirror 170 with length measuring beam (light beam) 170a, and irradiates the reference mirror 175 with reference beams (light beams) 175a and 175b. Similarly, the laser interferometry 173 provided on the −Y side irradiates the X moving mirror 170 with length measuring beam 170b, and irradiates the reference mirror 176 with reference beams 176a and 178b. Light reflected by the X moving mirror 170 and the reference mirrors 175 and 176 based on the emitted length measuring beam and reference beam is received by a photoreceiver of the laser interferometries 172 and 173, the laser interferometries 172 and 173 interfere with the light, and measure a displacement amount of an optical path of the length measuring beam using the optical path of the reference beam as a reference, and a position (coordinate) of the X moving mirror 170 using the reference mirror 175 and 167 as a reference. Measurement results of the laser interferometries 172 and 173 are output to the control device CONT2, and the control device CONT2 obtains a position of the mask holder 120 (mask stage MST) in the X-axis direction based on the measurement results of the laser interferometries 172 and 173.

The laser interferometry 174 irradiates the Y moving mirror 171 with length measuring beams 171a and 171b, and irradiates the reference mirror 177 with reference beams 177a and 177b. Light reflected by the Y moving mirror 171 and the reference mirror 177 based on the emitted length measuring beam and reference beam is received by a photoreceiver of the laser interferometry 174, the laser interferometry 174 interfere with the light, and measures a displacement amount of an optical path of the length measuring beam using the optical path length of the reference beam as a reference, and measures a position of the Y moving mirror 171 using the reference mirror 177 as a reference. A measurement result of the laser interferometry 174 is output to the control device CONT2, and the control device CONT2 obtains a position of the mask holder 120 (mask stage MST) in the Y-axis direction based on the measurement result of the laser interferometry 174.

The control device CONT2 can obtains the attitude of the mask holder 120 in the θZ direction based on the measurement results of the length measuring beams 170a and 170b which were emitted from the moving mirror 170 and which are arranged in the Y-axis direction. Here, the laser interferometry 172 provided on the mask holder 120 on the −X side irradiates the reference mirror 175 with two reference beams 175a and 175b arranged in the Z-axis direction. Similarly, the laser interferometry 173 provided on the mask holder 120 on the −X side irradiates the reference mirror 176 with two reference beams 176a and 176b arranged in the Z-axis direction. Measurement results of the laser interferometries 172 and 173 are output to the control device CONT2, and the control device CONT2 can obtains the attitude, in the θY direction, of the surface plate 101 which supports the projection optical modules PLa to PLg based on the measurement results of the optical path lengths of the reference beams 175a and 175b (or measurement results of optical path lengths of the reference beams 176a and 176b) arranged in the Z-axis direction. Further, the control device CONT2 can obtain the attitude, in the θZ direction, of the surface plate 101 based on the measurement results of the optical path lengths of the reference beams 175a and 176a (or measurement results of optical path lengths of the reference beams 175b and 176b) arranged in the Y-axis direction.

The laser interferometry 174 provided on the mask holder 120 on the −Y side irradiates the reference mirror 177 with two reference beams 177a and 177b arranged in the Z-axis direction. A measurement result of the laser interferometry 174 is output to the control device CONT2, and the control device CONT2 can obtain an attitude of the surface plate 101 in the θX direction based on measurement results of the optical path lengths of the reference beams 177a and 177b arranged in the Z-axis direction.

As described above, the control device CONT2 can obtain the attitude of the surface plate 101 which supports the projection optical modules PLa to PLg, i.e., the positions of the surface plate 101 in the X-axis, Y-axis, θX direction, θY direction and θZ direction based on measurement results of reference beams projected onto the reference mirrors 175, 176 and 177 by the laser interferometries 172, 173 and 174. The control device CONT2 controls the attitude of the mask holder 120 through the mask stage driving device MSTD based on the measurement result of the attitude of the surface plate 101. For example, the control device CONT2 corrects the attitude of the mask holder 120 using an inclination amount of the surface plate 101 in the θY direction as a correcting amount. With this, even when the attitude of the surface plate 101 is varied, the relative position between the projection optical modules PLa to PLg supported by the surface plate 101 and the mask holder 120 (and the mask M held by the mask holder 120).

Figure 41:
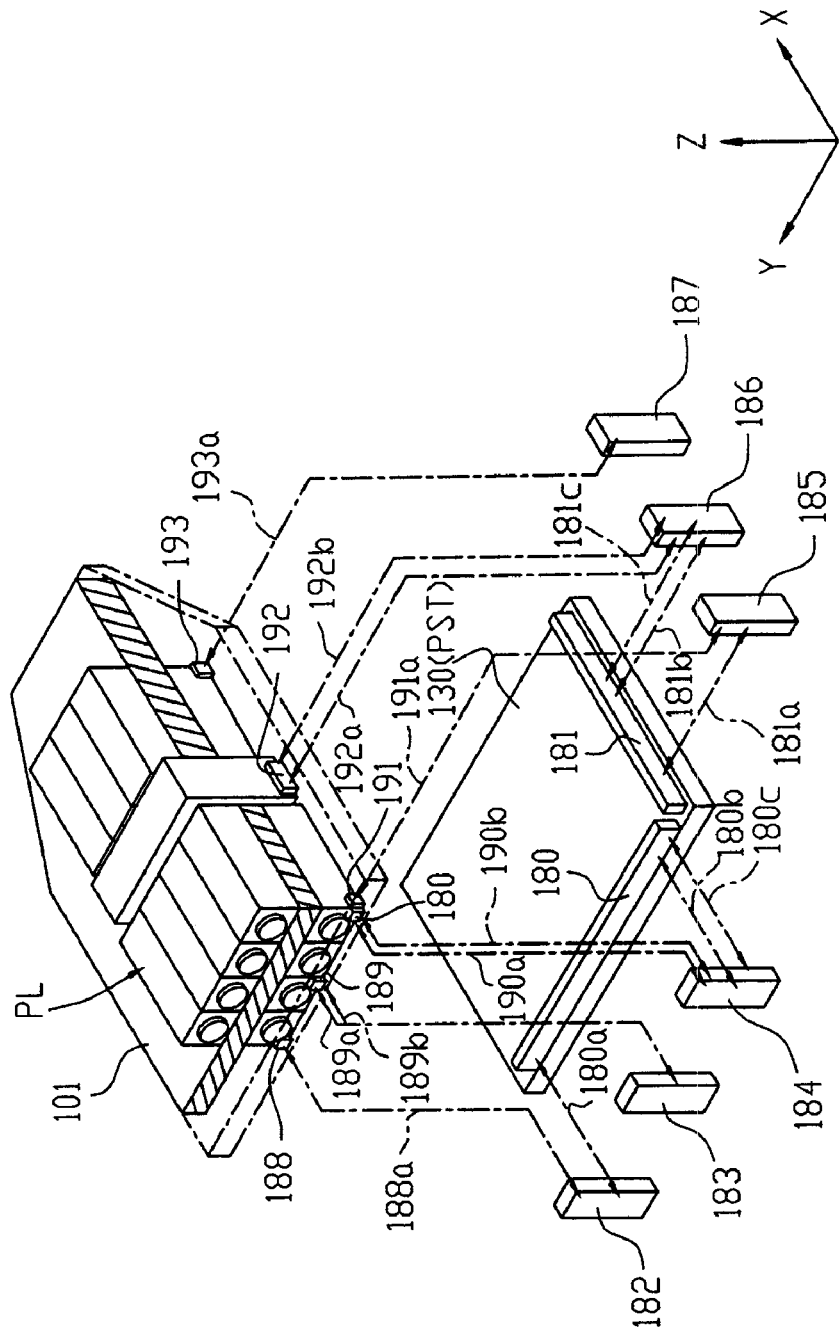
FIG. 41 is a diagram showing a structure of a laser interfering system which measures a position of a substrate holder of the second embodiment of the invention.
Figure 42:
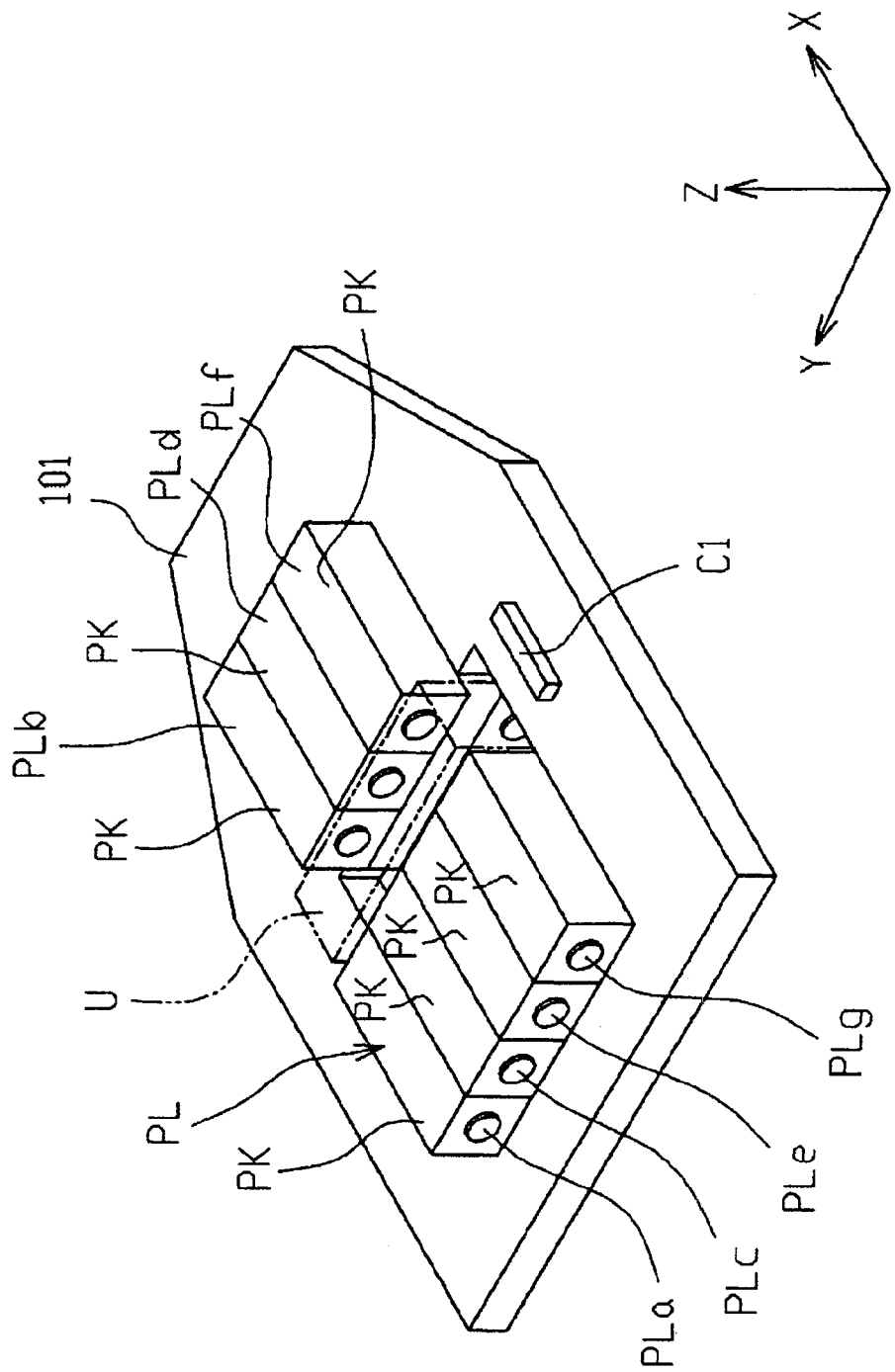
FIG. 42 is a diagram showing a disposition state of another sensor of the second embodiment of the invention.

FIG. 41 is a schematic diagram showing a structure of the laser interferometry system which measures a position of the substrate holder 130 (substrate stage PST). In FIG. 41, an X moving mirror 180 extending in the Y-axis direction is provided on an end edge of the substrate holder 130 on the −X side, and a Y moving mirror 181 extending in the X-axis direction is provided on an end edge of the substrate holder 130 on the −Y side. Three laser interferometries 182, 183 and 184 are arranged in the Y-axis direction at locations opposed to the X moving mirror 180. Three laser interferometries 185, 186 and 187 are arranged in the X-axis direction at locations opposed to the Y moving mirror 181. The laser interferometries 182, 183 and 184 are disposed on the base plate 110 (see FIG. 32). The laser interferometries 185, 186 and 187 are suspended from the upper plate portion 100A of the column 100 (see FIG. 32).

Reference mirrors 188, 189, 190, 191, 192 and 193 are mounted on the barrel PK of the projection optical module. The reference mirror 188 is provided at a location opposed to the laser interferometry 182 on the +Y side among the three laser interferometries 182, 183 and 184 which are arranged in the Y-axis direction, and the reference mirror 189 is provided at a location oppose to the center laser interferometry 183. The reference mirror 190 is provided at a location opposed to the laser interferometry 184 located on the −Y side. The reference mirror 191 is provided at a location opposed to the laser interferometry 185 on the −X side among the three laser interferometries 185, 186 and 187 arranged in the X-axis direction, the r182 is provided at a location opposed to the center laser interferometry 186, and the reference mirror 193 is provided at adjusting amount location opposed to the laser interferometry 187 on the +X side.

The laser interferometry 182 irradiates the X moving mirror 180 with a length measuring beam (light beam) 180a, and irradiates the reference mirror 188 with a reference beam (light beam) 188a. The laser interferometry 183 irradiates the reference mirror 189 with reference beams 189a and 189b. The laser interferometry 184 irradiates the X moving mirror 180 with length measuring beams 180b and 180c, and irradiates the reference mirror 190 with reference beams 190a and 190b. Light reflected by the X moving mirror 180 and the reference mirrors 188 and 190 based on the emitted length measuring beam and reference beam are received by photoreceivers of the laser interferometries 182 and 184, the laser interferometries 182 and 184 interfere with the light, and measure a displacement amount of the optical path of the length measuring beam using the optical path length of the reference beam as a reference, and a position (coordinate) of the X moving mirror 180 using the reference mirrors 188 and 190 as references. Measurement results of the laser interferometries 182 and 184 are output to the control device CONT2, and the control device CONT2 obtains a position of the substrate holder 130 (substrate stage PST) in the X-axis direction based on measurement results of the laser interferometries 182 and 184.

The laser interferometry 185 irradiates the Y moving mirror 181 with length measuring beam 181a, and irradiates the reference mirror 191 with a reference beam 191a. The laser interferometry 186 irradiates the Y moving mirror 181 with length measuring beams 181b and 181c, and irradiates the reference mirror 192 with reference beams 192a and 192b. The laser interferometry 187 irradiates the Y moving mirror 181 with a length measuring beam 181d, and irradiates the reference mirror 193 with a reference beam 193a. Light reflected from the Y moving mirror 181 and the reference mirrors 191, 192 and 193 based on the emitted length measuring beam and reference beam is received by photoreceivers of the laser interferometries 185, 186 and 187, and the laser interferometries 185, 186 and 187 interfere with the light, and measures a displacement amount of the optical path of the length measuring beam using the optical path length of the reference beam as a reference, and a position (coordinate) of the Y moving mirror 181 using the reference mirrors 191, 192 and 193 as references. Measurement results of the laser interferometries 185, 186 and 187 are output to the control device CONT2, and the control device CONT2 obtains a position of the substrate holder 130 (substrate stage PST) in the Y-axis direction based on the measurement results of the laser interferometries 185, 186 and 187.

The control device CONT2 can obtain the attitude of the substrate holder 130 in the θZ direction based on measurement results of the length measuring beams 180a and 180b (180c) which are emitted by the moving mirror 180 and which are arranged in the Y-axis direction. Since the three laser interferometries 185, 186 and 187 are arranged in the X-axis direction, it is possible to switch the laser interferometries to be used and detect the position in accordance with a position of the scanning and moving substrate holder 130 in the X-axis direction when the position of the substrate holder 130 in the Y-axis direction is measured.

The laser interferometry 183 irradiates the reference mirror 189 with two reference beams 189a and 189b arranged in the Z-axis direction. A measurement result of the laser interferometry 183 is output to the control device CONT2, and the control device CONT2 can obtain the attitudes of the projection optical modules PLa to PLg supported by the surface plate 101 based on the measurement results of optical path lengths of the reference beams 189a and 189b. The control device CONT2 can obtain the attitudes in the θZ direction of the projection optical modules PLa to PLg supported by the surface plate 101 based on measurement results of optical path length of the reference mirror 188a and 190a (190b) arranged in the Y-axis direction.

Like the mask holder 120, the control device CONT2 controls the attitude of the substrate holder 130 through the substrate stage driving device PSTD on a measurement result of attitude of the surface plate 101, and maintains the relative position between the projection optical modules PLa to PLg supported by the surface plate 101 and the substrate holder 130 (and photosensitive substrate P held by the substrate holder 130).

When the exposure apparatus EX having the above-described structure is to be assembled, optical properties of the projection optical modules PLa to PLg are adjusted by the adjusting devices, 150, 153, 154, 155 and 158 before the projection optical modules PLa to PLg are mounted on the surface plate 101. If the adjustment of the optical properties of the projection optical modules PLa to PLg is completed, the projection optical modules PLa to PLg are positioned to the relative position of the surface plate 101 and mounted on the surface plate 101.

When the exposing processing is to be carried out, the mask M is loaded on the mask holder 120, and the photosensitive substrate P is loaded on the substrate holder 130. The control device CONT2 moves the mask holder 120 which holds the mask M and the substrate holder 130 which holds the photosensitive substrate P in the X-axis direction in synchronization with each other, and illuminates the mask M with exposure light L by the illumination optical system IL.

If the mask holder 120 and the substrate holder 130 move, a distortion deformation may be generated in the column 100 in some cases. However, the projection optical modules PLa to PLg are supported by the single surface plate 101, an influence of the deformation of the column 100 on the projection optical modules PLa to PLg can be suppressed by the surface plate 101 which is kinematically supported by the column 100. Further, since the projection optical modules PLa to PLg are supported by the single surface plate 101, displacement in the relative positions thereof can be suppressed to a small value.

Since the surface plate 101 is kinematically supported by the support section 102 with respect to the column 100, even if the column 100 or the surface plate 101 itself is thermally deformed, the kinematic support structure absorbs most of the deformation and thus, an influence on the imaging property of the projection optical system PL can be suppressed to a small level.

As explained above, since the plurality of arranged projection optical modules PLa to PLg are supported by the single surface plate 101, even when a distortion deformation is generated in the column 100 due to movement of the mask holder 120 or the substrate holder 130, an influence of the distortion deformation of the column 100 on the projection optical modules PLa to PLg can be suppressed by the surface plate 101. Since the plurality of projection optical modules PLa to PLg are supported by the single surface plate 101, even when the distortion deformation is generated in the column 100, displacement of the relative position between the projection optical modules PLa to PLg can be suppressed to a small level. Therefore, displacement in imaging property of each of the projection optical modules PLa to PLg can be suppressed to a small level.

The sensor C measures the four relative distances between the first projection optical unit and the second projection optical unit, and can detect the relative displacement amount between the first projection optical unit and the second projection optical unit based on the measurement result, i.e., a displacement amount of the relative position between the first projection optical unit and the second projection optical unit which can not be suppressed by the support section constituting the kinematic support structure. Further, since the projection position of the pattern of the mask on the photosensitive substrate P can be corrected by the correcting device based on the detection result, a deviation in the projection position between the first projection optical unit and the second projection optical unit can be corrected. Therefore, even when a deviation is generated in the projection position due to a deformation of the column or the surface plate on which the first projection optical unit and the second projection optical unit are placed, the deviation in the projection position can be corrected, it is possible to precisely match the joints between the first projection optical unit and the second projection optical unit, and exposure can be carried out precisely.

Although the sensor C is disposed on the side of the projection optical modules PLa and PLb (−Y direction) in the embodiment, but the sensor C may be disposed on the side of the projection optical modules PLf and PLg (+Y direction). Although the sensor C is disposed on the lower side of the surface plate 101 (−Z direction), the sensor C may be disposed on the upper side of the surface plate 101 (+Z direction). Further, a sensor C1 may be disposed near the surface plate 101 on which the first projection optical unit and the second projection optical unit are placed, e.g., near the opening 101A of the surface plate 101 as shown in FIG. 41. In this case, the control device CONT2 detects a relative displacement amount between the first projection optical unit and the second projection optical unit based on a measurement result of the sensor C1.

Although the sensor C measures the two distances X1 and X2 in the X direction and the two distances Y1 and Y2 in the Y direction in the embodiment, the sensor C may measure one or more distances in either one of the scanning direction and Y direction.

In the embodiment, the control device CONT2 detects a relative translation amount between the first projection optical unit and the second projection optical unit based on the two distances X1 and X2 in the X direction, and a relative attitude difference between the first projection optical unit and the second projection optical unit based on the two distances Y1 and Y2 in the Y direction, but may detect a difference in an inclination amount between the first projection optical unit and the second projection optical unit based on the distances X1 and X2 in the X direction and the distances Y1 and Y2 in the Y direction. In this case, since the projection optical system of the embodiment includes the projection optical system which forms an erect image, even when the mask stage and the substrate stage scan in the same direction at the time of the exposing operation and the first projection optical unit and the second projection optical unit are inclined, a difference of the inclination amount between the first projection optical unit and the second projection optical unit. Therefore, it is possible to correct the deviation in the projection position between the first projection optical unit and the second projection optical unit based on the measurement result.

Although the inclination amounts of the first projection optical unit and the second projection optical unit are directly measured in the embodiment, the optimal element group is made integral by the first projection optical unit and the second projection optical unit, and a deformation amount of the optical surface plate itself may be measured. For example, a displacement in the Z direction of two locations which are separated in the Y direction may be measured, and the inclination in the Y direction may be obtained based on the measurement result.

The sensor C measures the relative distance between the first projection optical unit and the second projection optical unit in this embodiment, a relative distance between the projection optical modules PLa, PLc, PLe and PLg constituting the first projection optical unit and the projection optical modules PLb, PLd and PLf constituting the second projection optical unit which are opposed to the projection optical modules PLa, PLc, PLe and PLg may be measured. That is, the sensor is constituted such that it can measure the relative distances between the projection optical modules PLa and PLb; PLb and PLc, PLc and PLd, PLd and PLe, Ple and PLf, and PLf and PLg. In this case, the control device CONT2 detects deviation in the projection positions of the projection optical modules PLa to PLg based on the measurement result of the sensor, and can correct the deviations of the projection positions of the optical adjusting mechanisms (i.e., at least one of the shift adjusting mechanism, the rotation adjusting mechanism, the scaling adjusting mechanism and the image plane adjusting mechanism) as the correcting device (optical property adjusting device) of the projection optical modules PLa to PLg. Therefore, it is possible to more precisely correct the deviation between the projection position of the first projection optical unit and the projection position of the second projection optical unit.

Further, the sensor may measure relative distances in joints between the projection optical modules PLa and PLb; PLb and PLc, PLc and PLd, PLd and PLe, Ple and PLf, and PLf and PLg. In this case, the control device CONT2 can directly detect the deviations of the joints of the projection position of the projection optical modules PLa to PLg. Therefore, it is possible to reliably correct the deviations of the joints of the projection position individually by the optical adjusting mechanisms processed by the projection optical modules PLa to PLg, and it is possible to more precisely correct the deviation between the projection position of the first projection optical unit and the projection position of the second projection optical unit.

Although the control device CONT2 detects the relative displacement amount between the first projection optical unit and the second projection optical unit based on the four distances X1, X2, Y1 and Y2 measured by the sensor C in the embodiment, the sensor C may not be provided, a deformation amount of the surface plate 101 may be measured based on measurement results of optical path lengths of the reference beams 175$a$, 175$b$, 176$a$ and 176$b$ projected onto the reference mirrors 175 and 176 provided on the surface plate 101 from the laser interferometries (two deformation measuring devices or measuring devices) 172 and 173 provided on the mask holder 120 on the −X side as shown in FIG. 40, and the control device (calculating device) CONT2 may calculate the relative displacement amount between the first projection optical unit and the second projection optical unit based on the measured deformation amount.

When the surface plate 101 is deformed from the shape shown with broken lines to the shape shown with solid line as shown in FIG. 38$a$ for example, the optical path of the reference beam 175$a$ becomes longer than the optical path of the reference beam 175$b$, and the optical path of the reference beam 176$a$ becomes longer than the optical path of the reference beam 176$b$. Further, when the surface plate 101 is deformed from the shape shown with broken lines to the shape shown with solid line as shown in FIG. 38$b$ for example, the optical path of the reference beam 175$a$ becomes shorter than the optical path of the reference beam 175$b$, and the optical path of the reference beam 176$a$ becomes longer than the optical path of the reference beam 176$b$. In this manner, it is possible to detect the deformation amount of the surface plate 101 in the X direction and Y direction based on the measurement results of the optical path lengths of the reference beams 175$a$, 175$b$, 178$a$ and 176$b$, and it is possible to calculates a positional deviation amount between the projected image by the first projection optical unit and the projected image by the second projection optical unit based on the deformation amount, i.e., the relative displacement amount in the X direction and Y direction.

More specifically, based on the relative displacement amount in the X direction and Y direction based on the measurement results of the optical path lengths of the reference beams 175$a$, 175$b$, 176$a$ and 176$b$, a positional deviation amount (correcting amount) X1 in the X direction between the projected image by the first projection optical unit and the projected image by the second projection optical unit, and a positional deviation amount (correcting amount) Y1 in the Y direction between the projected image by the first projection optical unit and the projected image by the second projection optical unit can be calculated by the following equation 1.

$$X1 = k1\{(IMXTR2-IMXTR1)-(IMXTL2-IMXTL1)\} + k2\{(IMXTR2-IMXTR1)+(IMXTL2-IMXTL1)\}$$

$$Y1 = k3\{(IMXTR2-IMXTR1)-(IMXTL2-IMXTL1)\} + k4\{(IMXTR2-IMXTR1)+(IMXTL2-IMXTL1)\}$$

(Equation 1)

Here, the symbols k1 and k2 represent coefficients for calculating, from measurement results of optical path lengths of the reference beams 175$a$, 175$b$, 176$a$ and 176$b$, a positional deviation amount (correcting amount) X1 in the X direction between a position of a projected image formed on the photosensitive substrate P by the first projection optical unit and a position of a projected image formed on the photosensitive substrate P by the second projection optical unit. Further, the symbols k3 and k4 represent coefficients for calculating, from measurement results of optical path lengths of the reference beams 175$a$, 175$b$, 176$a$ and 176$b$, a positional deviation amount (correcting amount) Y1 in the Y direction between a position of a projected image formed on the photosensitive substrate P by the first projection optical unit and a position of a projected image formed on the photosensitive substrate P by the second projection optical unit. Further, the symbol IMXTR2 represents the optical path of the reference beam 176$a$, the symbol IMXTR1 represents the optical path of the reference beam 176$b$, the symbol IMXTL2 represents the optical path of the reference beam 175$a$, and the symbol IMXTL1 represents the optical path of the reference beam 175$b$.

Based on the correcting amount calculated by the equation 1, at least one of correction of the projection position of the first projection optical unit and the projection position of the second projection optical unit, and correction of a first projection position projected by the first projection optical unit and a second projection position projected by the second projection optical unit is carried out by the optical adjusting mechanism processed by each of the projection optical modules PLa to PLg. Here, the projection position indicates at least one of a position in the X direction (scanning direction), a position in the Y direction (direction intersecting with the scanning direction) and a position in a rotation direction around an optical axial direction of the projection optical system PL.

In this case, the relative displacement amount between the first projection optical unit and the second projection optical unit is calculated based on the measurement results by the laser interferometries 172 and 173. Therefore, it is unnecessary to mount an expensive sensor, and the displacement amount between the first projection optical unit and the second projection optical unit can be detected. Further, a relative deformation amount between the column 100 and the surface plate 101 (projection optical system PL) which can be detected by the laser interferometries 172 and 173, and a deformation amount of the surface plate 101 which is deformed when the column 100 is deformed are similar to each other. Therefore, if the relative deformation amount between the column 100 and the surface plate 101 (projection optical system PL) is precisely measured by the laser interferometries 172 and 173, the deformation amount of the surface plate 101 (projection optical system PL) can precisely be measured, and precise correction can be carried out.

Although the deviation between the projection position of the first projection optical unit and the projection position of the second projection optical unit is corrected by the correcting device (at least one of the shift adjusting mechanism, the rotation adjusting mechanism, the scaling adjusting mechanism and the image plane adjusting mechanism) in the embodiment, it is possible to use, as the correcting device, a stage control device which correct the deviation between the projection position of the first projection optical unit and the projection position of the second projection optical unit by controlling an attitude of at least one of the mask stage MST on which the mask M is placed and the substrate stage PST on which the photosensitive substrate P is placed. That is, it is possible to correct the deviation between the projection position of the first projection optical unit and the projection position of the second projection optical unit by adjusting the position of the mask stage MST or the substrate stage PST.

When the relative position between the first projection optical unit and the second projection optical unit is changed, e.g., when an optical axis of the second projection optical unit is inclined with respect to an optical axis of the first projection optical unit, a positional shift in accordance with the inclination amount is generated in the projection region where a pattern is projected on the photosensitive substrate, and correction is carried out by a shifter adjusting mechanism. However, it is expected that a pattern region of the mask for projection is also shifted at the same time. At that time, when the first projection optical unit is used as a reference, a pattern region of the mask for projection may be adjusted by adjusting a position of a field of view aperture (not shown) provided at an intermediate image-forming position which is a conjugated position between the mask of the second projection optical unit and the photosensitive substrate. At that time, correction is carried out by the optical adjusting mechanism of the second projection optical unit while taking not: only the output value of the sensor C but also positional information of the field of view aperture into account, and an image position of a pattern of a mask may be adjusted on the photosensitive substrate.

Although the sensor C or the laser interferometries 172 and 173 are used as the deformation amount measuring devices in the embodiment, it is not always necessary to use the displacement amount measuring device. That is, information concerning deformation (distortion and the like) of the surface plate 101, information concerning a relative positional relation (positional deviation) between the first projection optical unit and the second projection optical unit, or a correcting amount of such positional deviation is previously obtained in correspondence with information (including at least one of position and acceleration) concerning movement of one of or both of the mask stage MST and the substrate stage PST, a relative positional deviation of pattern images of the first projection optical unit and the second projection optical unit may be corrected by the correcting device during the exposure operation of the photosensitive substrate P based on measuring information (or command value concerning driving thereof) concerning movement of the mask stage MST or the substrate stage PST by laser interferometry system for example.

As a correcting method of the projection position, correction may be carried out relatively by a driving mechanism which restores the deformation of the surface plate 101, or a driving mechanism which deforms the first projection optical unit or the second projection optical unit.

According to the exposure apparatus of the second embodiment, a relative displacement amount between the first projection optical unit and the second projection optical unit is measured by the displacement amount measuring device, and the projection position of the mask pattern on the photosensitive substrate is corrected by the correcting device based on the measurement result. Therefore, a deviation between the projection position of the first projection optical unit and the projection position of the second projection optical unit (a deviation in the scanning direction, a deviation in the direction intersecting with the scanning direction, and deviation in the rotation direction around the optical axial direction of the projection optical system) can be corrected. Thus, when a deviation in the projection position is generated due to a deformation of a member on which the first projection optical unit and the second projection optical unit are placed, the deviation of the projection position can be corrected. Therefore, it is possible to precisely match the joints between the first projection optical unit and the second projection optical unit with each other, and the exposing operation can be carried out precisely.

[Producing Method of Device]

If an exposure step in which a transfer pattern formed on a mask or a reticle, or a transfer pattern produced by a variable forming mask is exposure-transferred onto a photosensitive substrate (semiconductor wafer or the like) is carried out, it is possible to produce a microdevice (a semiconductor device, an image pickup device (DDC or the like), a thin film magnetic head, a liquid crystal display element and the like).

Figure 43:
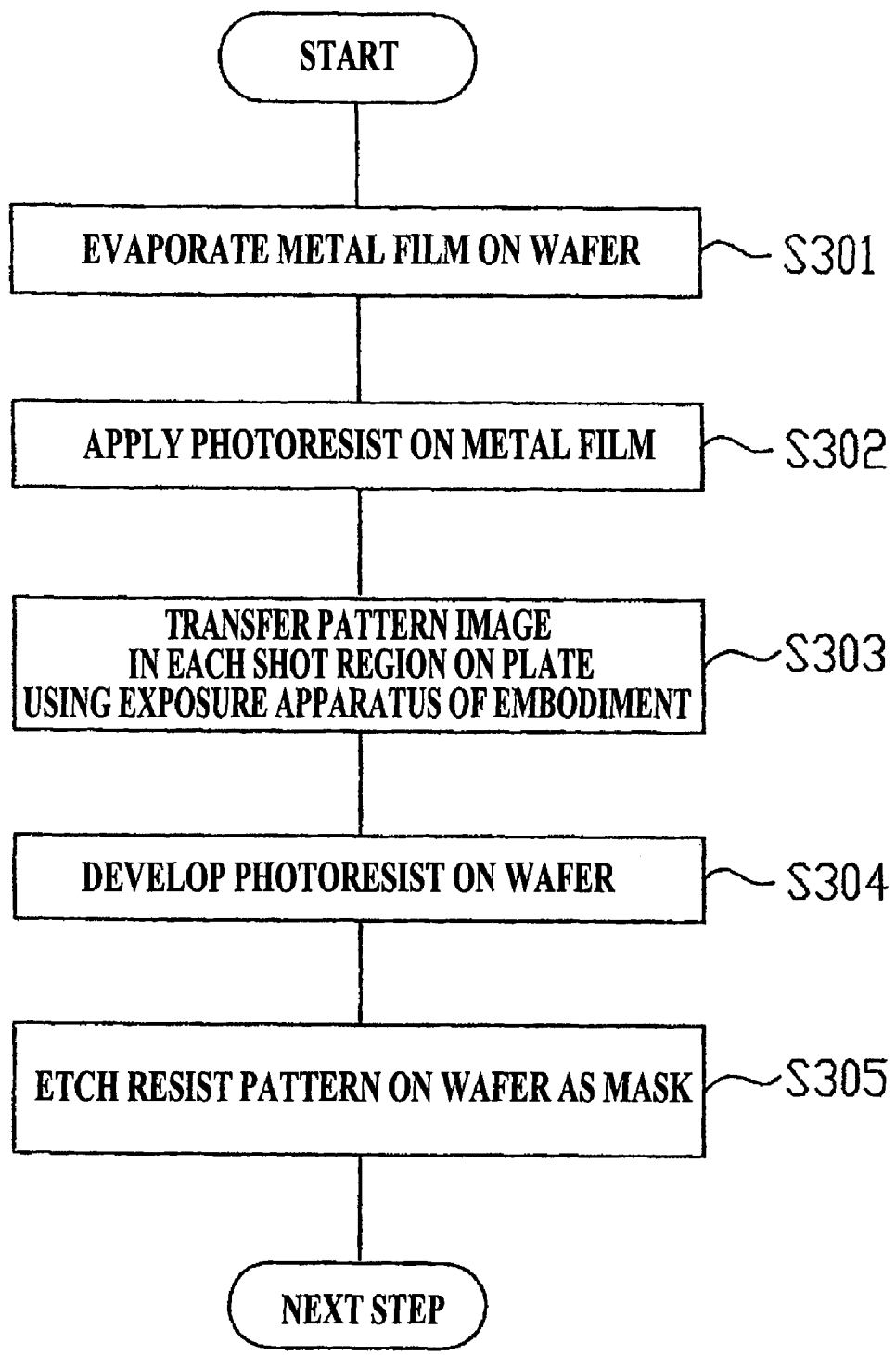
FIG. 43 is a flowchart used for explaining a producing method of a semiconductor device as the microdevice of the embodiment of the invention.

One example for obtaining a semiconductor device as a microdevice by forming a predetermined circuit pattern on a semiconductor wafer using the exposure apparatus of the first or second embodiments will be explained with reference to a flowchart shown in FIG. 43. First in step S301 in FIG. 43, a metal film is evaporated on a plate of one lot. In next step S302, a photoresist is applied onto the metal film on the plate of one lot. Then, in step S303, an image of the pattern on the mask or an image of a pattern produced by the variable forming mask is successively exposed and transferred onto each shot region on the plate of one lot using the exposure apparatus of the first or second embodiment.

Then, in step S304, the photoresist on the plate of one lot is developed and then, a resist pattern is etched as a mask on the plate of one lot in step S305. With this, a circuit pattern corresponding to the pattern on the mask is formed on each shot region on each plate. Thereafter, the circuit pattern of an upper layer is formed and a device such as a semiconductor device is produced. According to the producing method of a semiconductor device, since a deviation of the projection position of the projection optical system can precisely corrected, precise exposing processing can be carried out, and a precise semiconductor device can be produced.

Figure 44:
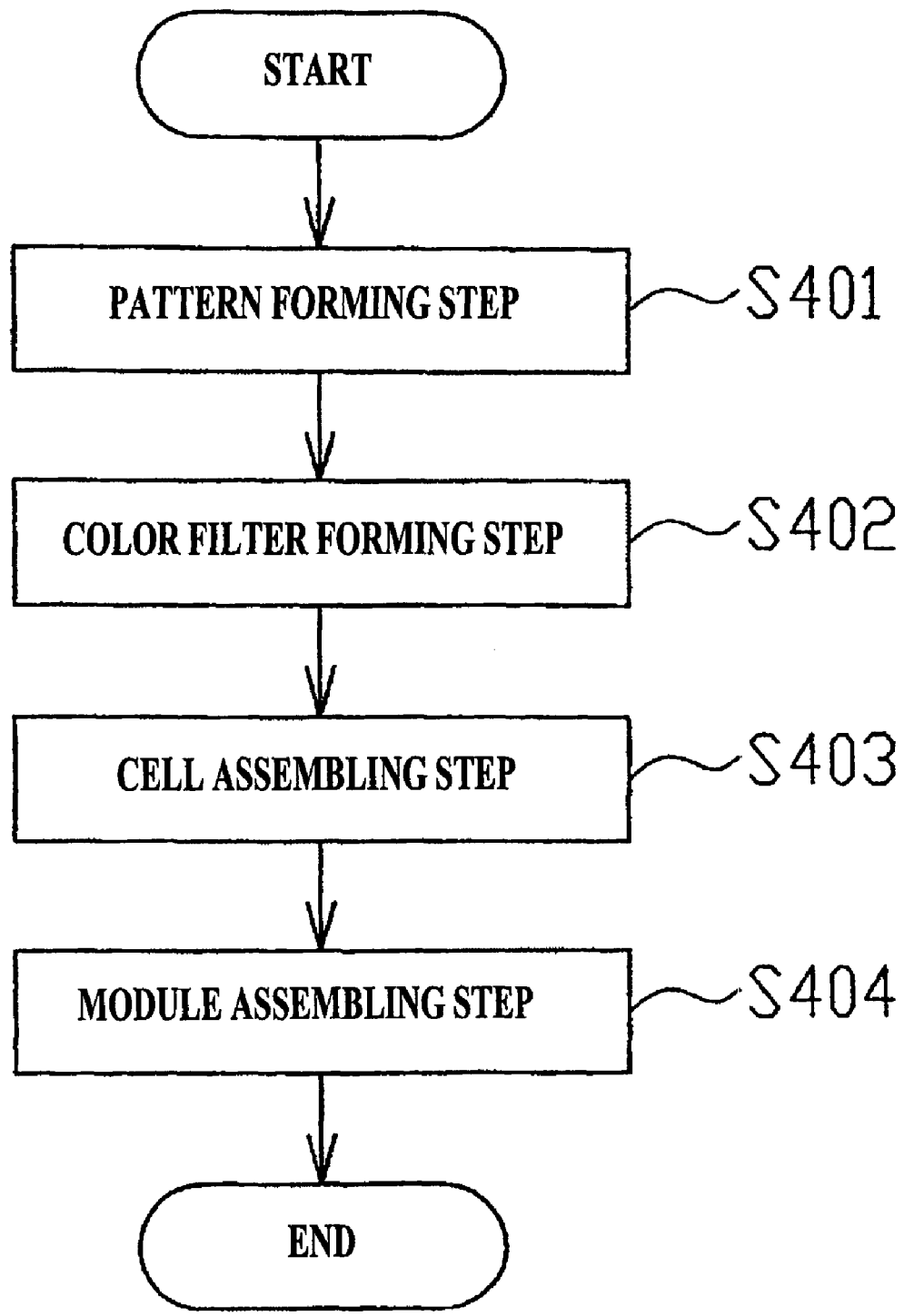
FIG. 44 is a flowchart used for explaining a producing method of a liquid crystal display element as the microdevice of the embodiment of the invention.

According to the exposure apparatus of the embodiment, a liquid crystal display element as a microdevice can be obtained by forming a predetermined pattern (circuit pattern, electrode pattern and the like) on a plate (glass substrate). One example of such a technique will be explained with reference to FIG. 44. In FIG. 44, in a pattern forming step S401, a so-called optical lithography step is carried out. In the optical lithography step, a pattern of a mask or an image of a pattern produced by the variable forming mask is transferred and exposed onto a photosensitive substrate (glass substrate to which resist is applied) using the exposure apparatus of the first or second embodiment. By the optical lithography step, a predetermined pattern including a large number of electrodes is formed on the photosensitive substrate. Then, the exposed substrate is subjected to a developing step, an etching step, a resist-peeling off step and the like, a predetermined pattern is formed on a substrate, and the procedure is advanced to a next color filter forming step S402.

Next, in the color filter forming step S402, a large number of sets of three dots corresponding to R (Red), G (Green) and B (Blue) are arranged in a matrix form, or a color filter is formed. In the color filter, sets of three filters of strips of R, G and B are arranged in a plurality of horizontal scanning directions. A cell assembling step S403 is carried out after the color filter forming step S402. In the cell assembling step S403, a liquid crystal panel (liquid crystal cell) is produced by charging liquid crystal between a substrate having a predetermined pattern obtained in the pattern forming step S401 and a color filter obtained by the color filter forming step S402. Then, various parts such as an electric circuit which allows the assembled liquid crystal panel (liquid crystal cell) to display, and a backlight, thereby completing a liquid crystal display element. According to the producing method of the liquid crystal display element, since a deviation of the projection position of the projection optical system can precisely be corrected, precise exposing processing can be carried out, and a precise liquid crystal display element can be produced.

[Others]

There is a tendency that the size of photosensitive substrates is increasing and the substrate stage is also increased in both size and weight. Therefore, when the substrate stage moves, a load movement becomes large, high rigidity of the apparatus body is required to support the movement of a load generated when the substrate stage moves, and the apparatus body is also increased in size and weight. However, even if the rigidity of the apparatus body is increased, it is difficult to completely suppress the vibration (or unbalanced load) of the exposure apparatus generated when the substrate stage moves. According to the exposure apparatus to which the present invention is applied, however, the displacement in optical performance caused by vibration of an optical unit can effectively be corrected even when the optical unit is vibrated caused by vibration of the apparatus. Therefore, the exposure precision can be enhanced. A permissible value of the vibration of the apparatus is increased, the rigidity of the apparatus body need not be so high, and it is possible to reduce the exposure apparatus in size and weight. The invention is especially effective for an exposure apparatus exposes a photosensitive substrate having an outer diameter of greater than 500 mm, i.e., having one side of a diagonal line greater than 500 mm.

The exposure apparatus of the invention is also effective when a fine pattern is exposed. The exposure apparatus of the invention is also effective when it is required to enhance the joint precision due to increase in the number of joints when the number of projection optical systems is increased as an exposure apparatus for producing a wider device pattern, due to distortion of an image of a peripheral portion which is away from the center of the projection optical system when an angle of view of each projection optical system is increased and the pattern region of each projection optical system is widened, and due to increase in displacement in magnification.

The above-explained embodiments are described for making it easy to understand the invention, and the invention is not limited to the embodiments. Therefore, the elements disclosed in the embodiments include all design modifications and equivalents belonging to the technical scope of the invention.

For example, in the embodiments, the plurality of optical units (exposure optical systems in the first embodiment and projection optical modules in the second embodiment) are supported by one surface plate (9 or 101), but it is also possible to apply the invention to an exposure apparatus of a body structure in which the plurality of optical units are divided into different groups and they are supported by the surface plates, respectively. In the embodiments, the two sets of exposure unit groups or projection optical units in which the pattern regions are arranged in the non-scanning direction (Y direction) are used, the number of the exposure unit groups and projection optical units is not limited to two, and the number may be one or three or more. The projection optical module of the embodiments and the illumination optical system of the second embodiment are not limited to the disclosed structures, and arbitrary structures may be employed. In the embodiment, a relative positional relation (positional deviation) between the plurality of exposure unit groups or projection optical units is measured as information concerning the displacement of the relative positional relation of the pattern image (pattern image) caused by the plurality of optical units, and a position of at least one of the pattern images is corrected based on the measurement information. However, such measurement information is not limited to the relative positional deviation of the plurality of exposure unit groups or projection optical units, and the measurement information may be at least one of positions of the exposure unit groups or projection optical units, a position of the optical unit, a relative positional relation of the plurality of optical units, and a combination thereof with the relative positional deviation. As the measurement information, it is also possible to use at least one of information concerning deformation of the support section (surface plate or the like) on which the plurality of optical units provided, and information concerning movement of the stage (substrate stage in the first embodiment and at least one of the mask stage and the substrate stage in the second embodiment). At that time, it is preferable to prepare a correction table in which at least one of the deformation information and the movement information, and the correction information of pattern images by the plurality of optical units (optical unit which should correct the position of the pattern image and its correcting amount) are associated with each other. A position of at least one pattern image is corrected based on the measurement information obtained by the measuring device and the correction table. The deformation information includes information of distortion of the support section, and the movement information includes at least one of a position and acceleration of the stage.

Although the surface plate, the barrel or the like is provided with the moving mirror or the reference mirror for reflecting beams from the laser interferometry in the embodiments, a portion of such a member may be subjected to mirror-finishing to form a reflection surface for a beam. Although the position of the stage is measured using the laser interferometry in the embodiments, other measuring sensor such as an encoder may be used instead of the laser interferometry or in combination thereof.

The light source used in the embodiments is an example, and it is possible to use a KrF excimer laser (wavelength is 248 nm), an ArF excimer laser (wavelength is 193 nm), an F2 laser (wavelength is 157 nm) or other light source. Further, a laser plasma light source, or a soft X ray region generated from SOR, e.g., EUV (extreme ultra violet) rays having wavelength of 13.4 nm or 11.5 nm may be used. Charged particle beams such as electron beams and ion beams may be used. In addition, it is also possible to use harmonics obtained by amplifying a laser of a single wavelength oscillated from a DFB semiconductor laser or a fiber laser using a fiber amplifier doped with erbium (or both erbium and yttrium), and converting its wavelength into ultraviolet light using a non-linear optical crystal.

Exposure apparatuses to which the present invention can be applied are not limited to apparatuses used for producing a semiconductor device, an image pickup device, a thin film magnetic head, and a liquid crystal display element, and the invention can widely be applied to exposure apparatuses used for producing a micromachine, a DNA chip, a mask, a reticle and the like.

The magnification of the projection optical system (projection optical module) is not limited to 1:1, and the magnification may be positive or negative. Any of a reflection optical system, a refraction optical system and a catadioptric optical system may be used.

When a linear motor is used for the substrate stage or mask stage, any of an air floating type linear motor using an air bearing and a magnetic floating type linear motor using a Lorentz force or reactance force may be used. The stage may move along a guide, or no guide may be provided.

When a plane motor is used as the driving device of the stage, one of a magnet coil unit and an armature coil unit is connected to the stage, and the other one of them is provided on the side of a moving surface of the stage (base).

A reaction force generated by a movement of the substrate stage may be mechanically released to a floor (ground) using a frame member as described in Japanese Patent Application Publication Laid-open No. H8-166475 (and corresponding U.S. Pat. No. 5,528,118). A reaction force generated by a movement of the substrate stage may be mechanically released to a floor (ground) using a frame member as described in Japanese Patent Application Publication Laid-open No. H8-330224 (and corresponding U.S. Pat. No. 6,188, 195). It is also possible to employ a counter mass method in which a reaction force generated when a stage moves is offset using the conservation of momentum as described in U.S. Pat. No. 6,969,966. As long as domestic laws of designated countries designated or selected countries selected in this International Application permit, disclosures in the above publications and U.S. patents are incorporated by reference as portions of description of this specification.

The exposure apparatus of the embodiments is produced by assembling various sub-systems such that predetermined mechanical precision, electric precision and optical precision are maintained. To secure these various precisions, adjustment for achieving optical precision is carried out for the various optical systems, adjustment for achieving mechanical precision is carried out for the various mechanical systems, and adjustment for achieving electrical precision is carried out for the various electrical systems before and after the assembling operation. The assembling step from the various sub-systems into the exposure apparatus includes mechanical connection, wiring connection of electric circuit, and piping connection of a pressure circuit between the various sub-system. There exist assembling steps of various sub-systems before the assembling step from the various sub-systems into the exposure apparatus of course. If the assembling step from the various sub-systems into the exposure apparatus is completed, overall adjustment is carried out, and various precisions as the entire exposure apparatus are secured. It is preferable that the exposing apparatus is produced in a clean room where the temperature and the cleaning degree are managed.

This disclosure relates to subject matters included in Japanese Patent Application No. 2005-16843 filed on Jan. 25, 2005, Japanese Patent Application No. 2005-43103 filed on Feb. 18, 2005, and Japanese Patent Application No. 2005-236940 filed on Aug. 17, 2005, and disclosure and the like of these applications are incorporated by reference.

The invention claimed is:

1. An exposure apparatus for projecting an image of a pattern onto an object and exposing the object, comprising:
a first optical unit including first optical systems which project a first image included in the image of the pattern;
a second optical unit including second optical systems which project a second image included in the image of the pattern;
a measuring device which measures information concerning a relative position between the first optical systems and the second optical systems, the measuring device being provided to the first optical unit and the second optical unit; and
a correcting device which corrects a relative displacement amount between a projecting position of the first image of the first optical systems and a projecting position of the second image of the second optical systems based on the measurement result obtained by the measuring device.

2. The exposure apparatus according to claim 1, wherein the correcting device corrects the position of at least the one image so that a displacement of the first and second optical units as a whole or a displacement between the first and second optical units is compensated.

3. The exposure apparatus according to claim 1, further comprising a stage on which the object is mounted, wherein the optical unit and the object are relatively moved by the stage, the image of the pattern is exposed on the object, and the correcting device corrects the position of at least the one image based on the information concerning the relative position of the first and second images.

4. The exposure apparatus according to claim 3, wherein the measured information includes at least one of information concerning a deformation of a body on which the first and second optical units are provided, and information concerning movement of the stage.

5. The exposure apparatus according to claim 3, wherein the correcting device stores correction information of relative positional displacement of the first and second images, and corrects the position of at least the one image based on the correction information.

6. The exposure apparatus according to claim 5, wherein the correction information is associated with the information concerning the movement of the stage.

7. The exposure apparatus according to claim 1, wherein the correcting device corrects the position of at least the one image based on the measured information.

8. The exposure apparatus according to claim 1, wherein the measured information includes information concerning positions or a relative positional relation of the first and second optical units.

9. The exposure apparatus according to claim 1, further comprising a variable forming mask having a spatial light modulator used to form the image of the pattern, and an illumination system which irradiates the variable forming mask with a light beam, wherein the spatial light modulator is controlled in accordance with relative movement between the object and the light beam from the variable forming mask, so as to expose the image of the pattern onto the object.

10. The exposure apparatus according to claim 9, wherein the correcting device corrects the position of at least the one image by at least one of the variable forming mask and the optical system.

11. The exposure apparatus according to claim 10, wherein the correcting device corrects the position of at least the one image by controlling the spatial light modulator.

12. The exposure apparatus according to claim 10, comprising a plurality of the spatial light modulators respectively provided for the first and second optical units, wherein the correcting device can correct positions of the first and second images individually by controlling the plurality of spatial light modulators.

13. The exposure apparatus according to claim 9, wherein at least one of the first and second optical units includes a correcting optical system for correcting a position of an image to be projected onto the object, and the correcting device corrects a position of at least the one image by the correcting optical system.

14. The exposure apparatus according to claim 13, wherein the correcting optical system includes a mechanism which corrects at least one of rotation, shift, magnification and a focus position of the image.

15. The exposure apparatus according to claim 13, wherein the correcting optical system adjusts resolutions of the first and second optical units.

16. The exposure apparatus according to claim 13, wherein the correcting device corrects a position of at least the one image while at least one of the variable forming mask and the correcting optical system is used as a roughly-correcting device and the other thereof is used as a finely-correcting device.

17. The exposure apparatus according to claim 9, wherein an amount of light for exposure passing through the first and second optical units is adjusted when the correcting device corrects a position of at least the one image.

18. The exposure apparatus according to claim 1, further comprising a variable forming mask used for forming an image of the pattern, wherein the variable forming mask is corrected in accordance with a relative movement between the optical system and the object, and the image of the pattern is exposed onto the object.

19. The exposure apparatus according to claim 18, wherein the correcting device corrects a position of at least the one image by at least one of the variable forming mask and the optical system.

20. The exposure apparatus according to claim 18, wherein the correcting device corrects positions of the first and second images formed by the variable forming mask individually with respect to each of the first and second optical units.

21. The exposure apparatus according to claim 18, wherein at least one of the first and second optical units has a correcting optical system which corrects a position of an image to be projected on the object, and the correcting device corrects a position of at least the one image by the correcting optical system.

22. The exposure apparatus according to claim 1, wherein the measuring device measures the information concerning positions or a relative positional relation of the first and second optical units, wherein the correcting device corrects a position of at least the one image based on the measured information.

23. The exposure apparatus according to claim 1, wherein the measured information includes attitudes of the first and second optical units, or information concerning a relative attitude between the first and second optical units.

24. The exposure apparatus according to claim 23, wherein the information concerning the attitude is obtained based on information concerning a deformation of a body on which the plurality of optical units are provided, or information concerning a relative position of the object with respect to the first and second optical units.

25. The exposure apparatus according to claim 1, wherein adjacent images of the first and second images to be projected onto the object by the first and second optical units are formed such that portions of the adjacent images are overlapped with each other.

26. The exposure apparatus according to claim 1, wherein the measuring device measures at least one of a relative translation amount and an attitude difference between the first and second optical units.

27. The exposure apparatus according to claim 1, wherein the measuring device a measures the relative displacement amount between the first and second optical units concerning at least one of the scanning direction and a direction intersecting with the scanning direction.

28. The exposure apparatus according to claim 1, wherein the optical system is to form an erect image, and the measuring device measures a difference in inclination amounts between the first and second optical units.

29. The exposure apparatus according to claim 1, wherein the image of the pattern is exposed onto the object by a relative movement between the optical system and the object, the exposure apparatus further comprise a support section provided such that positions of images by the optical units are different from each other in a scanning direction in which the first optical unit and the second optical unit different from the first optical unit are relatively moved, and a measuring device for measuring information concerning a deformation of the support section, the correcting device corrects a position of the image of at least one of the first and second optical units based on the information concerning the measured deformation.

30. The exposure apparatus according to claim 29, wherein the correcting device calculates a relative displacement amount between the first and second optical units based on the information concerning the measured deformation, and the calculated relative displacement amount is used for correcting the position of the image.

31. The exposure apparatus according to claim 29, wherein the measuring device measures information concerning a deformation of the support section in at least one of the scanning direction and a direction intersecting with the scanning direction.

32. The exposure apparatus according to claim 1, wherein the correcting device corrects the position of the image of at least one of the first and second optical units by controlling an attitude of the object.

33. A producing method of a microdevice comprising:
exposing and transferring the image of the pattern using the exposure apparatus according to claim 1, and
developing the pattern on the object which has exposed and transferred.

34. The exposure apparatus according to claim 1, wherein the first optical systems are arranged in a first direction, and the second optical systems are arranged in the first direction and arranged separately from the first optical systems in a second direction intersecting with the first direction, the measuring device measures a relative distance between the first optical systems and the second optical systems with respect to the first direction and the second direction.

35. The exposure apparatus according to claim 34, wherein the measuring device measures the relative position at a plurality of positions with respect to at least one of the first direction and the second direction.

36. The exposure apparatus according to claim 1, wherein the correcting device is provided to at least one of the first optical systems and the second optical systems, includes at least one shift adjusting mechanism which shifts at least one of the first image and the second image, and corrects the relative displacement amount using the shift adjusting mechanism.

37. The exposure apparatus according to claim 36, wherein the shift adjusting mechanism is provided to each of a plurality of optical systems composing at least one of the first optical systems and the second optical systems, and wherein the correcting device includes a calculating section for calculating a driving amount of the at least one shift adjusting mechanism provided to at least one of the first optical systems and the second optical systems based on the measurement result obtained by the measuring device, and drives the at least one shift adjusting mechanism based on the calculation result obtained by calculating section.

38. The exposure apparatus according to claim 36, wherein the correcting device includes a mechanism which adjusts at least one of an image plane position, a position in a rotation direction and magnification with respect to at least one of the first image and the second image, and drives the mechanism based on a measurement result obtained by the measuring device, the correcting device being provided at least one of the first optical systems and the second optical systems.

39. The exposure apparatus according to claim 1, further comprising a plurality of variable forming masks which changeably generate a part of the pattern based on a predetermined data, the plurality of variable forming masks being provided to a plurality of optical systems composing the first optical systems and the second optical systems respectively, and the correcting device corrects the relative displacement amount using at least a part of the plurality of variable forming masks.

40. The exposure apparatus according to claim 39, wherein the correcting device includes a calculating section for calculating a correcting amount of the predetermined data corresponding to each of the plurality of variable forming masks based on the measurement result obtained by the measuring device, and generates the pattern on the plurality of variable forming masks based on the calculation result obtained by the calculating section.

41. The exposure apparatus according to claim 39, wherein the variable forming mask has a spatial light modulator, and generates the pattern by driving the spatial light modulator based on the predetermined data.

42. The exposure apparatus according to claim 1, further comprising a stage mechanism which supports the object and causes the object to relatively move with respect to the first optical systems and the second optical systems.

43. The exposure apparatus according to claim 1, further comprising a surface plate which supports the first optical unit and the second optical unit; and a supporting mechanism which supports the surface plate kinematically.

44. The exposure apparatus according to claim 1, wherein the first optical unit includes a first casing which accommodates the first optical systems, the second optical unit includes a second casing which accommodates the second optical systems, and the measuring device measures information concerning a relative position between the first casing and the sec casing as the information concerning the relative position between the first optical systems and the second optical systems.

45. The exposure apparatus according to claim 1, wherein the object is a photosensitive substrate having an outer diameter of greater than 500 mm.

46. An exposure method comprising:
projecting the image of the pattern onto a photosensitive substrate and exposing the photosensitive substrate using the exposure apparatus according to claim 1.

47. A producing method of a microdevice comprising:
exposing the object and transferring the image of the pattern on the object using the exposure apparatus according to claim 1; and
developing the object on which the image of the pattern has transferred.

48. An exposure method for projecting an image of a pattern onto an object and exposing the object, comprising
projecting a first image included in the image of the pattern by using a first optical unit including first optical systems;
projecting a second image included in the image of the pattern by using a second optical unit including second optical systems;
measuring information concerning a relative position between the first optical systems and the second optical systems by using a measuring device provided to the first optical unit and the second optical unit; and
correcting a relative displacement amount between a projecting position of the first image of the first optical systems and a projecting position of the second image of the second optical systems based on the measured information obtained by the measuring device.

49. An exposure method according to claim 48, wherein the first optical systems are arranged in a first direction, and the second optical systems are arranged in the first direction and arranged separately from the first optical systems in a second direction intersecting with the first direction, the measuring step measures a relative distance between the first optical systems and the second optical systems with respect to the first direction and the second direction.

50. An exposure method according to claim 49, wherein the measuring step measures the relative position at a plurality of positions with respect to at least one of the first direction and the second direction.

* * * * *